United States Patent
Yu et al.

(10) Patent No.: US 11,036,005 B2
(45) Date of Patent: Jun. 15, 2021

(54) METHOD FOR III-V/SILICON HYBRID INTEGRATION

(71) Applicant: ROCKLEY PHOTONICS LIMITED, London (GB)

(72) Inventors: Guomin Yu, Glendora, CA (US); Aaron John Zilkie, Pasadena, CA (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/532,406

(22) Filed: Aug. 5, 2019

(65) Prior Publication Data
US 2020/0041721 A1    Feb. 6, 2020

Related U.S. Application Data

(60) Provisional application No. 62/715,123, filed on Aug. 6, 2018, provisional application No. 62/880,585, filed on Jul. 30, 2019.

(51) Int. Cl.
| | | |
|---|---|---|
| *G02B 6/13* | (2006.01) | |
| *G02B 6/132* | (2006.01) | |
| *G02B 6/12* | (2006.01) | |
| *G02B 6/136* | (2006.01) | |

(52) U.S. Cl.
CPC ......... *G02B 6/132* (2013.01); *G02B 6/12004* (2013.01); *G02B 6/131* (2013.01); *G02B 6/136* (2013.01); *G02B 2006/12169* (2013.01)

(58) Field of Classification Search
CPC .... G02B 6/132; G02B 6/12004; G02B 6/131; G02B 6/136; G02B 2006/12169
USPC .......................................................... 385/14
See application file for complete search history.

(56) References Cited

U.S. PATENT DOCUMENTS

| | | | |
|---|---|---|---|
| 5,790,737 A * | 8/1998 | Aoyagi | H01S 5/02268 385/131 |
| 9,379,017 B1 * | 6/2016 | Sung | H01L 21/823431 |
| 9,899,329 B2 | 2/2018 | Bower | |
| 2001/0048705 A1 | 12/2001 | Kitaoka et al. | |
| 2002/0063299 A1 * | 5/2002 | Kamata | H01L 21/823814 257/408 |
| 2003/0007754 A1 | 1/2003 | Terashima | |

(Continued)

FOREIGN PATENT DOCUMENTS

WO    WO 2017/070233 A1    4/2017

OTHER PUBLICATIONS

Loi, Ruggero et al., "Transfer Printing of AlGaInAs/InP Etched Facet Lasers to Si Substrates", IEEE Photonics Journal, Dec. 2016, 11 pages, vol. 8, No. 6, IEEE.

(Continued)

*Primary Examiner* — Jerry M Blevins
(74) *Attorney, Agent, or Firm* — Lewis Roca Rothgerber Christie LLP

(57) ABSTRACT

A method of transfer printing. The method comprising: providing a precursor photonic device, comprising a substrate and a bonding region, wherein the precursor photonic device includes one or more alignment marks located in or adjacent to the bonding region; providing a transfer die, said transfer die including one or more alignment marks; aligning the one or more alignment marks of the precursor photonic device with the one or more alignment marks of the transfer die; and bonding at least a part of the transfer die to the bonding region.

20 Claims, 70 Drawing Sheets

(56) References Cited

U.S. PATENT DOCUMENTS

| | | | |
|---|---|---|---|
| 2005/0053319 A1* | 3/2005 | Doan | G02B 6/12 |
| | | | 385/14 |
| 2007/0072321 A1* | 3/2007 | Sherrer | G02B 6/4201 |
| | | | 438/26 |
| 2008/0138007 A1 | 6/2008 | Okubo et al. | |
| 2015/0093069 A1* | 4/2015 | Nakamura | G02B 6/4228 |
| | | | 385/14 |
| 2016/0070061 A1 | 3/2016 | Fasano et al. | |
| 2016/0116687 A1 | 4/2016 | Sun et al. | |
| 2017/0330876 A1* | 11/2017 | Leedy | H01L 27/115 |
| 2018/0219350 A1* | 8/2018 | Mohrle | H01S 5/4025 |
| 2019/0296160 A1* | 9/2019 | Jacob | H01L 27/144 |

OTHER PUBLICATIONS

Bower, C.A. et al., "Micro-Transfer-Printing: Deterministic Assembly of Microscale Components Using Elastomer Stamps", SEMICON Europa 2014 and PE 2014, 2014, 20 pages.

International Search Report and Written Opinion of the International Searching Authority, dated Nov. 7, 2019, Corresponding to PCT/EP2019/071126, 17 pages.

U.K. Intellectual Property Office Examination Report, dated Sep. 8, 2020, for Patent Application No. GB1911229.1, 4 pages.

U.K. Intellectual Property Office Examination Report, dated Jan. 4, 2021, for Patent Application No. GB1911229.1, 4 pages.

U.K. Intellectual Property Office Search and Examination Report, dated Jan. 27, 2020, for Patent Application No. GB1911229.1, 9 pages.

U.K. Intellectual Property Office Examination Report, dated Mar. 2, 2021, for Patent Application No. GB1911229.1, 4 pages.

\* cited by examiner

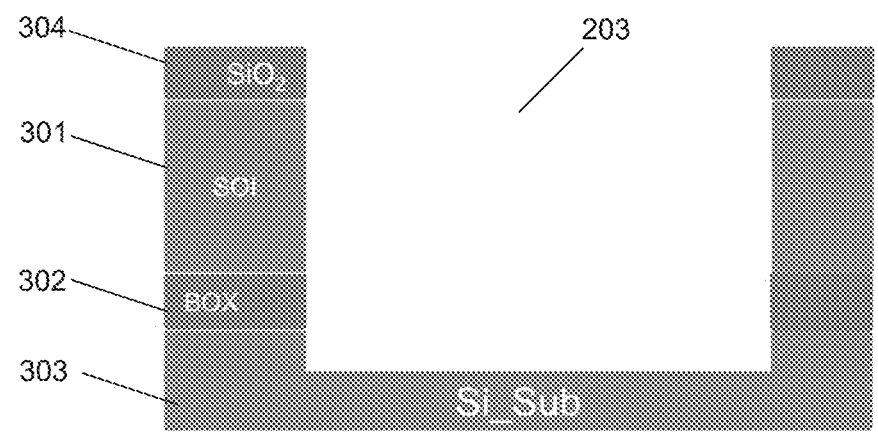
Fig. 3(iii)

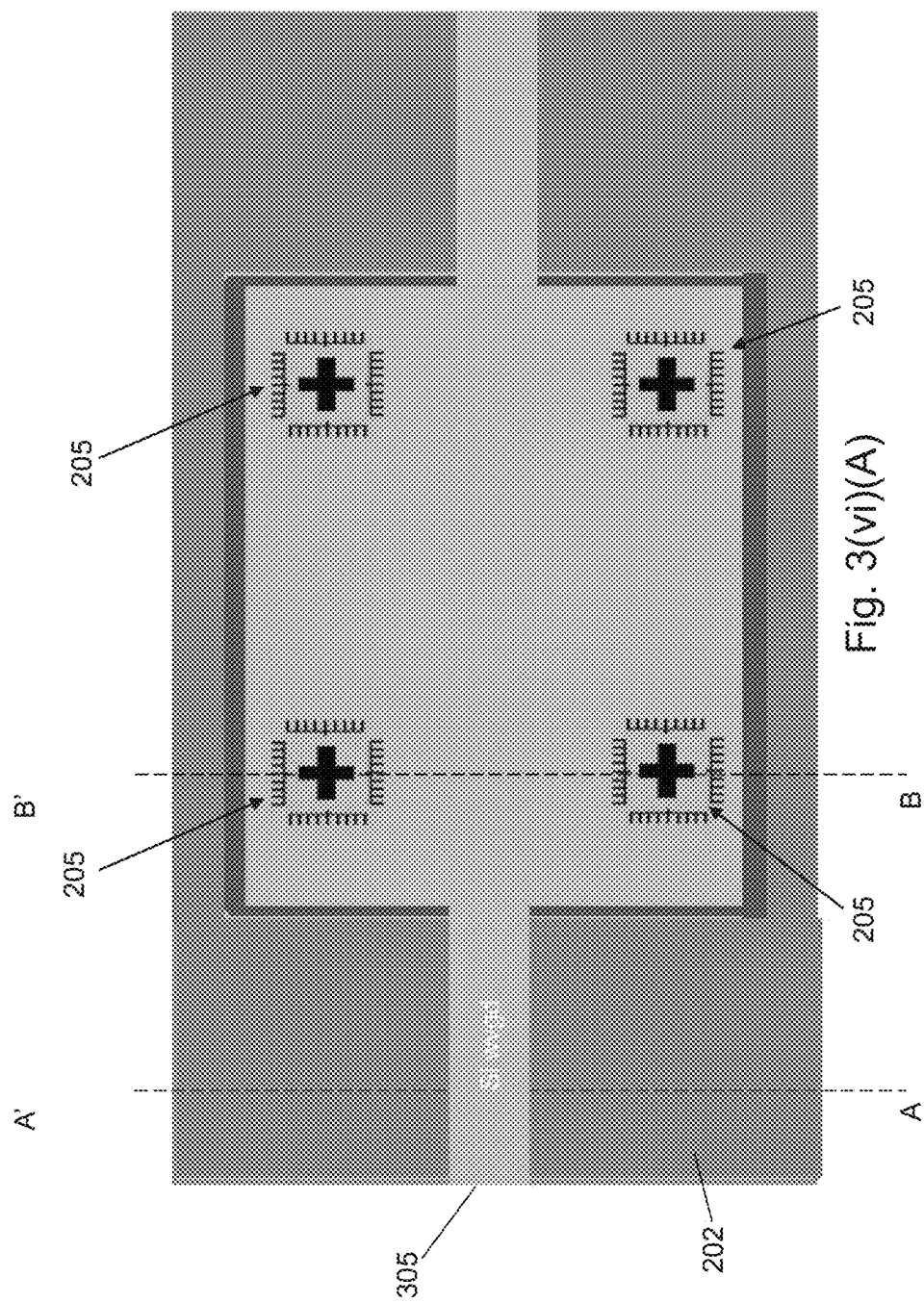

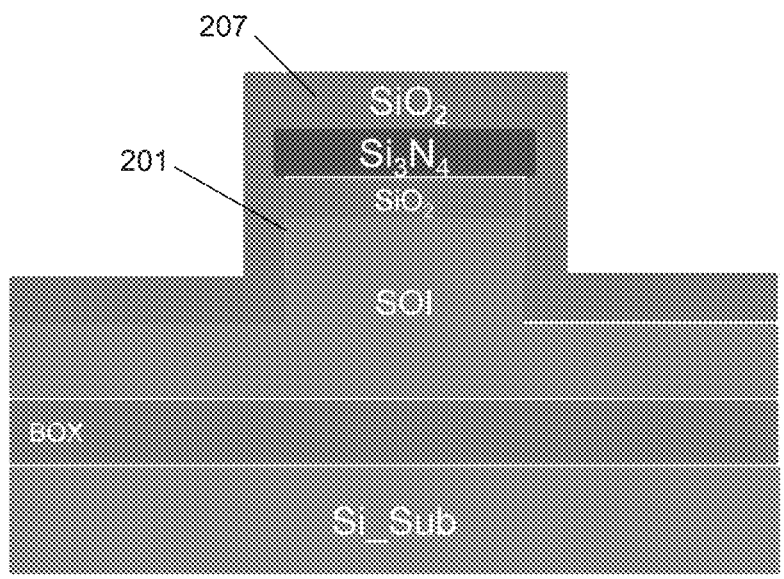
Fig. 3(vii)(A)
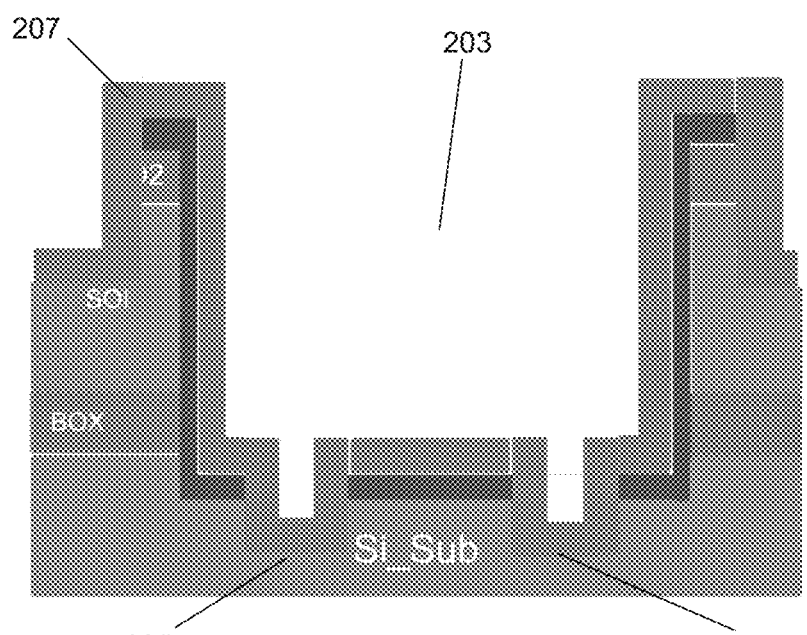
Fig. 3(vii)(B)

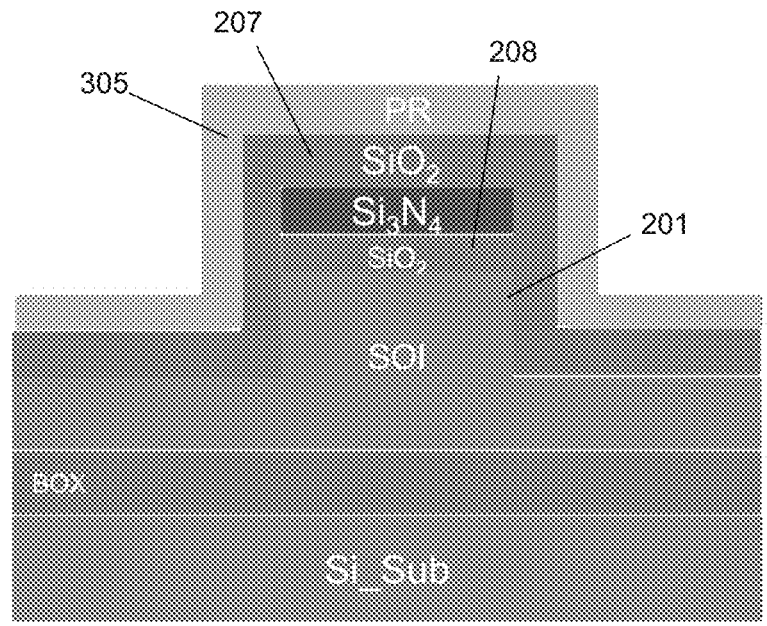
Fig. 3(viii)(A)
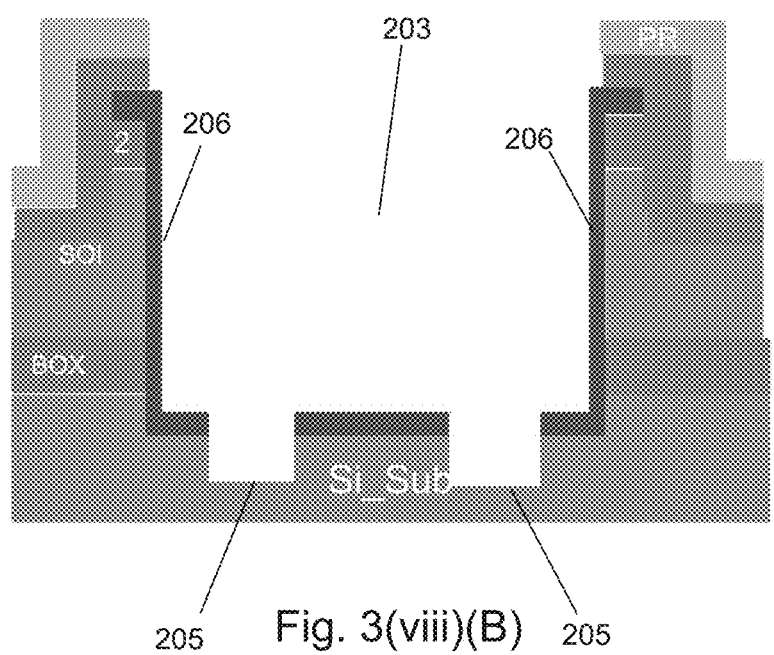
Fig. 3(viii)(B)

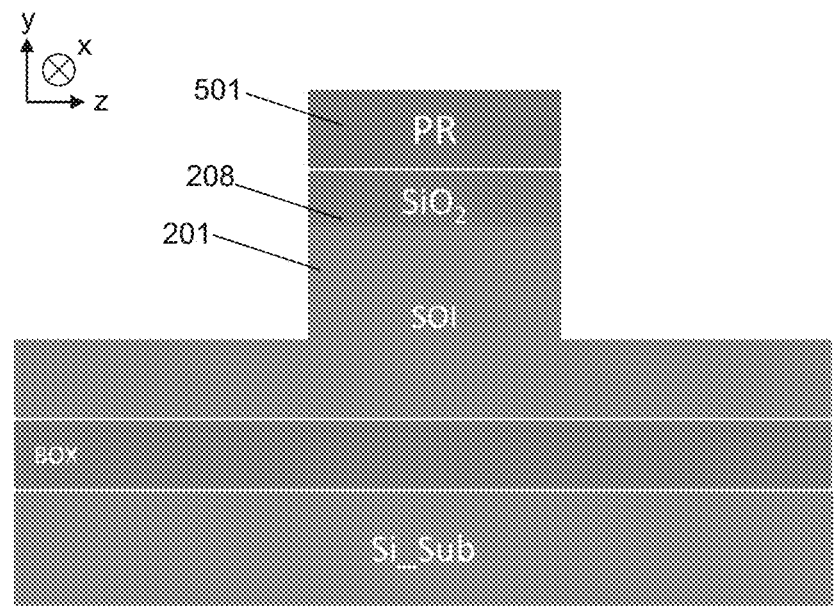
Fig. 5(iii)

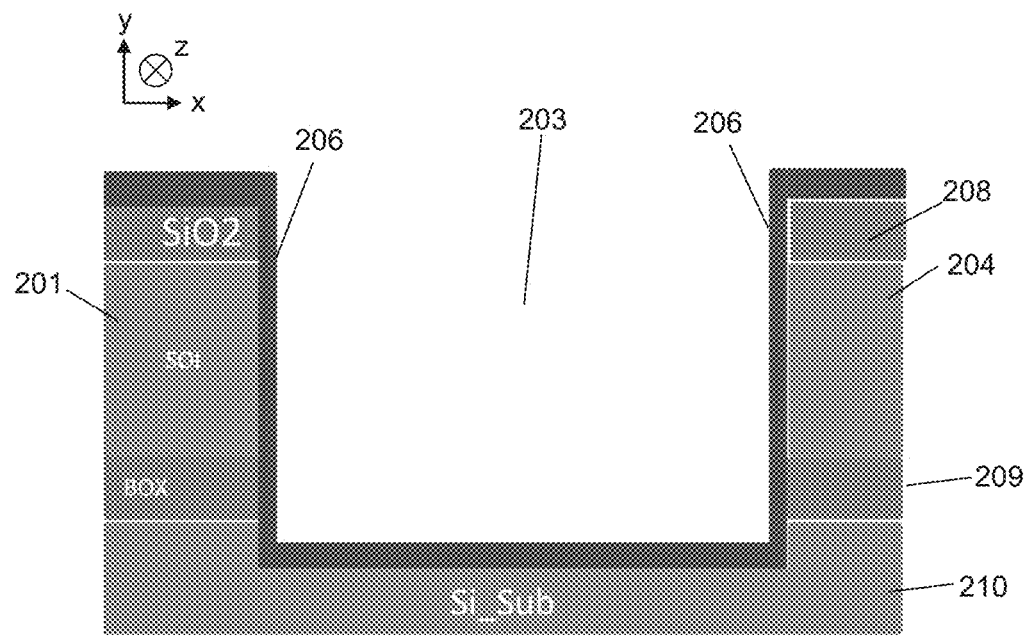
Fig. 5(vii)
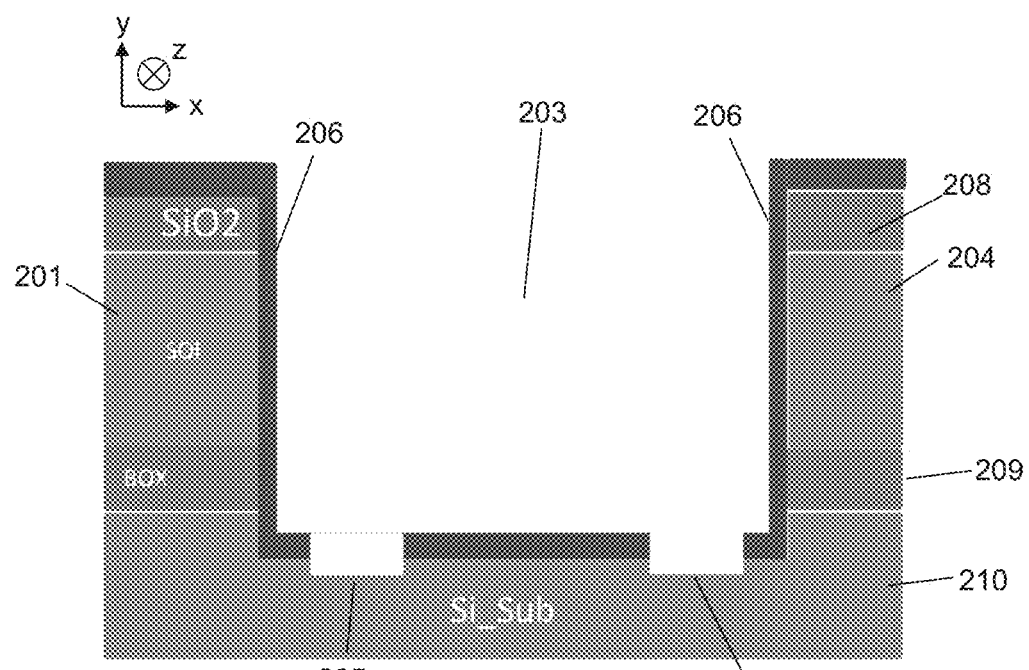
Fig. 5(viii)

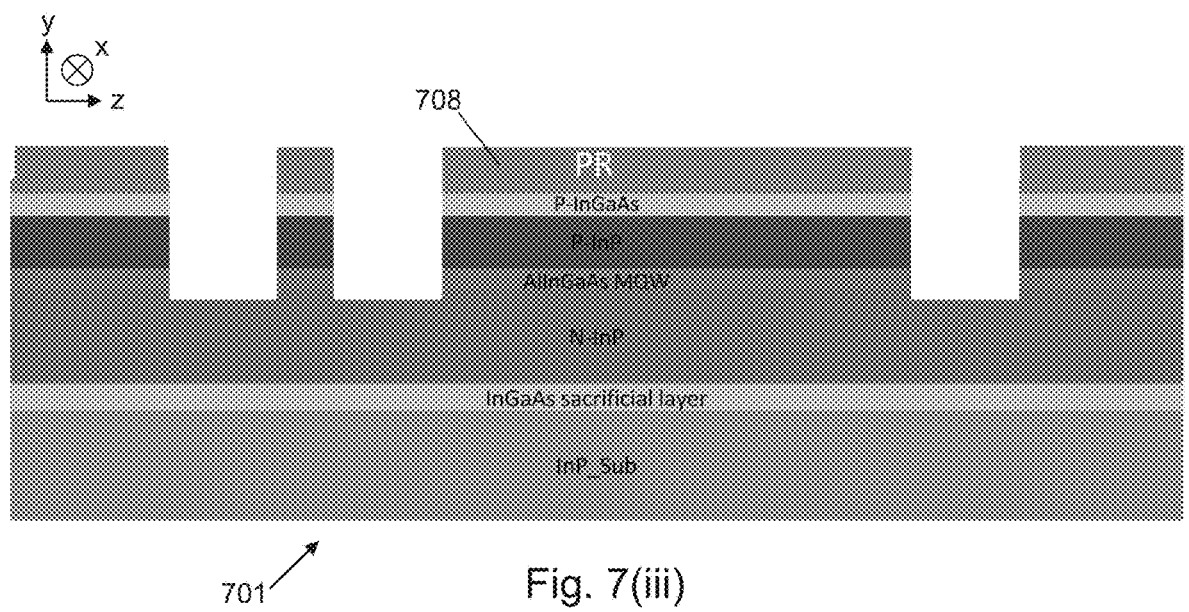
Fig. 7(iii)

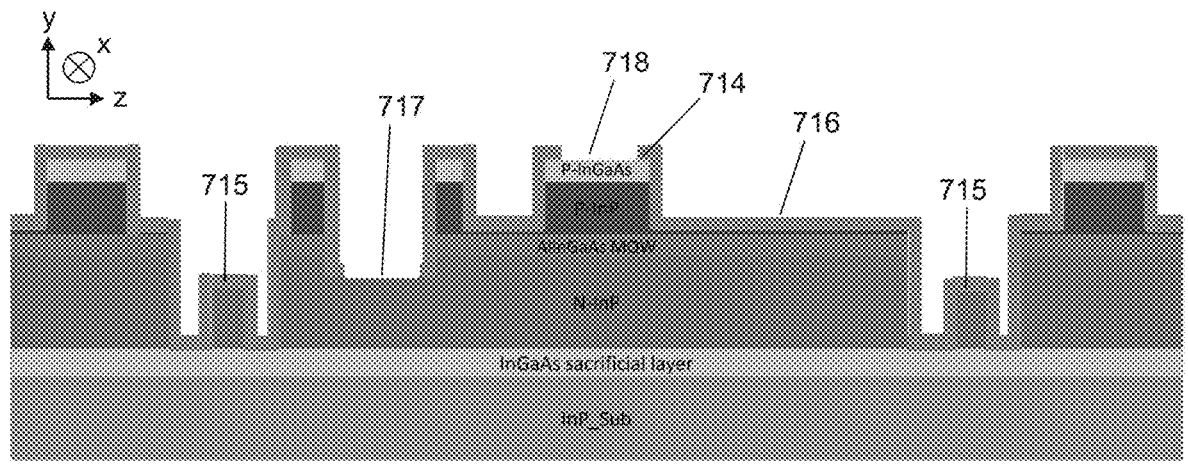
Fig. 7(vii)
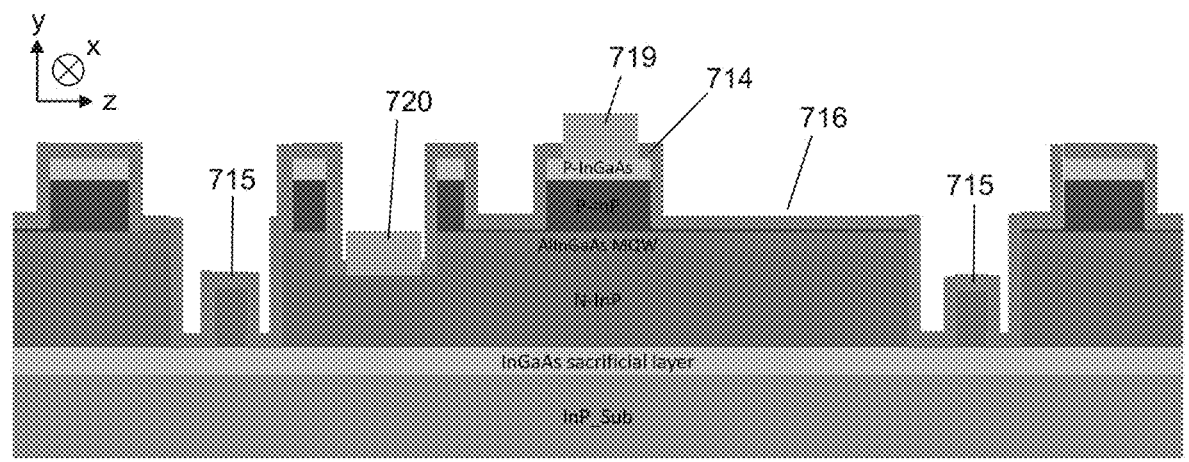
Fig. 7(viii)

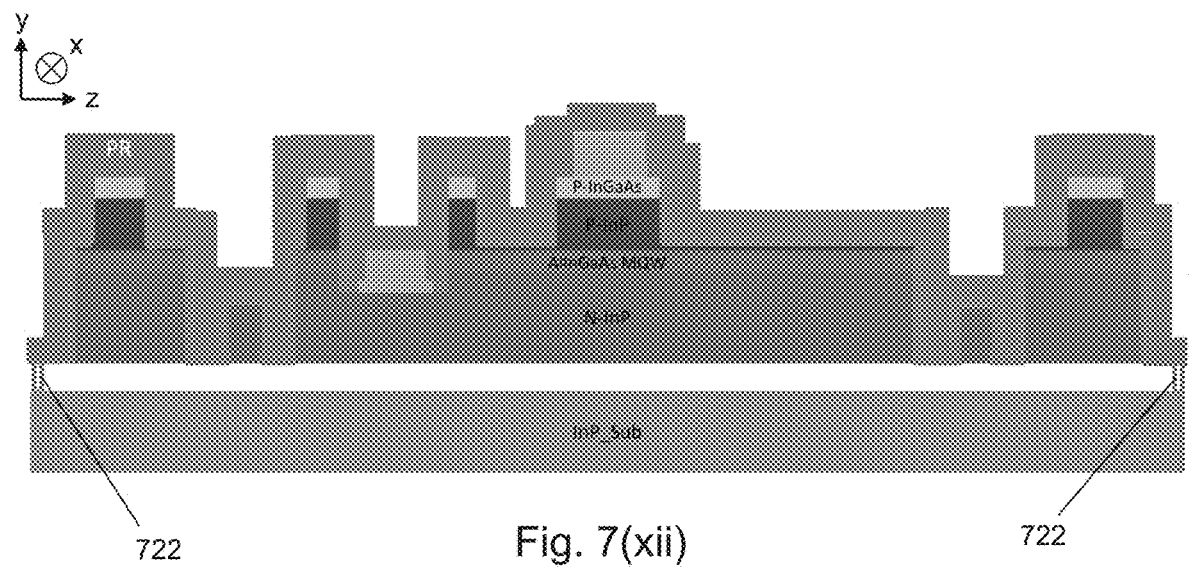
Fig. 7(xii)

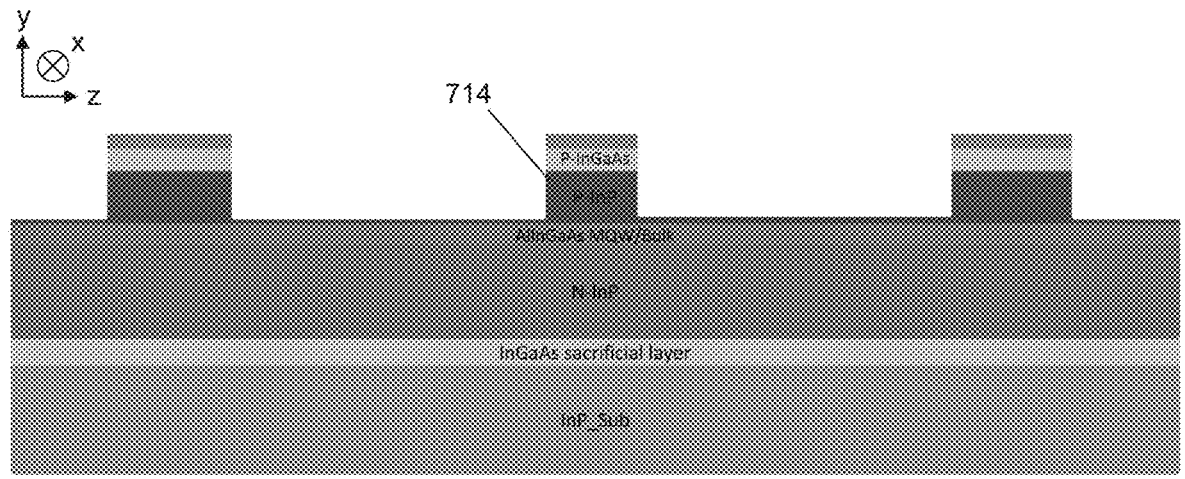
Fig. 9(iii)

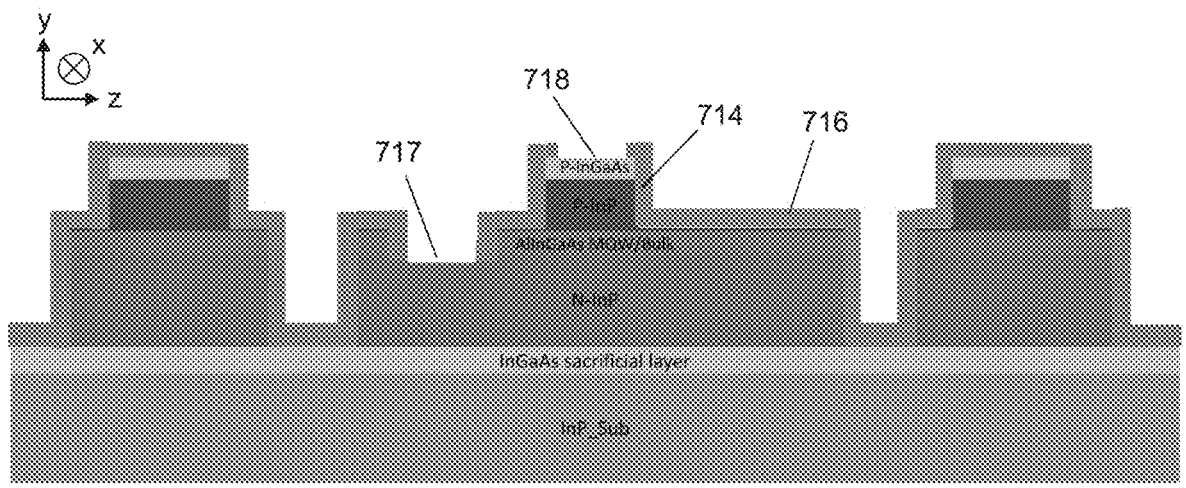
Fig. 9(vii)
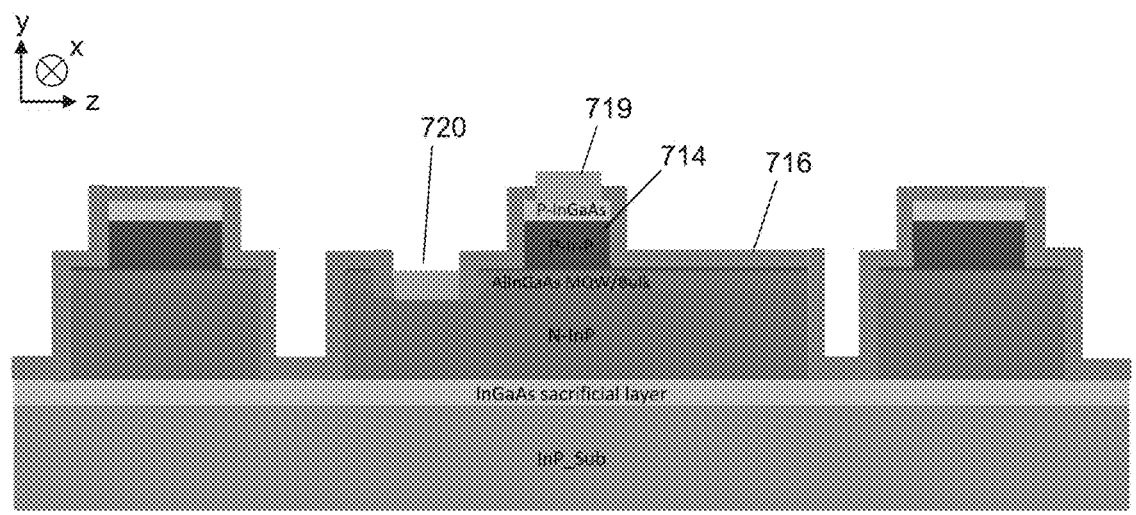
Fig. 9(viii)

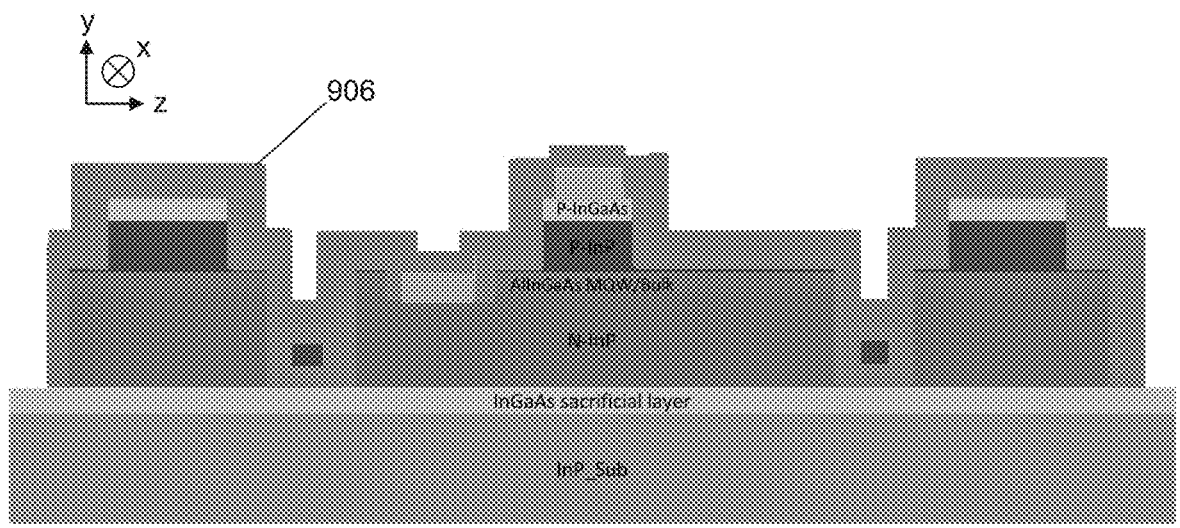
Fig. 9(xii)

Fig. 9(xiii)

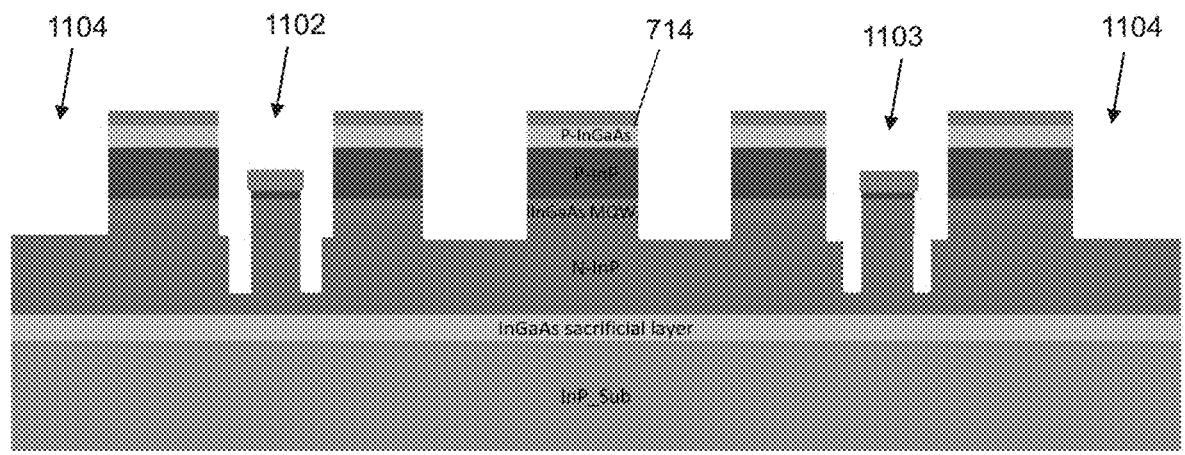
Fig. 11(iii)

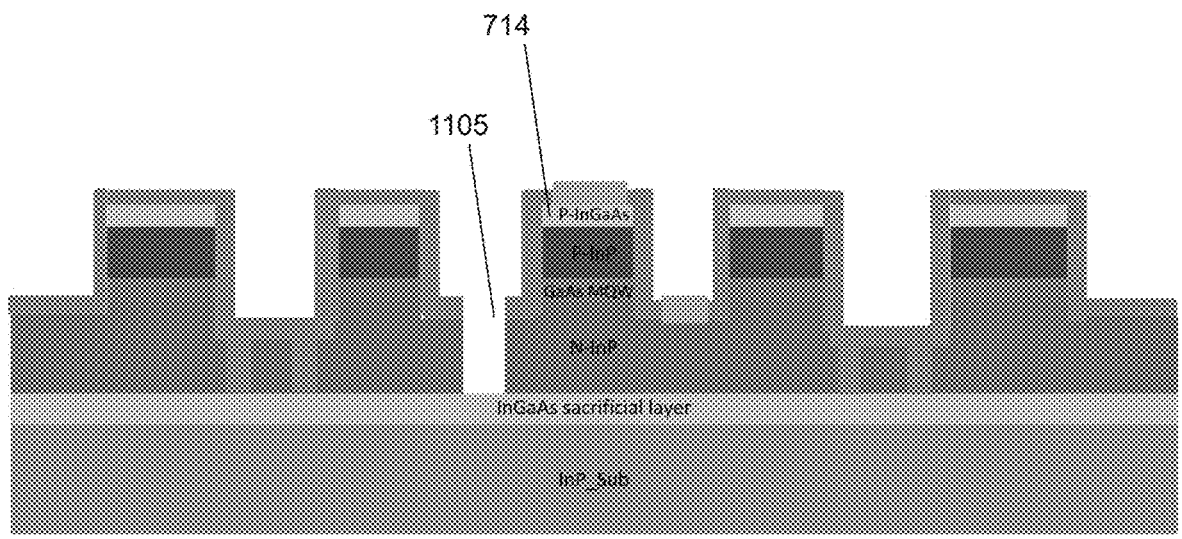
Fig. 11(vii)
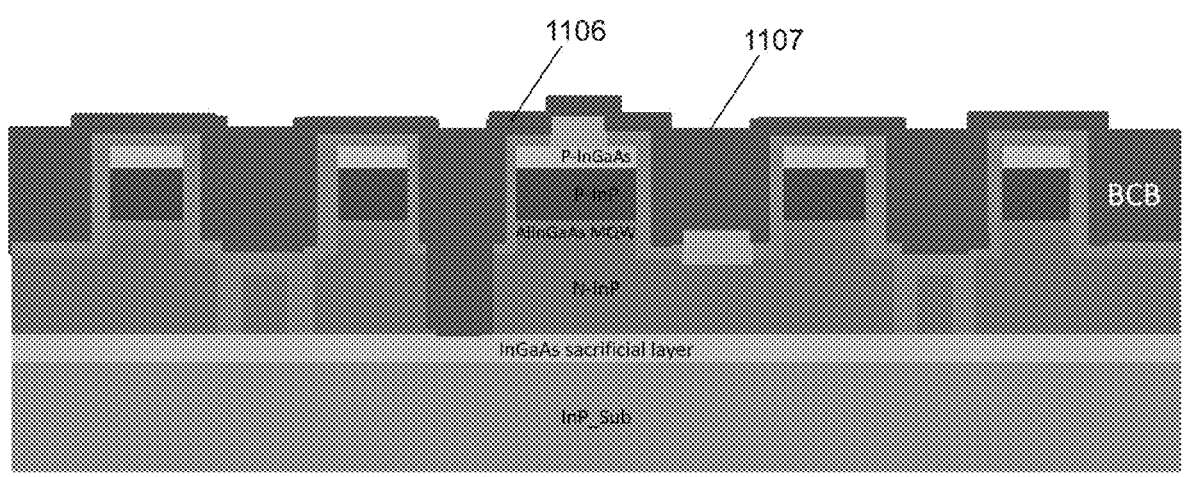
Fig. 11(viii)

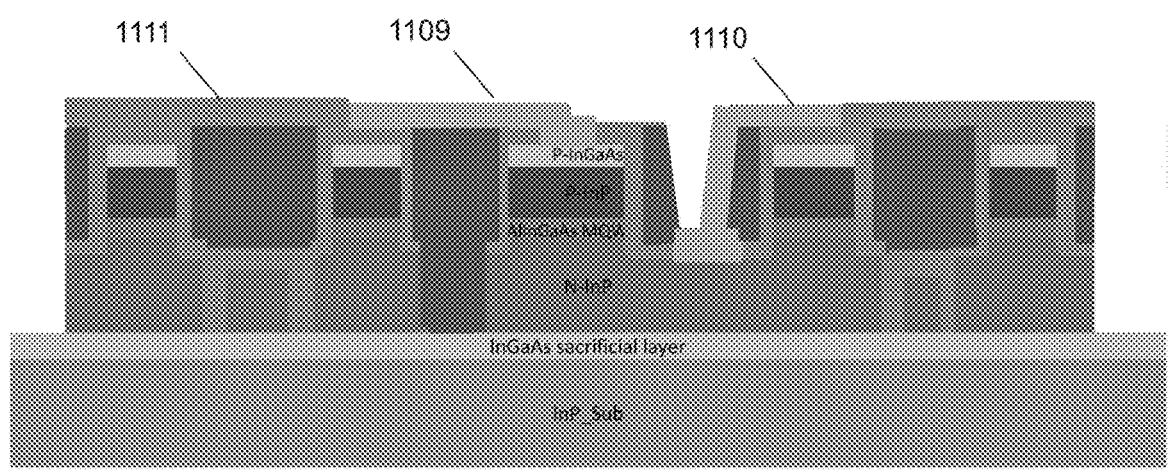
Fig. 11(xii)

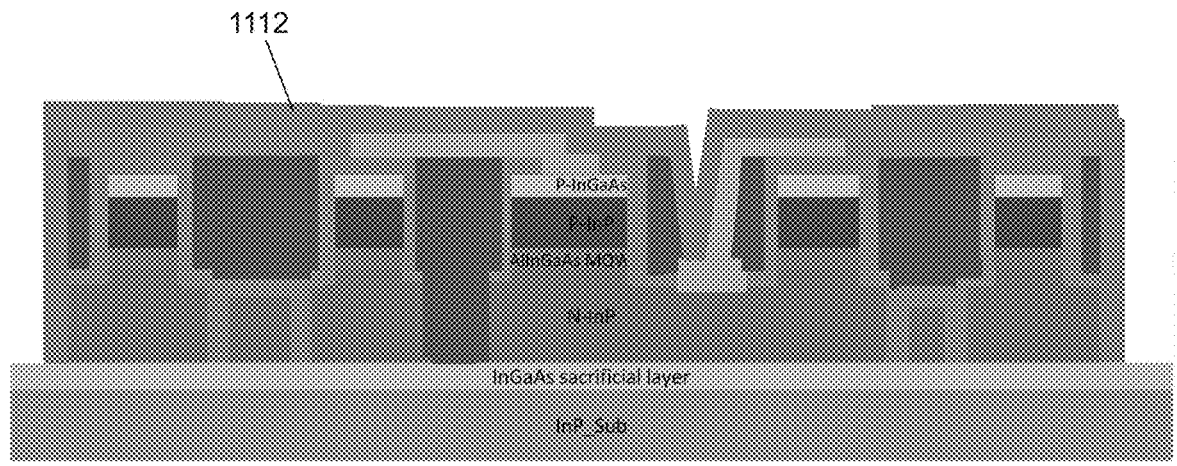
Fig. 11(xiii)
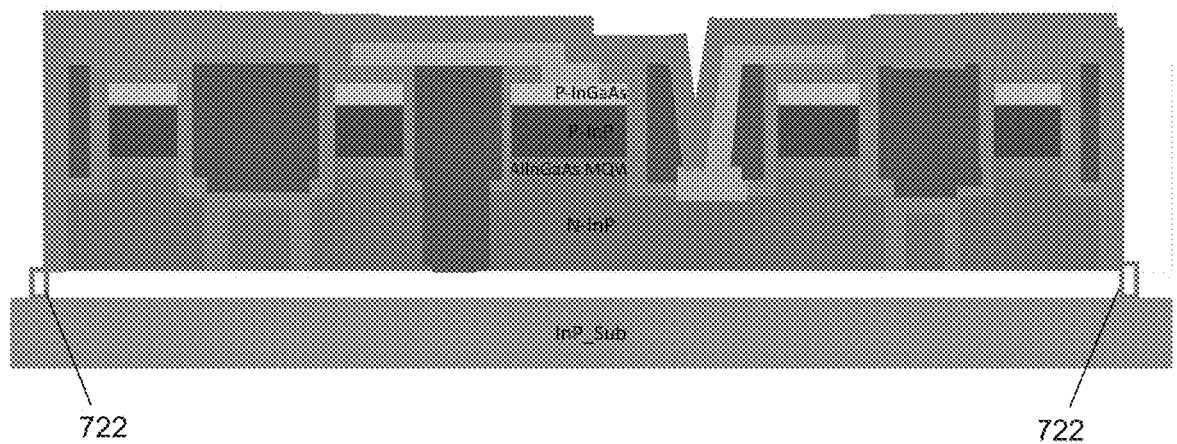
Fig. 11(xiv)

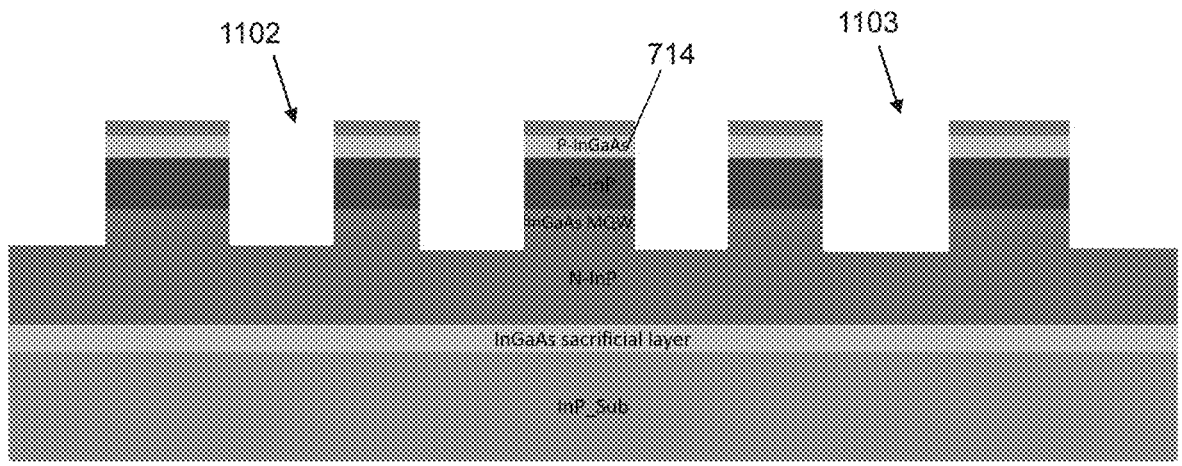
Fig. 13(iii)

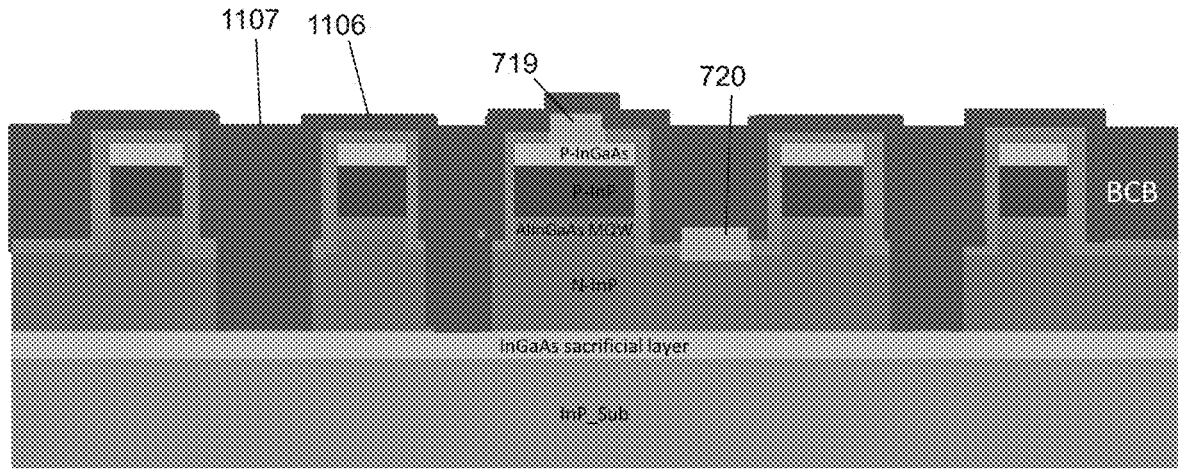
Fig. 13(vii)
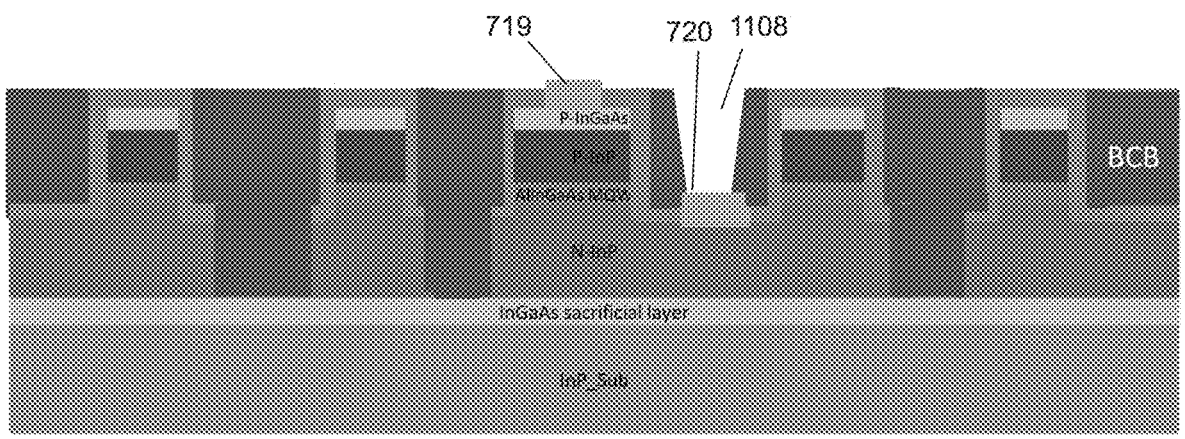
Fig. 13(viii)

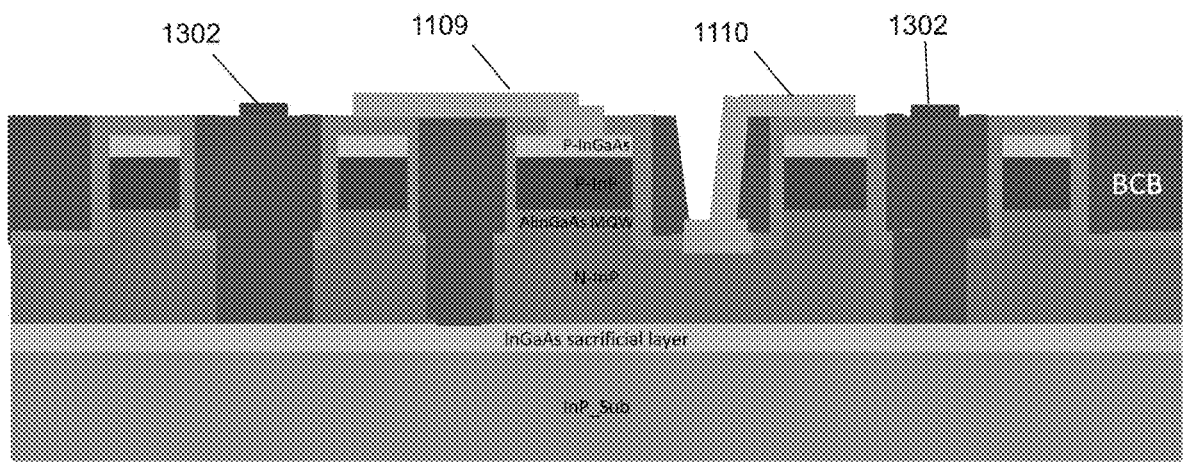
Fig. 13(xi)
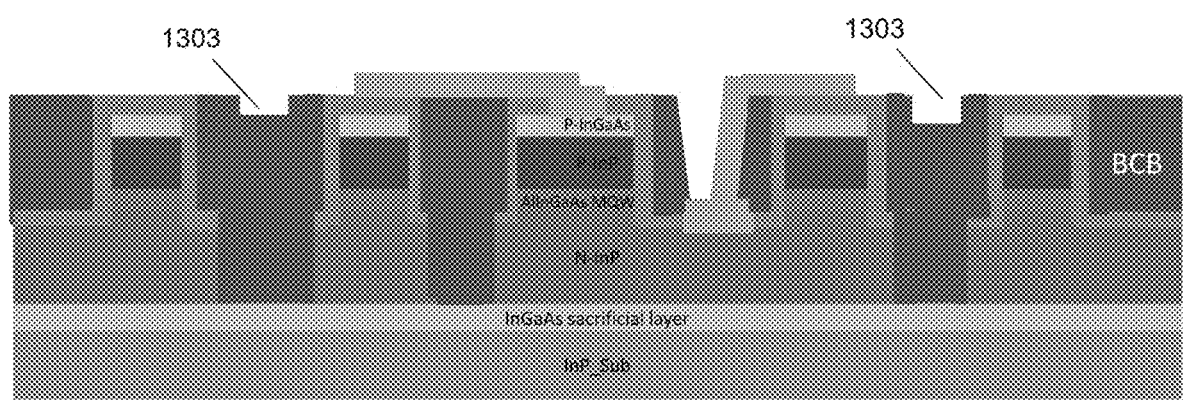
Fig. 13(xi')

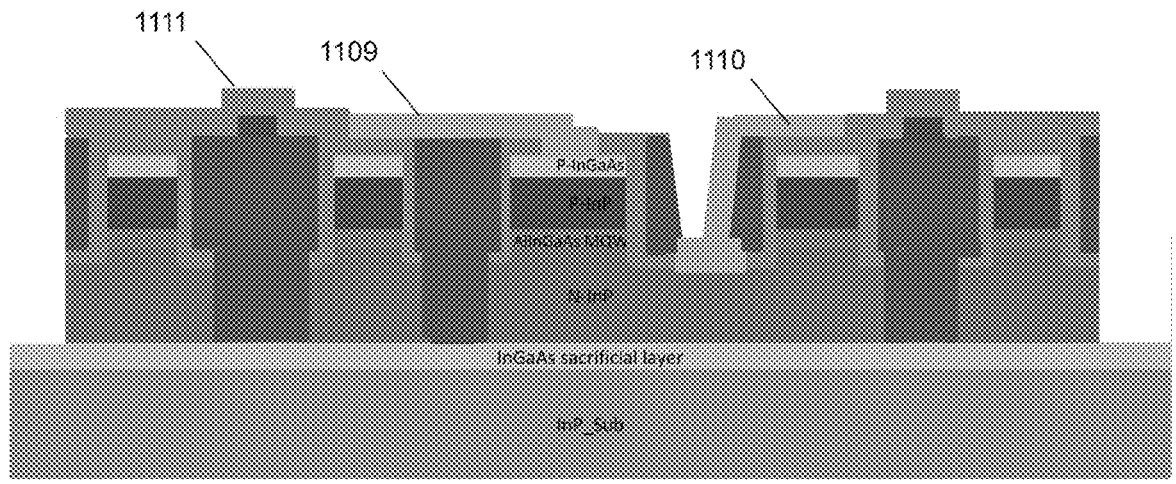
Fig. 13(xii)
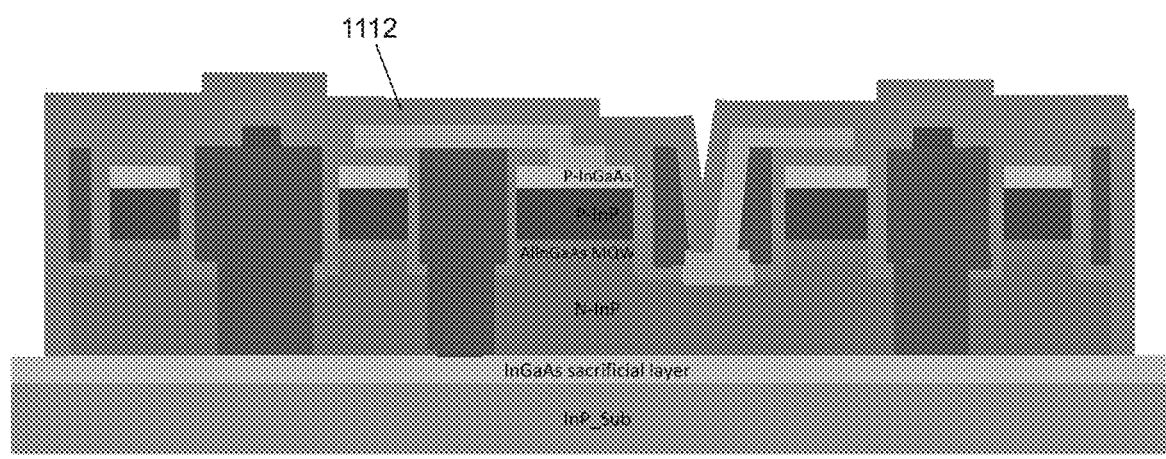
Fig. 13(xiii)

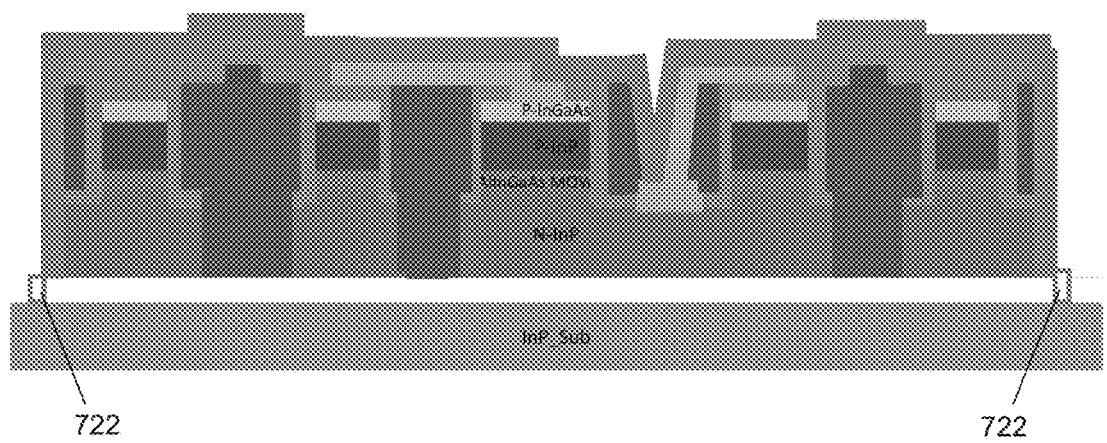
Fig. 13(xiv)

METHOD FOR III-V/SILICON HYBRID INTEGRATION

The present application claims priority to and the benefit of U.S. Provisional Application No. 62/715,123, filed Aug. 6, 2018, entitled "METHOD FOR III-V/SI HYBRID INTEGRATION BY MICRO-TRANSFER PRINTING PROCESS", and claims priority to and the benefit of U.S. Provisional Application No. 62/880,585, filed Jul. 30, 2019, entitled "METHOD FOR III-V/SILICON HYBRID INTEGRATION", the entire contents of both which are incorporated herein by reference.

Embodiments of the present invention relate to a precursor photonic device, a transfer die, a platform wafer, a method of preparing a precursor photonic device, a method of forming a transfer die, and a method of transfer printing.

Micro-transfer printing (MTP) can be used to make hybrid III-V/Si integrated photonic components and circuits, for example as discussed in LOI et al, Transfer Printing of AlGaInAs/InP Etched Facet Lasers to Si Substrates, IEEE Photonics Journal, Vol. 8, No. 6, December 2016 the entire contents of which is incorporated herein by reference. Broadly, MTP involves the creation of a pre-cursor device on a first substrate. The pre-cursor device is then lifted, e.g. via an elastomer stamp, from the first substrate and deposited onto a second substrate.

However, conventional MTP techniques suffer from three main issues: (i) low alignment accuracy (±0.5-1.5 μm) between the III-V device and Si platform; (ii) low III-V/Si bonding adhesion, which leads to low reliability and can require the use of extra materials such as solder to increase adhesion strength; and (iii) low throughput, as many hybrid integration schemes require bonding of individual III-V dies or patches of material to a Si platform, one at a time.

It would be advantageous then to both increase the alignment between the III-V device and Si platform (so as to decrease optical losses in the system), as well as to increase the throughput of hybrid integration schemes.

At a general level, embodiments of the present invention provide III-V devices or precursor devices, as well as Si platforms, which include alignment marks to aid in a method of transfer printing.

In a first aspect, embodiments of the invention provide a method of transfer printing, comprising:
  providing a precursor photonic device, comprising a substrate and a bonding region, wherein the precursor photonic device includes one or more alignment marks located in or adjacent to the bonding region;
  providing a transfer die, said transfer die including one or more alignment marks; aligning the one or more alignment marks of the precursor photonic device with the one or more alignment marks of the transfer die; and
  bonding at least a part of the transfer die to the bonding region.

The method according to the first aspect can advantageously result in alignment accuracies within ±200 nm. Typically the alignment accuracy is influenced by factors including, in the x and y directions: alignment mark design and fabrication; microscopic magnification; resolution of translation stage; and alignment operation, and in the z direction: the accuracy with which the bonding region is fabricated (e.g. how accurately the cavity is etched); the accuracy with which the transfer die is fabricated (e.g. how accuracy the epitaxial growth of the layers is performed; and the alignment operation.

The method may have any one or, to the extent that they are compatible, any combination of the following optional features.

The precursor photonic device may have any, or any combination insofar as they are compatible, of the optional features of the precursor photonic device of the second aspect.

The transfer die may have any, or any combination insofar as they are compatible, of the optional features of the transfer die of the third aspect.

The method may include a step of filling a facet between the precursor photonic device and the transfer die. The filling material used to fill the facet may be either of silicon nitride or amorphous silicon.

The method may comprise one or more steps of: plasma treating the precursor photonic device and/or the transfer die; dipping the precursor photonic device in water; drying the precursor photonic device; and annealing the transfer die and precursor photonic device. The annealing may be performed at a temperature of at least 250° C. and no more than 350° C. for a time of at least 20 minutes and no more than 40 minutes. The annealing step may be performed in an inert gas atmosphere, such as a nitrogen atmosphere or argon atmosphere.

These parameters used in the transfer printing process have been found to increase the bond adhesion and so increase the yield.

In a second aspect, embodiments of the present invention provide a precursor photonic device, comprising:
  a substrate;
  a bonding region, for receiving and bonding to a transfer die; and
  one or more alignment marks, for use in transfer printing, said alignment marks being located in or adjacent to the bonding region.

Such a precursor device can result in a photonic device with increased alignment between one or more optical components once bonded to the bonding region, which can decrease undesirable losses as light passes through the photonic device.

The precursor photonic device may have any one or, to the extent that they are compatible, any combination of the following optional features.

The bonding region may be a cavity, provided in the substrate. The alignment marks may be etched in the cavity. The alignment marks may, alternatively, be etched in a region of the precursor device proximal to but not within the cavity. This can allow the alignment marks to be self-aligned with any optical components existing in the precursor device before bonding.

The alignment marks may be located either in the bonding region, or in a region of the precursor device proximal to the bonding region but not within it. In examples where the alignment marks are in a region of the precursor device proximal to the bonding region but not within it, this can increase the adhesion strength between the precursor device and a subsequently transferred photonic device.

The precursor photonic device may further comprise an input waveguide, wherein the alignment marks are configured to align a photonic device, located on the transfer die, relative to the input waveguide.

The one or more alignment marks may allow for alignment in at least two non-parallel directions.

The one or more alignment marks may be provided as one or more etched regions and/or one or more patterned metal surfaces. The etched regions may have a depth of at least 100 nm and no more than 3000 nm.

The precursor photonic device may include one or more coarse alignment marks, and one or more fine alignment marks. The one or more coarse alignment marks may project in at least two non-parallel directions. The one or more coarse alignment marks may be any one or more of: an arrow, a cross, a T shape, and an L shape. There may be two or more fine alignment marks which respectively project in at least two non-parallel directions. The one or more fine alignment mark(s) may include Vernier patterns.

The precursor photonic device may be a silicon-on-insulator wafer, including either or both of an input waveguide and an output waveguide, each adjacent to the bonding region.

In a second third, embodiments of the invention provide a transfer die comprising:
  a photonic device, said photonic device having a bonding surface suitable for bonding to a precursor photonic device;
  wherein the transfer die includes one or more alignment marks, for use in a transfer-print process.

Such a transfer die can result in a photonic device with increased alignment between the photonic device and one or more parts of the precursor photonic device, which can decrease undesirable losses as light passes through them.

The transfer die may have any one or, to the extent that they are compatible, any combination of the following optional features.

The photonic device may be a III-V semiconductor device and/or the transfer die may include a sacrificial layer.

The photonic device may be a laser, a semiconductor optical amplifier, or an electro-absorption modulator. The photonic device may be an elector-absorption modulator, and the electro-absorption modulator may comprise an input waveguide and an output waveguide, and both of the input waveguide and output waveguide may comprise a port located on a same side of the transfer die.

The photonic device may be formed at least partially from indium phosphide, and/or a sacrificial layer is formed of indium gallium arsenide.

The alignment marks may be provided on an optically transparent region of the transfer die.

The transfer die may be formed on an indium phosphide substrate.

The photonic device may include one or more coarse alignment marks and one or more fine alignment marks. The one or more coarse alignment mark(s) may project in at least two non-parallel directions. The one or more coarse alignment mark(s) may be shaped as any one or more of: an arrow, a cross, a "T" shape, and an "L" shape. There may be two or more fine alignment marks which respectively project in at least two non-parallel directions. The one or more fine alignment marks may include Vernier patterns.

In a third fourth, embodiments of the invention provide a platform wafer, suitable for use in a transfer printing process, said platform wafer including:
  one or more alignment chips, said alignment chips including one or more alignment marks; and
  one or more precursor photonic device(s).

Advantageously, such a platform wafer can allow larger throughput in producing photonic devices. The alignment chips can be given over solely to the provision of alignment marks.

The precursor photonic device of the fourth aspect may have any, or any combination insofar as they are compatible, of the optional features of the precursor photonic device of the second aspect.

In a fifth aspect, embodiments of the invention provide a transfer wafer, suitable for use in a transfer printing process, said wafer including:
  one or more alignment chips, said alignment chips including one or more alignment marks; and
  one or more device chips.

Advantageously, such a transfer wafer can allow larger throughput in producing photonic devices. The alignment chips can be given over solely to the provision of alignment marks.

The transfer wafer may have any, or any combination insofar as they are compatible, of the optional features of the transfer die of the third aspect.

In a sixth aspect, embodiments of the invention provide a method of preparing a precursor photonic device comprising the steps of:
  providing a wafer, comprising a substrate and a device layer; and
  etching one or more alignment marks into the wafer.

The method may have any one or, to the extent that they are compatible, any combination of the following optional features.

The method may further comprise: etching a cavity into the wafer, said cavity extending from an uppermost surface of the device layer to at least an uppermost surface of the substrate; and etching the one or more alignment marks into the substrate.

The method may further comprise a step of etching at least one of an input waveguide and an output waveguide, said input waveguide and/or output waveguide having a surface adjacent to the cavity. The step of etching one or more alignment marks may be performed at the same time as etching the input waveguide and/or output waveguide. Advantageously, be performing etching the alignment mark(s) and waveguide(s) at the same time, it can be ensured that there is no alignment error between the waveguide(s) and alignment mark(s).

The step of etching the one or more alignment marks and the input waveguide and/or output waveguide may comprise the steps of:
  (a) providing a photoresist over an upper surface of the precursor photonic device;
  (b) patterning the photoresist to provide one or more exposed regions; and
  (c) etching the exposed regions.

The method may further comprise a step of depositing an antireflective coating, formed, in some embodiments, of silicon nitride, along either or both of: one or more sidewalls; and/or a bed of the cavity. The method may further comprise a step of removing at least the antireflective coating present adjacent to the alignment marks.

The method may further comprise a step of depositing a top cladding layer over the exposed upper surface of the precursor photonic device, after the step of etching the one or more alignment marks. The method may include a step of removing portions of the top cladding layer which are within the cavity.

In a seventh aspect, embodiments of the invention provide a method of forming a transfer die, comprising the steps of:
  providing a multi-layered structure, said multi-layered structure including at least a sacrificial layer and one or more optically active layers; and
  etching one or more alignment marks into a part of the multi-layered structure.

The method may have any one or, to the extent that they are compatible, any combination of the following optional features.

The step of etching one or more alignment marks may be performed concurrently with the step of etching one or more device structure into the multi-layered structure. Advantageously, by etching the alignment mark(s) and device structure concurrently, it can be ensured that there is no alignment error between the device structure and the alignment mark(s). The method may include a step of depositing a stress compensation layer.

Etching the one or more alignment marks into a part of the multi-layered structure may include etching a region of the transfer die such that it is optically transparent.

The alignment marks may be etched entirely through the multi-layered structure.

Further aspects of the present invention provide: a computer program comprising code which, when run on a computer, causes the computer to perform the method of the first, fifth, or sixth aspects; a computer readable medium storing a computer program comprising code which, when run on a computer, causes the computer to perform the method of the first, fifth, or sixth aspects; and a computer system programmed to perform the method of the first, fifth, or sixth aspects.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1:
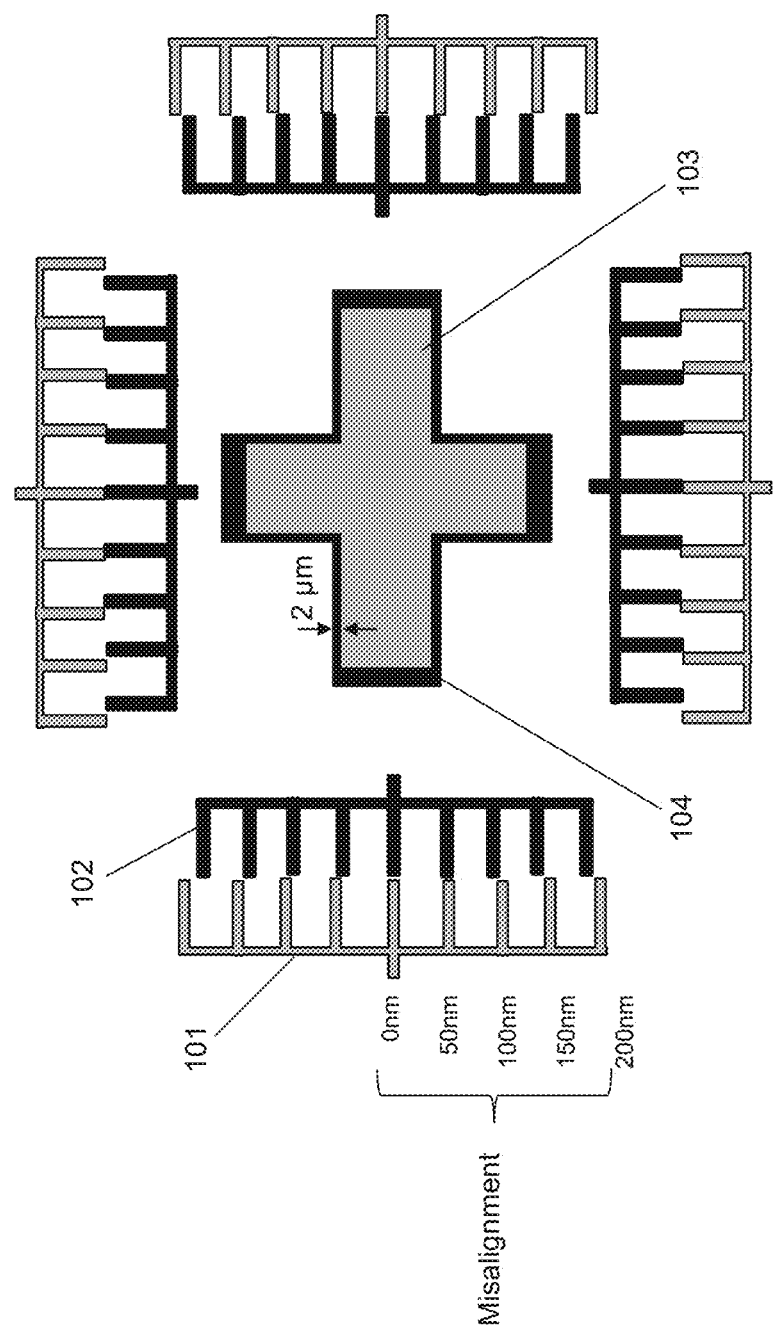
FIG. 1 shows an example alignment mark set used in embodiments of the present invention.

FIG. 1 shows an example alignment mark set used in embodiments of the present invention. As used herein, an "alignment mark" is a feature that is suitable for use in performing optical alignment. The alignment mark set includes four components: fine alignment marks present on the transfer die 101; fine alignment marks present on the precursor device 102; a coarse alignment mark on the transfer die 103; and a coarse alignment mark on the precursor device 104.

The coarse alignment marks take the form of a + or cross shape, with the alignment mark on the precursor device 104 being larger than that on the transfer die 103. Therefore, when the transfer die is positioned above the precursor device, an outline of the coarse alignment mark of the precursor device can be seen surrounding the coarse alignment mark of the transfer die. This alignment is typically accurate to within 2 μm. The coarse alignment marks make take essentially any shape, for example a 'T' shape, shape, or any other shape which extends in at least two non-parallel directions. In some embodiments, the coarse alignment marks take the form of a cross or + shape.

The fine alignment marks take the form of a set of Vernier scales. The Vernier scales on each of the precursor device and transfer die allow for alignment accuracy to within the tens to hundreds of nanometers, as shown.

Figure 2A:
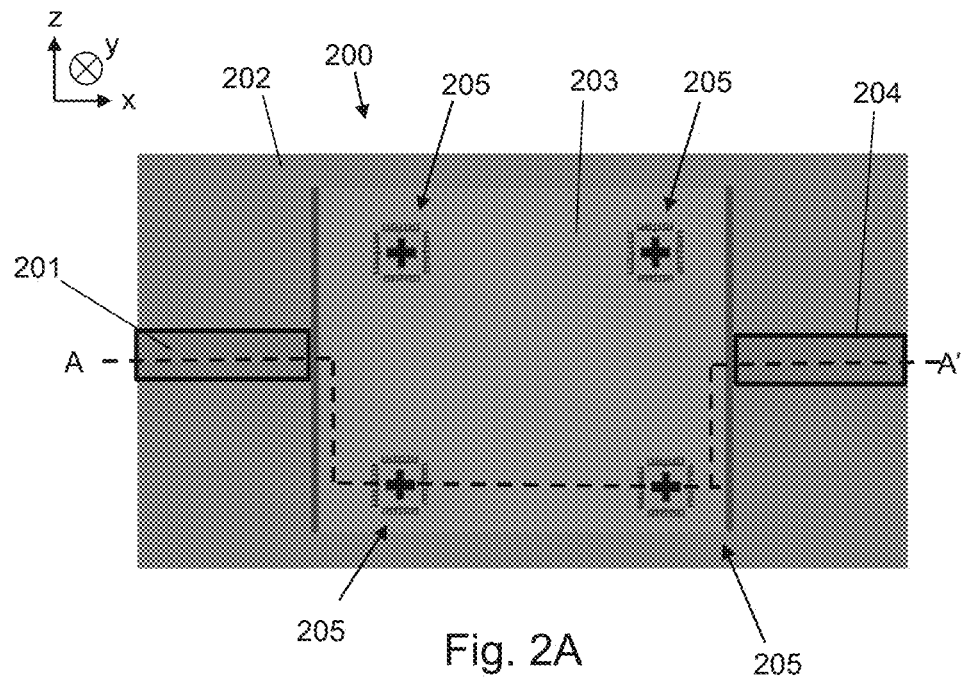
FIGS. 2A and 2B show respective views of a precursor photonic device, comprising a silicon-on-insulator, SOI, waveguide including alignment marks.
Figure 2B:
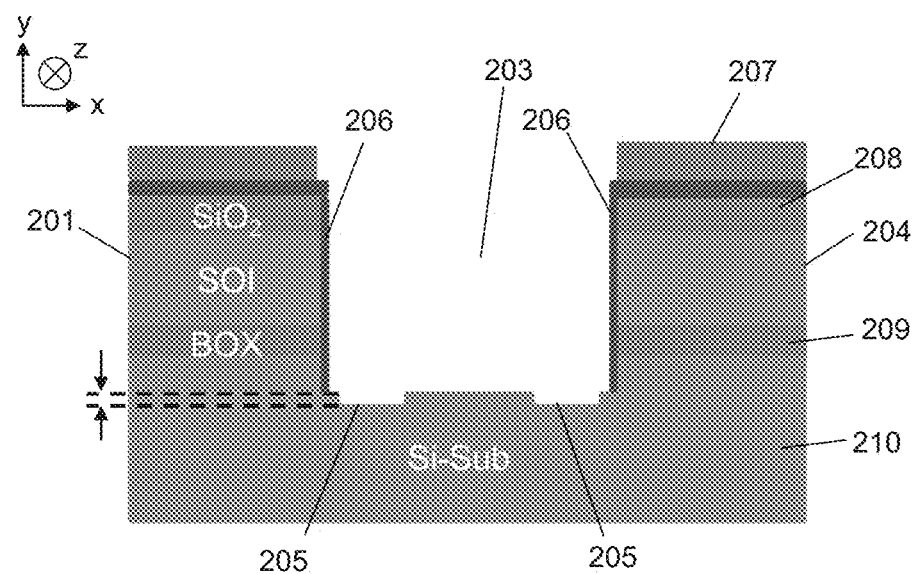

FIGS. 2A and 2B show respective views of a precursor photonic device 200. The device comprises a silicon-on-insulator, SOI, waveguide including alignment marks. FIG. 2A is a top-down view of the precursor photonic device 200, where 'x' is the guiding direction of light through the device, 'y' is a height direction out of the plane, and 'z' is a direction perpendicular to 'x' and 'y'. The device includes an input waveguide 201, formed from a silicon-on-insulator wafer. Opposite the input waveguide, across a cavity 203, is output waveguide 204. It should be noted that the prefix input and output in this context is for clarity, and that, as discussed below, either waveguide 201 or 204 may function as the input or output waveguide and vice versa. The waveguides may be either 1 μm or 3 μm in height (as measured from a bottom cladding layer to a top cladding layer of the waveguide), and the mode centre may be aligned with the waveguide mode of a photonic device to be placed in the cavity, as is discussed in more detail below. The cavity 203 extends across a width of the device, between the input 201 and output 204 waveguides, and contains four alignment marks 205 of the type discussed previously in relation to the precursor device. The upper surface 202 of the device can be seen, which is higher (i.e. closer to the viewer of the figure) than the bed of cavity 203.

FIG. 2B shows a section view of the precursor photonic device 200 along the cut A-A'. It should be noted that the view is not to scale, and certain regions have been compressed relative to the dimensions shown in FIG. 2A in order to fit to the page. More of the structure of the device can be seen here, for example upper cladding layer 208 and lower cladding layer 209 (provided by the buried oxide/insulator layer of the SOI wafer) can be seen. As well as passivation layer 207.

Notably, the cavity 203 sidewalls of the cavity adjacent to the input 201 and output 204 waveguides are lined with an anti-reflective coating 206. In this example, the antireflective coating is formed of silicon nitride, and specifically $Si_3N_4$. As can be seen, the alignment features 205 are provided within the bed of the cavity and extend further into substrate 210 than the remaining bed of the cavity. The extension of the alignment marks into the bed of the cavity should be sufficient as to provide enough contrast for alignment by microscope (e.g. optical microscope). For example, the alignment marks may extend at least 150 nm and no more than 2000 nm into the bed of the cavity. The bed of the cavity where the alignment marks are not present may have a surface roughness of less than or equal to 1 nm (for example, the arithmetic average value Ra as measured according to ISO 25178). This increases the reliability of subsequent bonding.

Figure 3I:
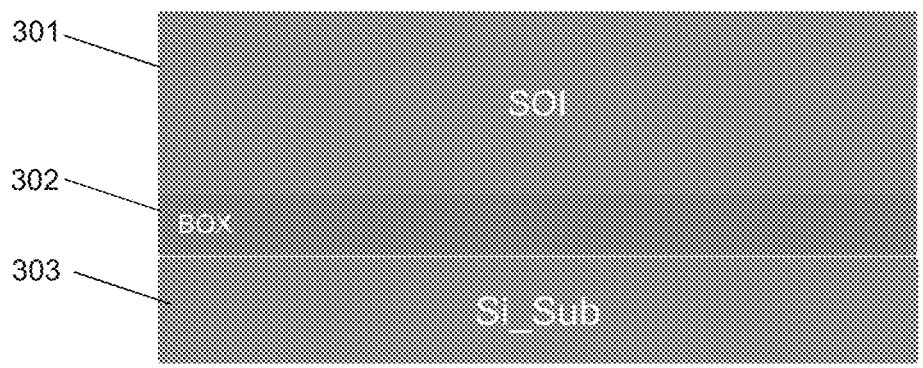
FIGS. 3(i)-3(ix)(B) show various manufacturing steps of a method to produce an SOI waveguide including alignment marks.
Figure 3:
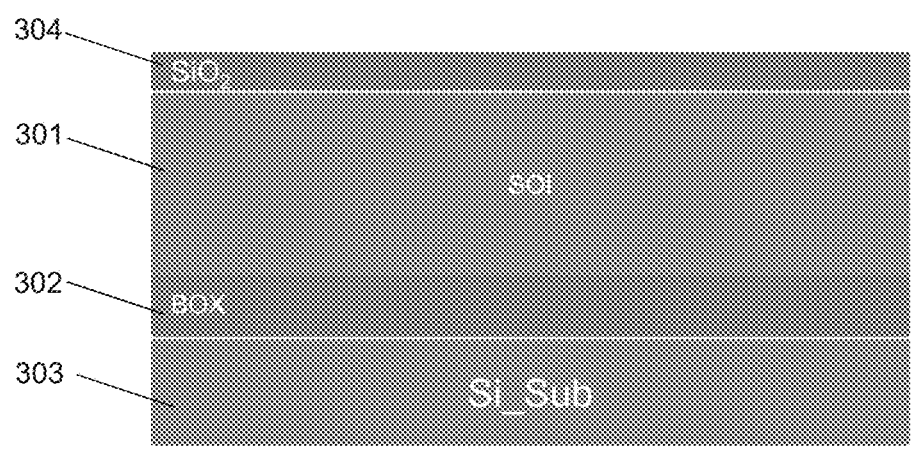
Figure 3:
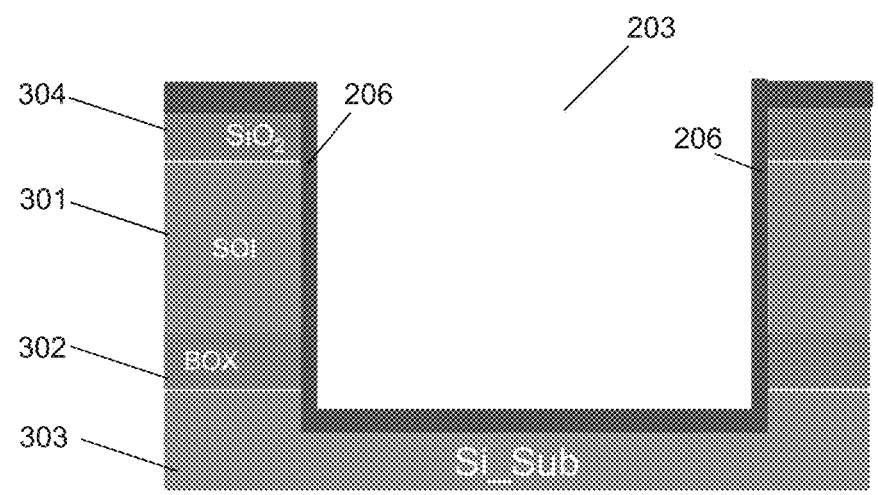

FIGS. 3(i)-3(ix) show various manufacturing steps of a method to produce an SOI waveguide, an example of the precursor photonic device 200, including alignment marks. In a first step shown in FIG. 3(i), an SOI wafer is provided which includes: device or silicon on insulator layer 301, buried oxide layer 302, and substrate 303. Next, in a step shown in FIG. 3(ii), a cavity patterning layer 304 is deposited over the upper surface of the device layer 301. This cavity patterning layer is formed of $SiO_2$.

After the cavity patterning layer 304 is provided, a cavity 203 is patterned and etched as shown in FIG. 3(iii). The depth of the cavity may depend on the mode centre alignment between the waveguides 201/204 and the optical modes in the device to be bonded to the bed of the cavity. Alternatively, the height of various layers in the device to be bonded may be adjusted to align the mode centre between the waveguide(s) and the device. After the cavity 203 is etched, an antireflective (ARC) layer 206 is provided over all exposed surfaces. Therefore both the sidewalls and bed of the cavity 203 are lined with ARC layer, which in some examples is formed of silicon nitride e.g. $Si_3N_4$. In most examples, the bed and upper surface of the device will be cleared of their ARC layers.

Figure 3V:
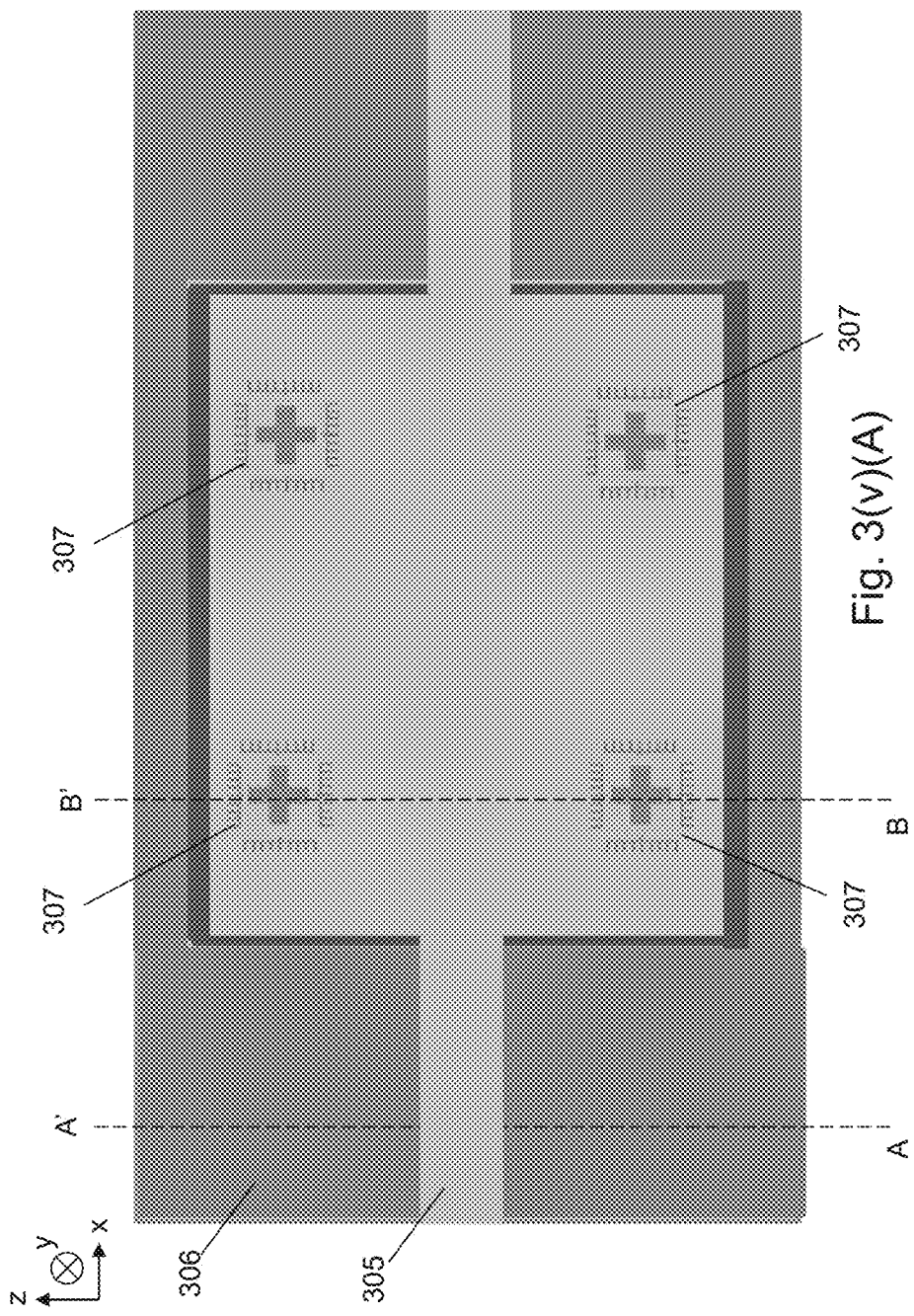
Figure 3V:
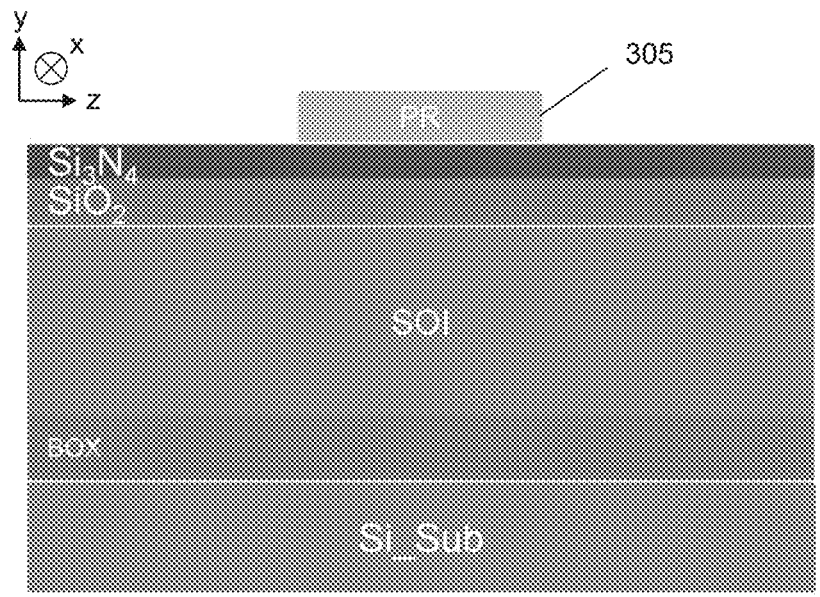
Figure 3V:
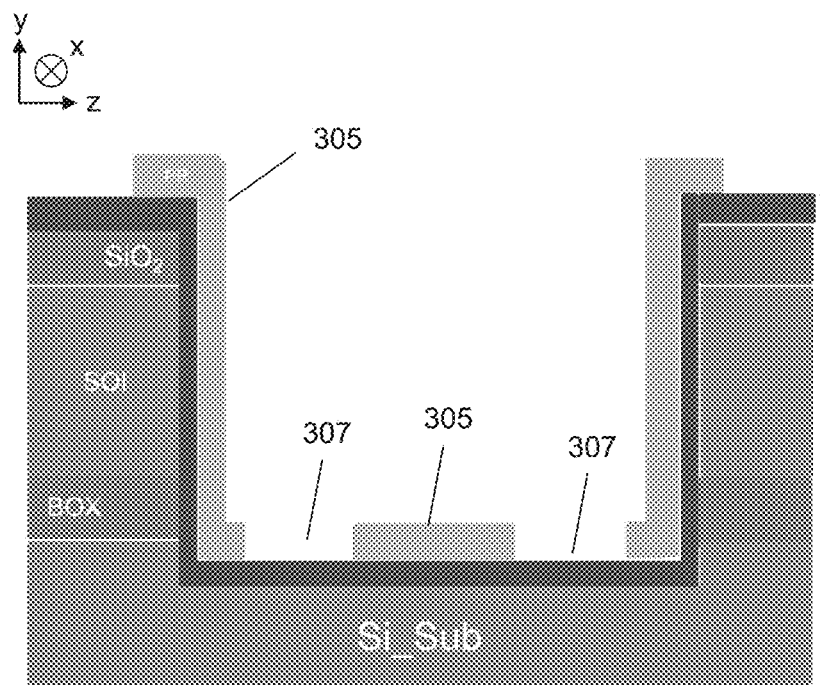
Figure 3:
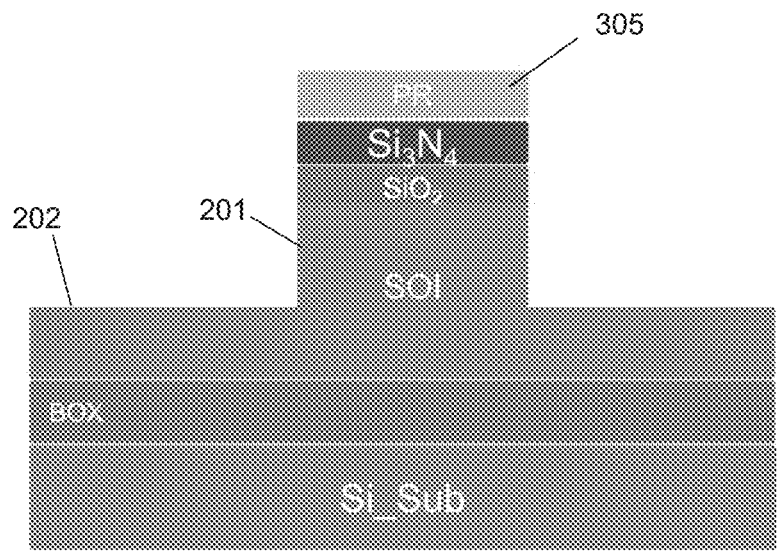
Figure 3:
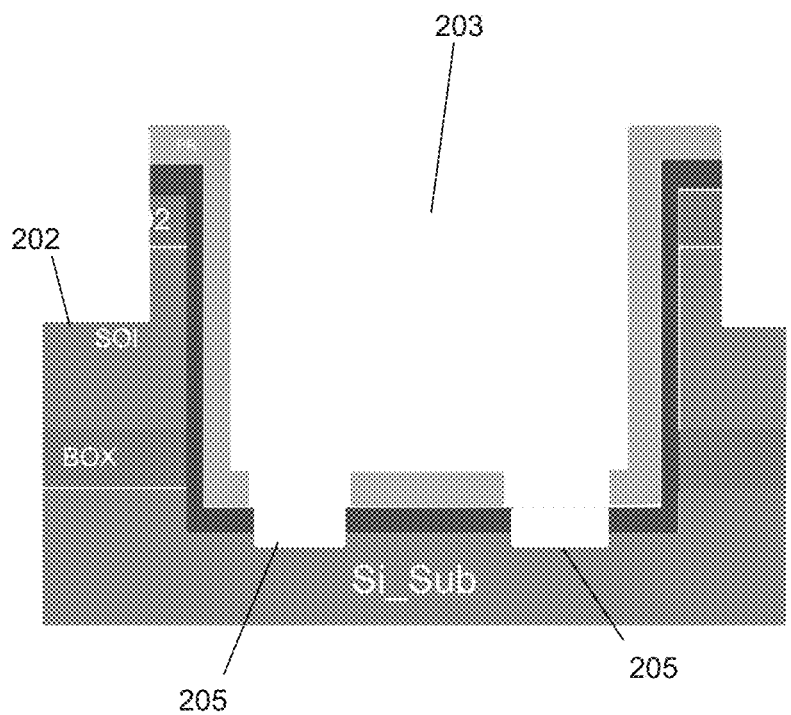
Figure 3:
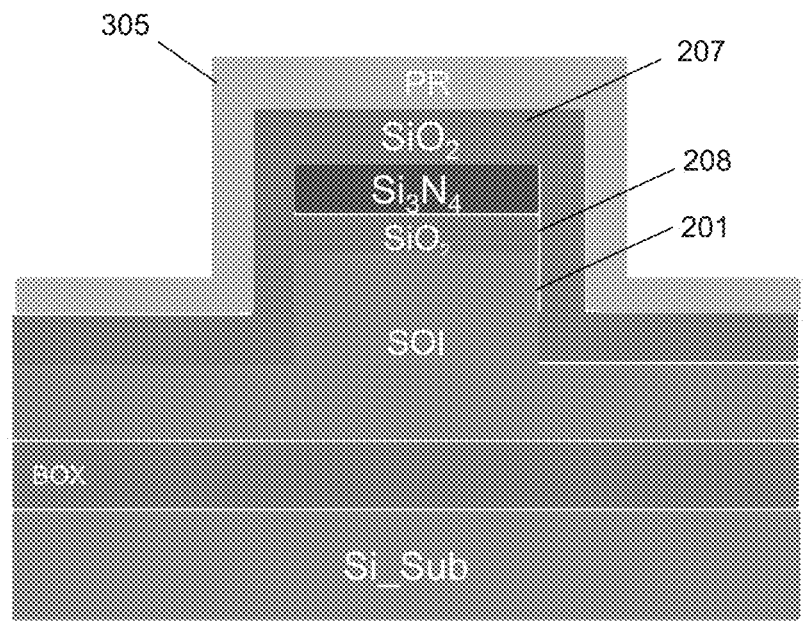
Figure 3:
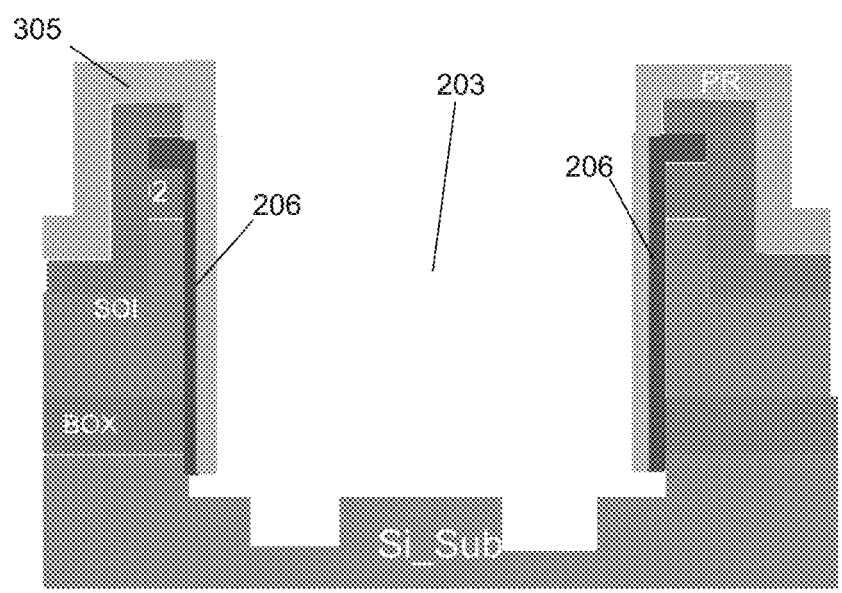

Next, in a step shown in FIG. 3(v)(A) which is a top-down view, a photoresist 305 is provided to define both waveguides 201/204 as well as alignment marks 307. As can be seen in FIG. 3(v)(B), a cross-section along the line A-A', the photoresist resides over only a portion of the ARC layer provided previously, leaving exposed portions either side of the photoresist. The width of the photoresist defines the width of the resulting waveguide. FIG. 3(v)(C) shows a cross-section taken along the line B-B', and indicates that the photoresist extends down the sidewall of the cavity and defines the alignment marks 307 to be etched. This can be a two-step process, where the photoresist is placed and then patterned through photolithography or similar.

After the photoresist 305 is provided and patterned, the exposed portions of the device are etched to define: the waveguides 201 and 204, as well as the alignment marks 205. The result of this etching step is shown in FIGS. 3(iv)(A), a top down view 3(iv)(B) a cross-section taken along A-A', and 3(iv)(C) a cross-section taken along B-B'. This etch also defines the uppermost surface 202 of the remaining device layer. Typically, the uppermost surface 202 is a portion of the device layer and so formed from silicon. However this can be covered with silicon dioxide or silicon nitride. In the cavity 203, the etch extends through the antireflective coating layer located over the bed of the cavity, and partially into the silicon substrate. As has been discussed previously, the depth into the cavity should be sufficient to provide contrast when viewed under an optical microscope, for example between 150 nm and 2000 nm.

Next, in a step shown in FIGS. 3(vii)(A) and 3(vii)(B), corresponding to cross-sections taken along the lines A-A' and B-B' discussed previously, passivation layer 207 is provided over all exposed surfaces of the device. In this example, the passivation layer is formed of silicon dioxide, $SiO_2$.

A further photoresist 305 is provided, as shown in FIGS. 3(viii)(A) and 3(viii)(B) which are again corresponding to cross-sections taken along the lines A-A' and B-B' respectively. The photoresists masks all portions of the device bar the sidewalls of the cavity 203 and the bottom of the cavity. The figures show the device after an etched is performed, using the further photoresist 350 as a mask. The etch removes the passivation layer 207 provided within the cavity.

After the passivation layer 207 within the cavity is removed, yet a further photoresist 305 is provided and the antireflective coating present on the bed of the cavity 203 is removed. This photoresist, and the result of the etch, is shown in FIGS. 3(ix)(A) and 3(ix)(B), again cross-sections taken along the lines A-A' and B-B'. The photoresist is then removed.

Figure 4A:
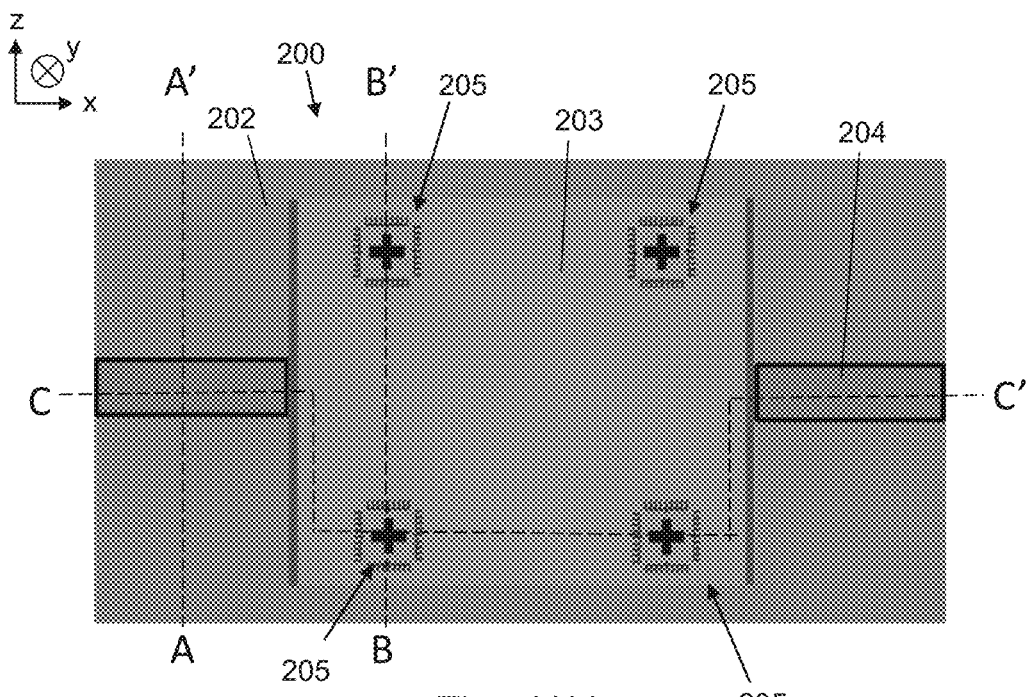
FIGS. 4(A)-4(D) show respective views of an SOI waveguide manufactured using the method of FIGS. 3(i)-3(ix)
Figure 4B:
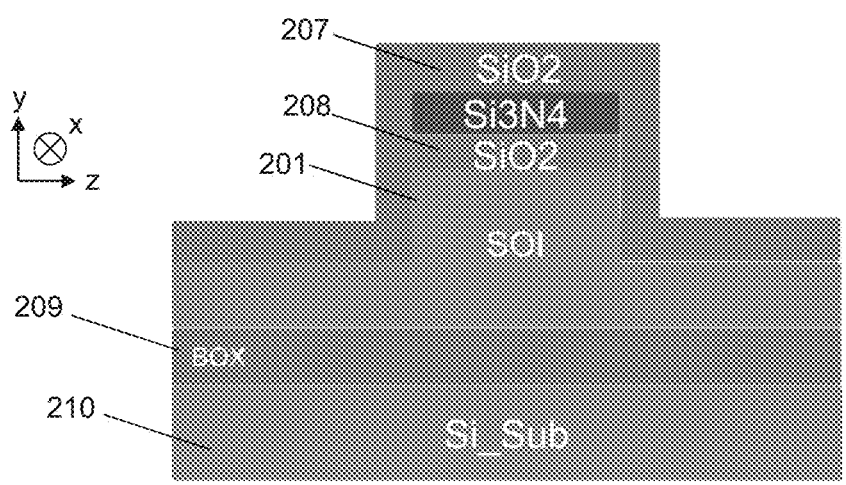
Figure 4C:
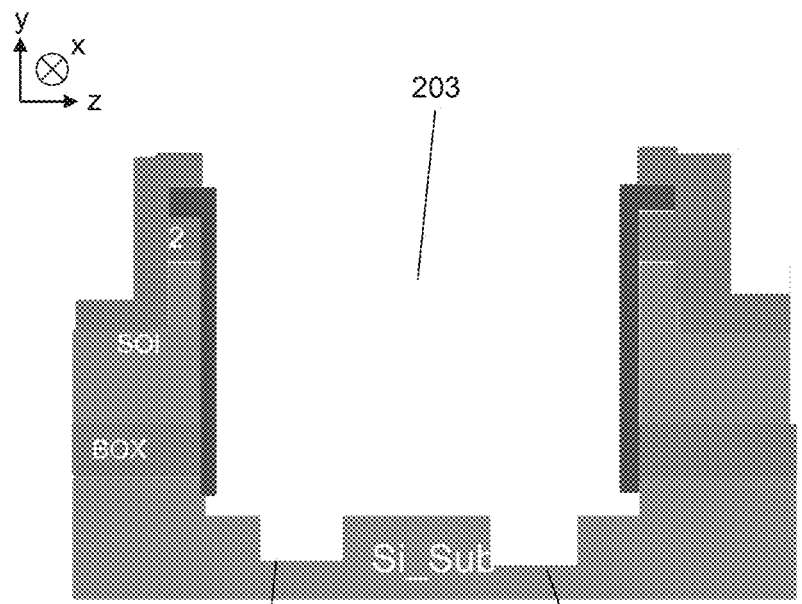
Figure 4D:
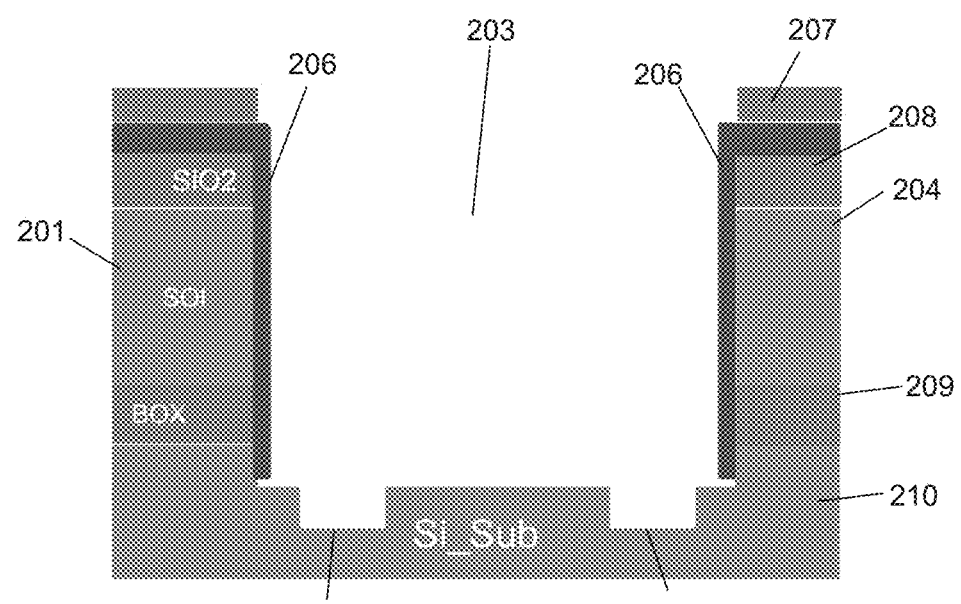

This is the final step in the fabrication process, and results in a precursor photonic device 200 as shown in FIG. 4(A). Where this figure shares features with those previously described, like features are indicated by like reference numerals. FIGS. 4(A) and 4(D) mirror FIGS. 2A and 2B respectively. FIGS. 4(B) and 4(C) are cross-sections of FIG. 4(A) taken along the lines A-A' and B-B' respectively.

Figure 5I:
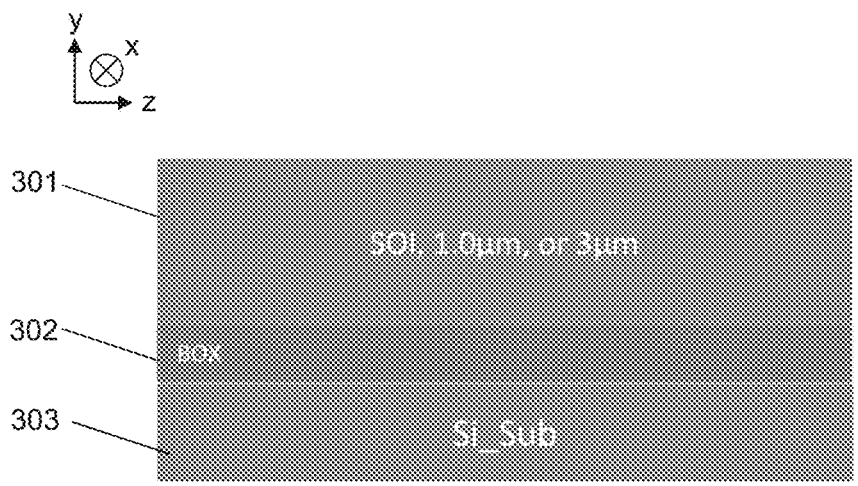
FIGS. 5(i)-5(x) show various manufacturing steps of a variant method to produce an SOI waveguide including alignment marks.
Figure 5:
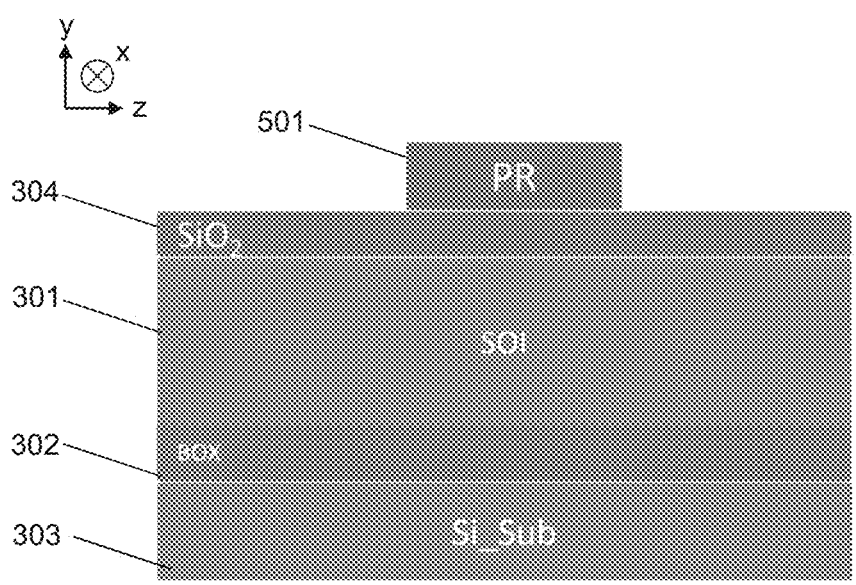
Figure 5:
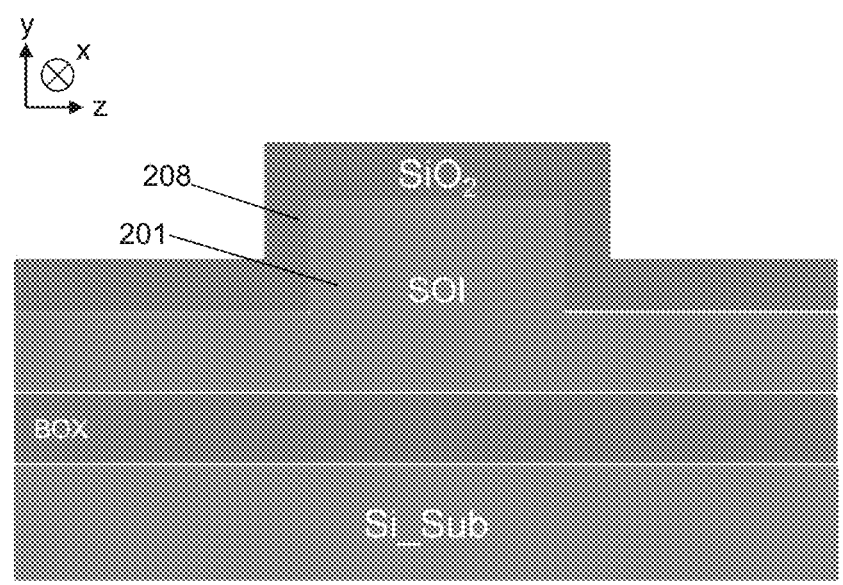
Figure 5V:
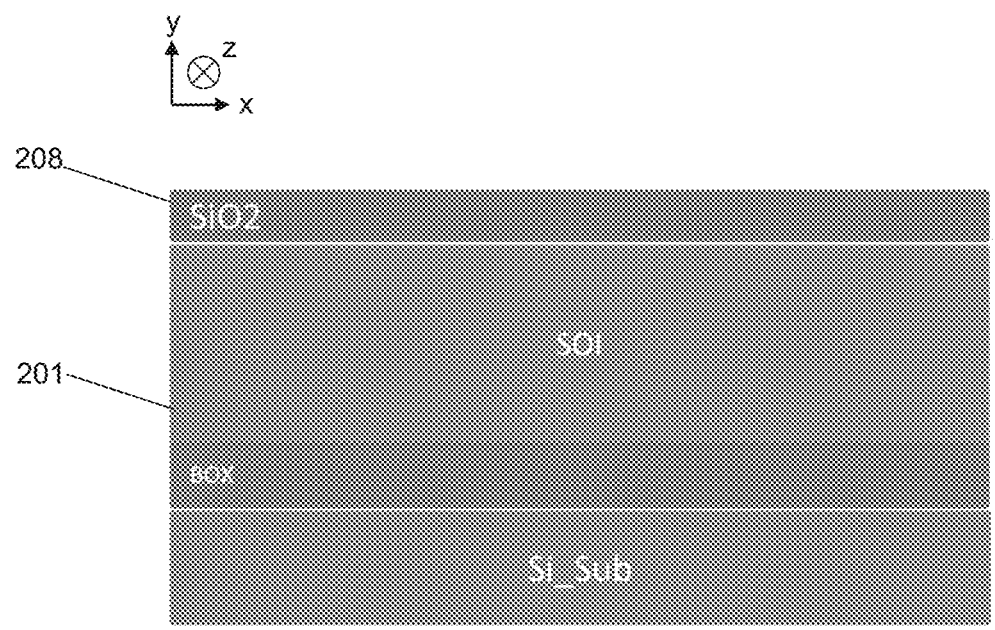
Figure 5:
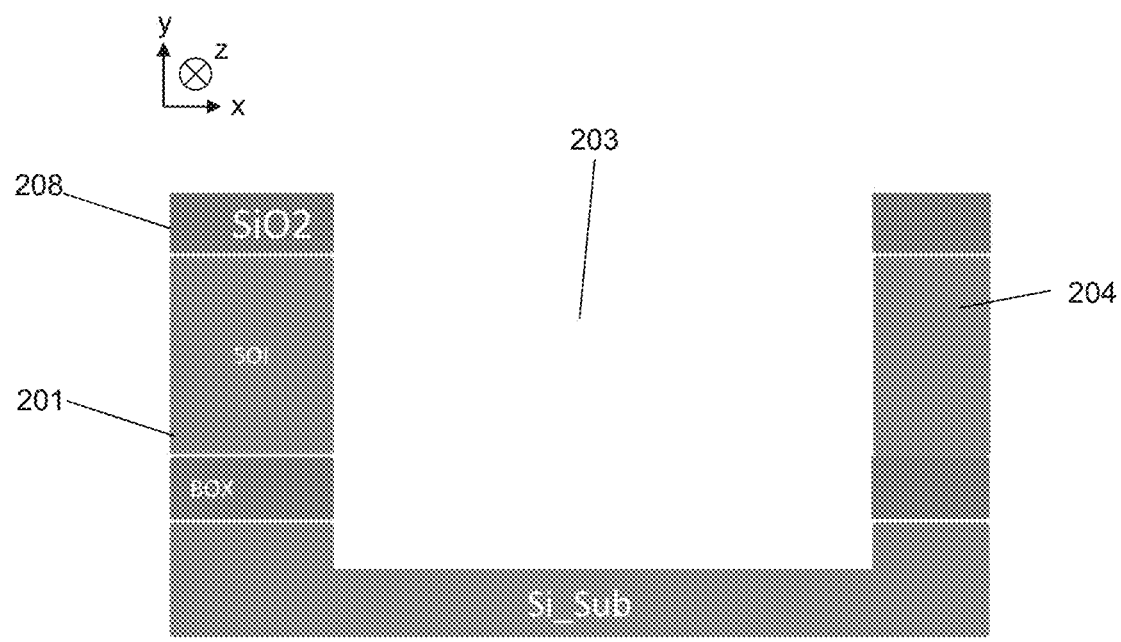
Figure 5:
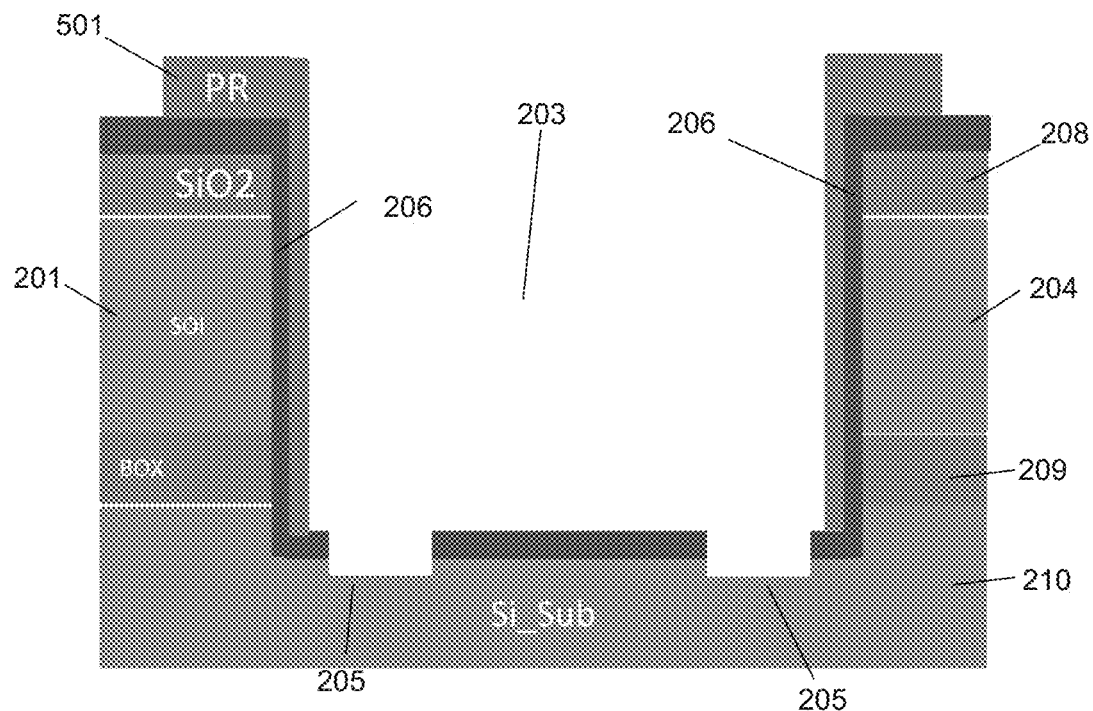
Figure 5X:
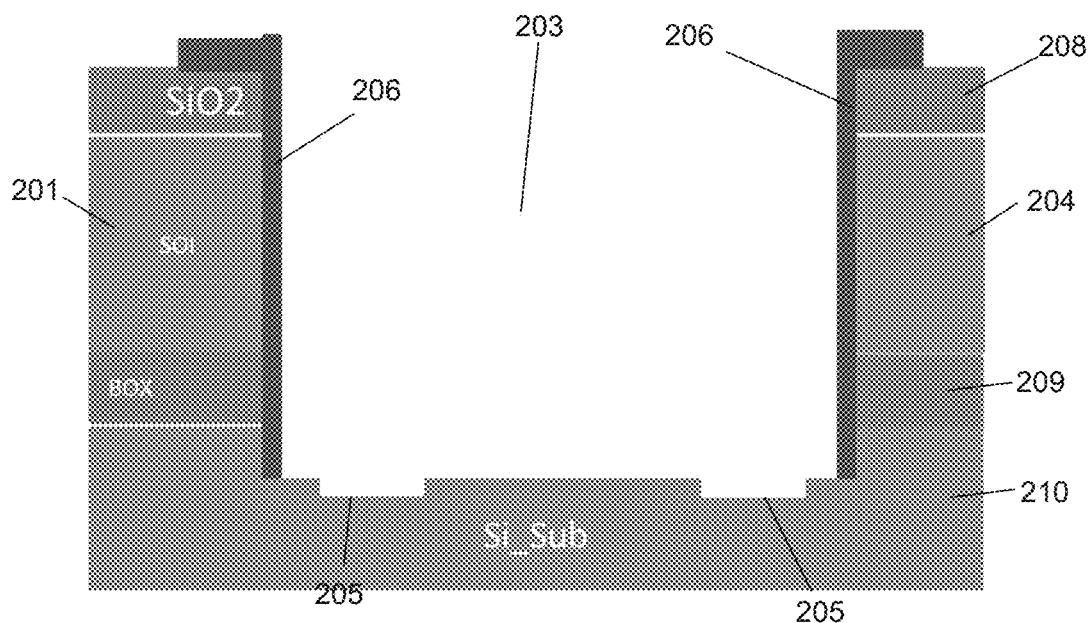

FIGS. 5(i)-5(x) show various manufacturing steps of a variant method to produce an SOI waveguide including alignment marks. As before, in FIG. 5(i) an SOI wafer is provided formed of a device layer 301, buried oxide layer 302, and silicon substrate 303. The device layer is either 1.0

μm tall or 3.0 μm tall (measured from an uppermost surface of the buried oxide layer to an uppermost surface of the device layer).

Next, in a step shown in FIG. 5(*ii*), an upper cladding layer 208 and photoresist 501 is provided over a portion of the waveguide. The photoresist extends across the length of the device, i.e. into/out of the plane of FIG. 5(*ii*). An etch is then performed, using the photoresist 501 as a mask. The result of the etch is shown in FIG. 5(*iii*) where waveguide 201 has been defined, where the upper cladding is provided by upper cladding layer 208 and the lower cladding is provided by buried oxide layer 302.

After the etch, the photoresist 501 is removed and further upper cladding material 208 is provided over all exposed surfaces of the device. The result of this is shown in FIG. 5(*iv*). This can be provided either through thermal oxidation of the silicon device layer, or through deposition (e.g. blanket) of silicon dioxide.

FIG. 5(*v*) shows the same structure as FIG. 5(*iv*), but in a cross-sectional view rotated by 90° as indicated by the coordinate marker. The cross-sectional view is taken through the waveguide formed in the previous etching step, and so light is guided from the left hand side of the figure to the right (or vice versa).

After the upper cladding layer has been provided, a cavity 203 of the type previously mentioned is etched into the device. The result of this is shown in FIG. 5(*vi*). After the cavity 203 has been etched, an antireflective coating 206 is deposited in much the same manner as discussed previously. The structure including the antireflective coating is shown in FIG. 5(*vii*). Alignment marks 205 are then etched in the bed of the cavity 203, in the manner discussed previously (noting however, that the waveguides 201/204 have already been formed). In FIG. 5(*ix*), a further photoresist 501 is provided for removing the antireflective coating present in the bed of the cavity. This is done to improve the bonding cohesion. The result of this removal is shown in FIG. 5(*x*), which is also a final step in the preparation of the precursor photonic device.

Figure 6A:
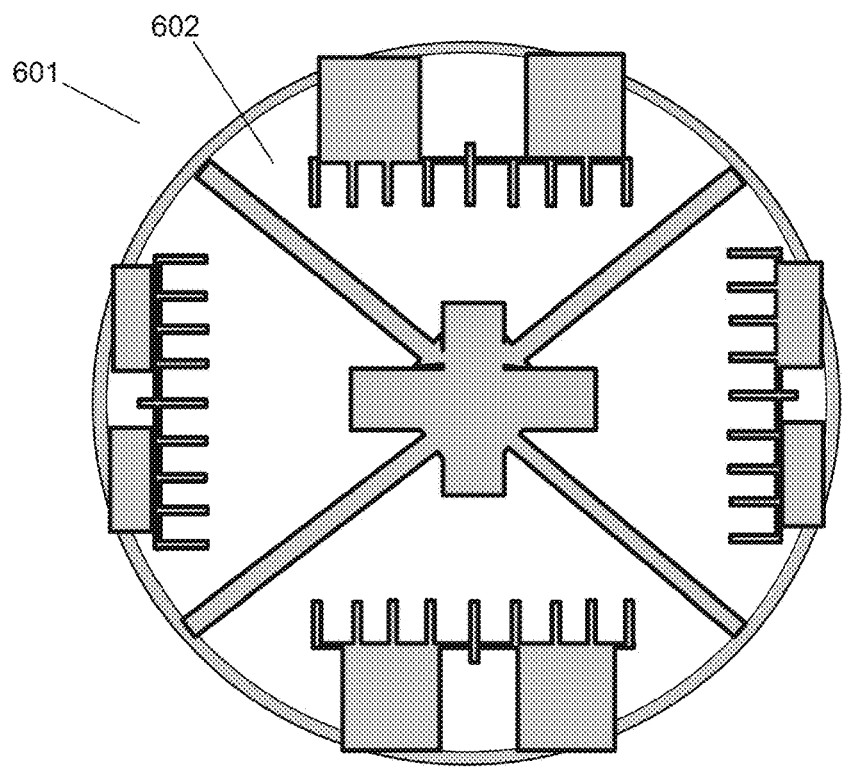
FIG. 6A shows an alignment mark for a transfer die including a III-V based device.

FIG. 6A shows an alignment mark for a III-V transfer die. Region 601, outside of the periphery of the alignment mark is the III-V chip or die on which the alignment mark resides.

The region 602 within the alignment mark is transparent. This can be achieved, for example, by thinning the region until light can be transmitted through it or removing this region entirely.

Figure 6B:
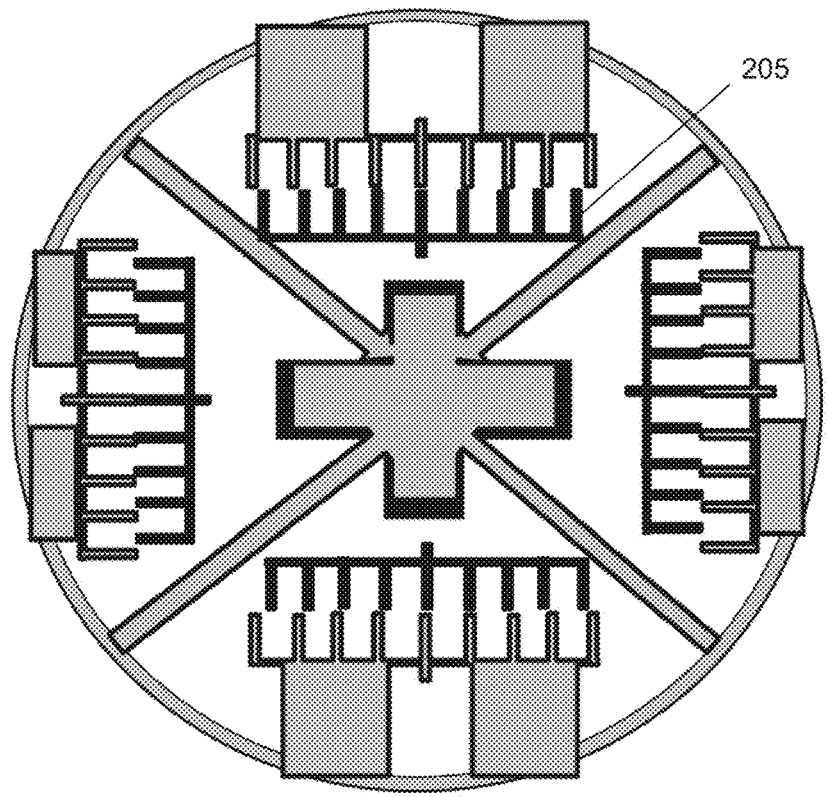
FIG. 6B shows the alignment mark of FIG. 6A, when positioned over a corresponding alignment mark in a precursor photonic device.

FIG. 6B shows the alignment mark of FIG. 6A, when positioned over a corresponding alignment mark in a precursor photonic device. The alignment mark 205 in the precursor photonic device is used in combination with the alignment mark in the III-V transfer die to facilitate alignment in the manner shown.

Figure 7I:
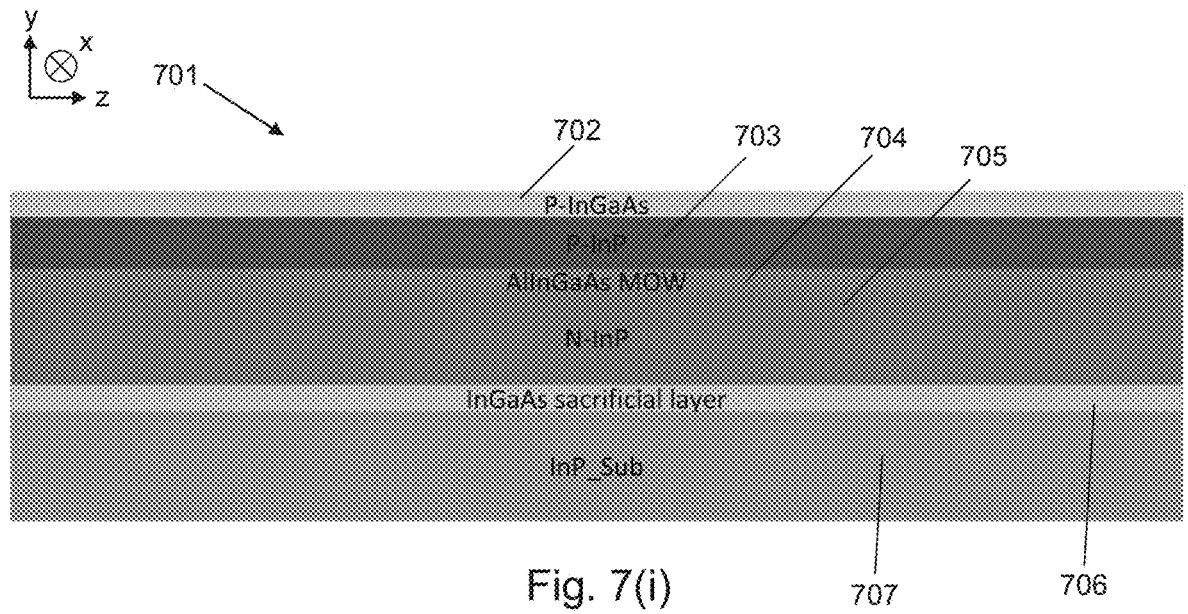
FIGS. 7(i)-7(xii) show various manufacturing steps of a method to produce a transfer die including a III-V based laser.
Figure 7:
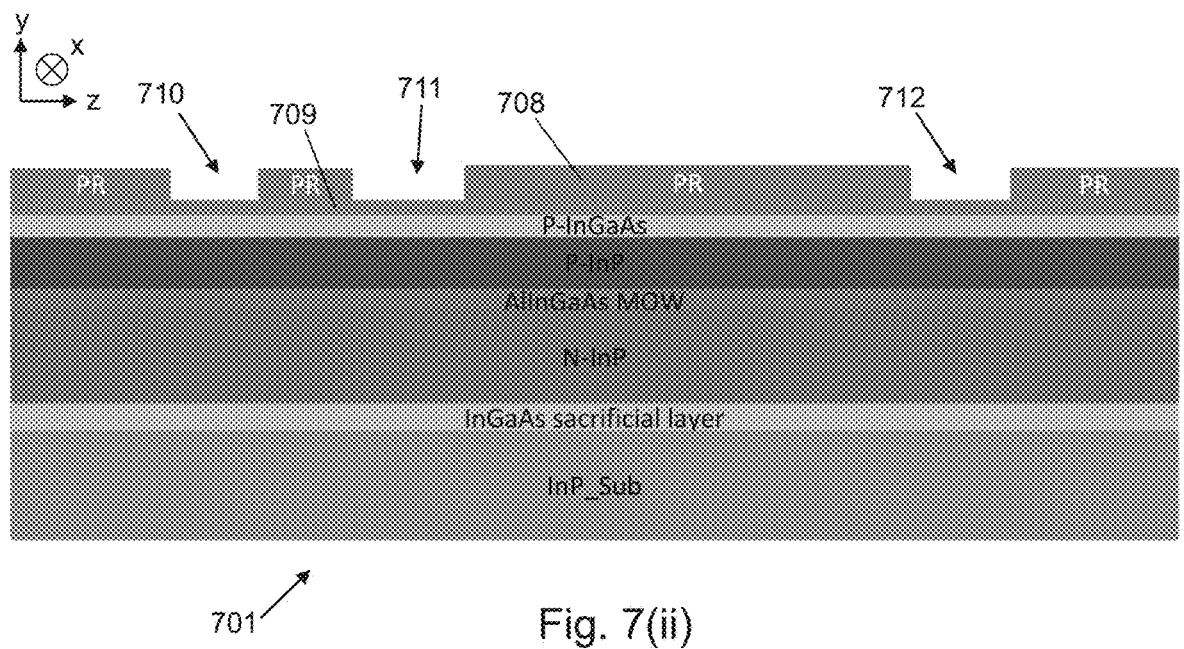
Figure 7:
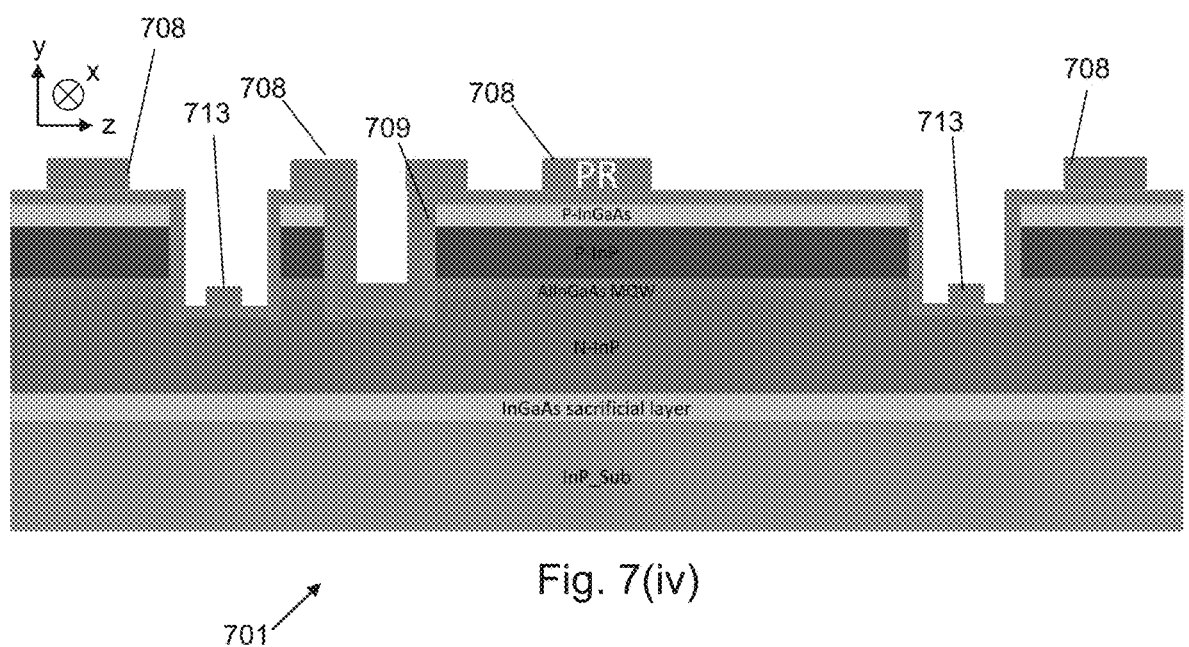
Figure 7V:
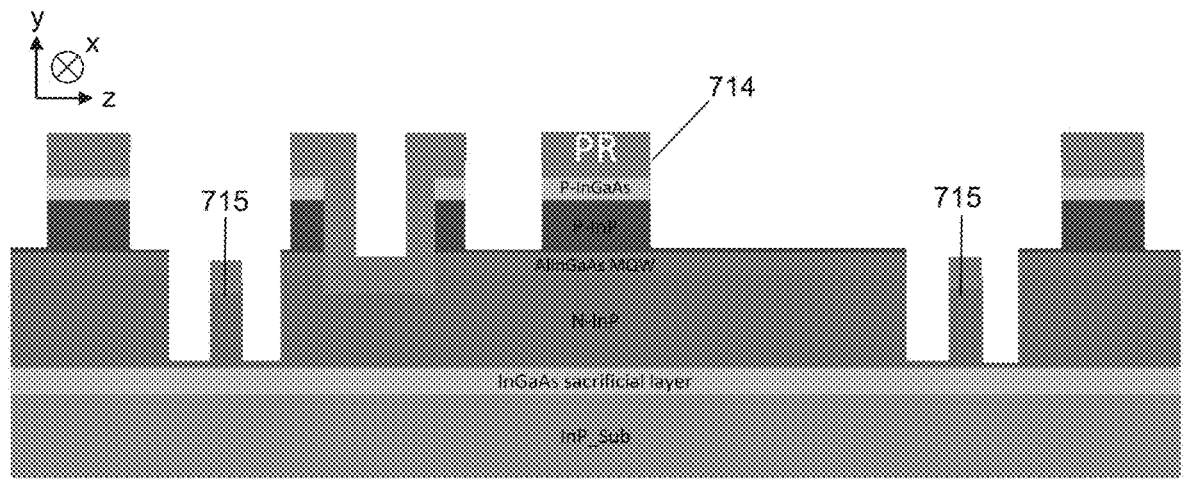
Figure 7:
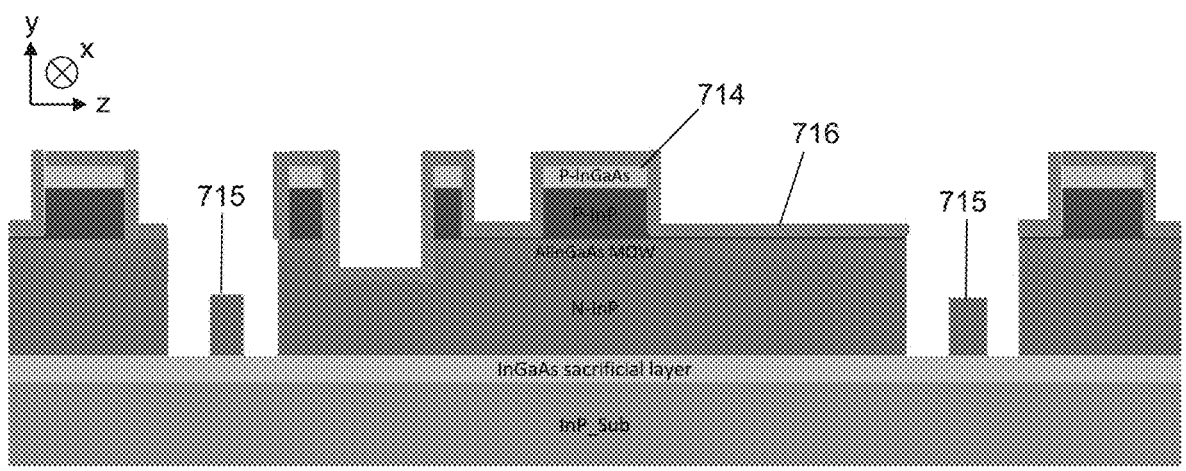
Figure 7:
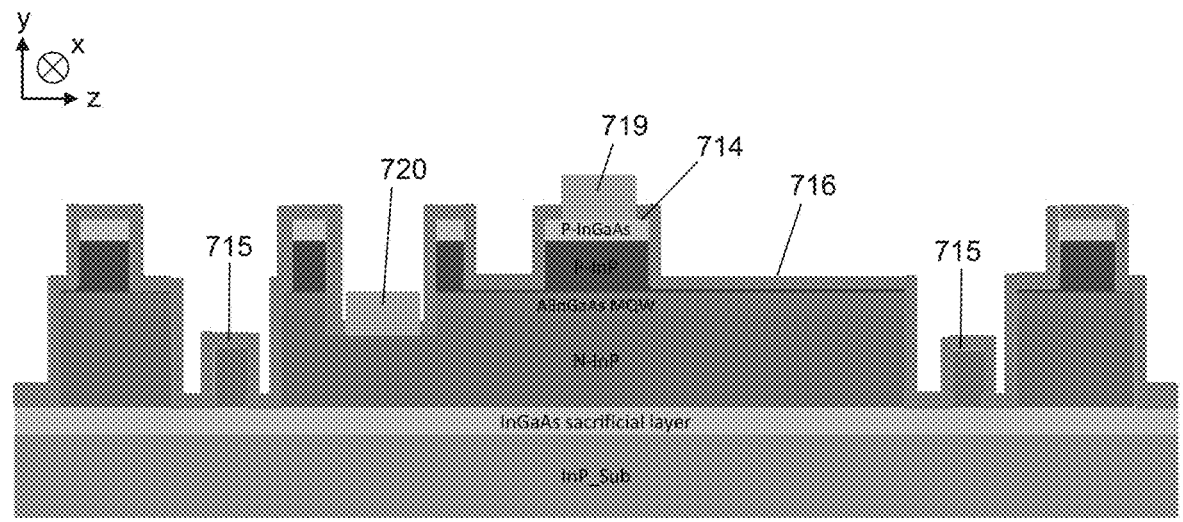
Figure 7X:
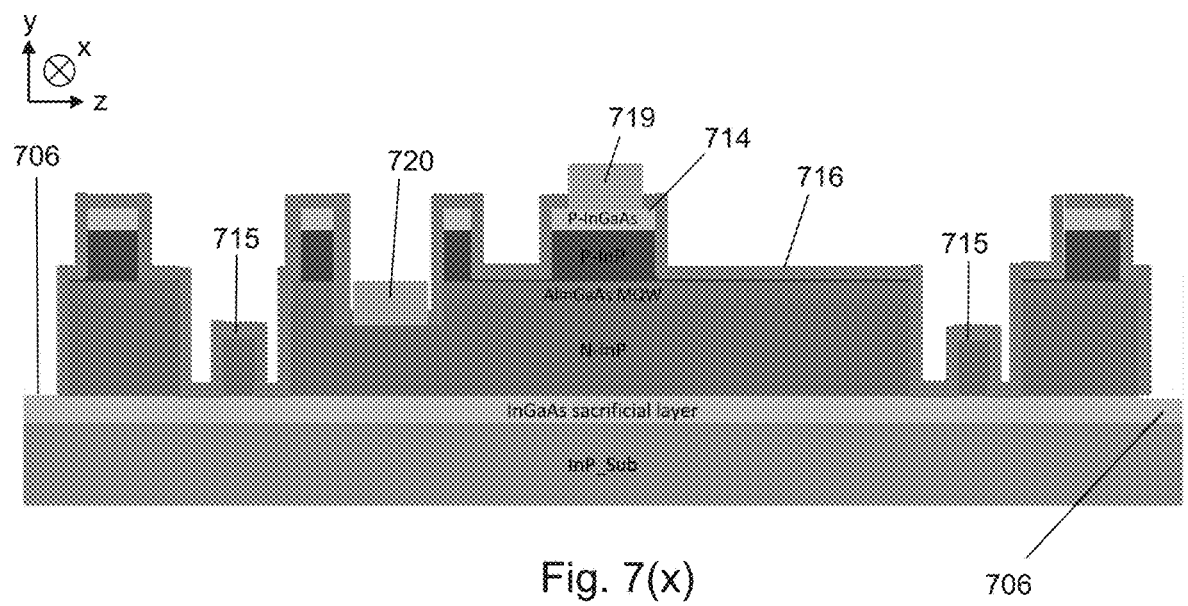
Figure 7:
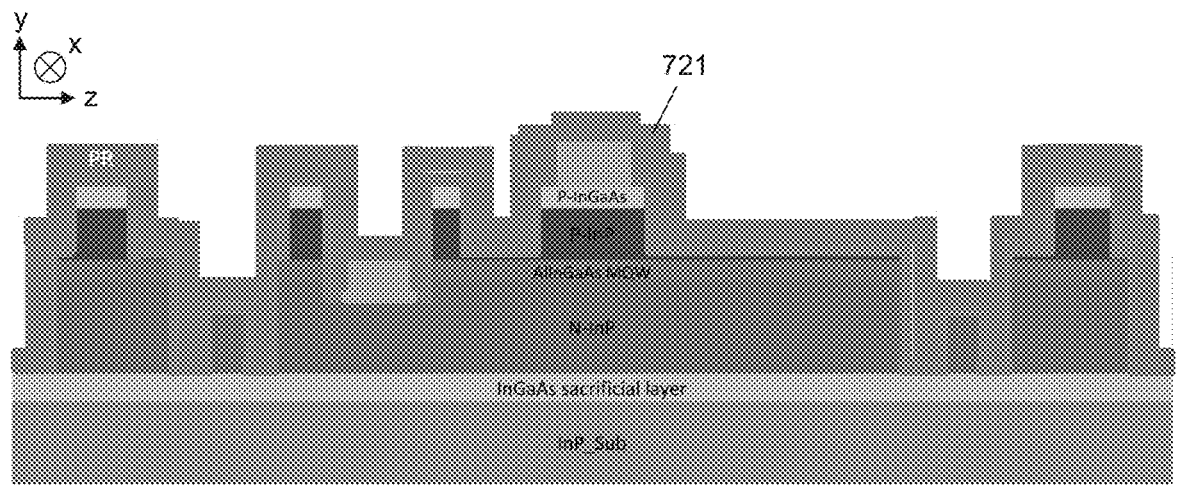

FIGS. 7(*i*)-7(*xii*) show various manufacturing steps of a method to produce a transfer die including a III-V based laser. In a first step, shown in FIG. 7(*i*), a III-V semiconductor stack 701 is provided. The stack comprises, going from an uppermost layer (i.e. distalmost to the substrate) first to a lowermost:

702—P doped indium gallium arsenide (P-InGaAs) layer;
703—P doped indium phosphide (P-InP) layer;
704—Aluminium indium gallium arsenide (AlInGaAs) multiple quantum well layer;
705—N doped indium phosphide (N-InP) layer;
706—Indium gallium arsenide (InGaAs) sacrificial layer; and
707—Indium phosphide substrate.

The stack may include greater or fewer numbers of layers. In a particular example, the stack comprises the following layers:

| Layer | R | n/u/p | Material | Thickness (nm) | Eg (nm) | Doping ($10^{18}$) | Dopant |
|---|---|---|---|---|---|---|---|
| 15 | 1 | p | InGaAs | 400 | 1499.98 | 1 | Zn |
| 14 | 1 | p | InGaAsP | 50 | 1302.91 | 1.5 | Zn |
| 13 | 1 | p | InP | 1340 | 918.407 | 1 | Zn |
| 12 | 1 | p | InGaAsP | 20 | 1302.91 | 1 | Zn |
| 11 | 1 | p | AlInGaAs | 60 | 843.435 | 1 | C |
| 10 | 1 | uid | AlInGaAs | 70 | 968.035 | — | — |
| 9 | 12x | uid | AlInGaAs | 7 | 1127.14 | — | — |
| 8 | 12x | Active | AlInGaAs | 9 | 1278.2 | — | — |
| 7 | 1 | uid | AlInGaAs | 7 | 1127.14 | — | — |
| 6 | 1 | uid | InGaAsP | 77 | 1100 | — | — |
| 5 | 1 | n | InP | 80 | 918.407 | 0.2 | Si |
| 4 | 1 | n | InP | 70 | 918.407 | 0.5 | Si |
| 3 | 1 | n | InP | 920 | 918.407 | 0.8 | Si |
| 2 | 1 | n | InGaAs | 1000 | 1499.98 | 1 | Si |
| 1 | | | Substrate: semi-insulating and n doped InP | | | | |

After the stack 701 is provided, a mask 709 (formed, for example, from SiO$_2$) a photoresist 708 is disposed and patterned so as to define: alignment area 710, n contact area 711, and alignment area 712. That is, these are the regions where these structures will be formed after subsequent processing. The areas of the stack not covered by the photoresist are then etched down to the N-InP layer, as shown in FIG. 7(*iii*).

The mask 709 is reapplied, so as to cover the freshly exposed surfaces, and a further photoresist 708 is then provided, so as to define: a waveguide, and one or more alignment marks 713. This is shown in FIG. 7(*iv*). The waveguide 714 and alignment marks 715 are then etched, as is shown in FIG. 7(*v*). Notably, in this example, the alignment mark etch does not extend all of the way through the N-InP layer. This helps improve the bond quality when the III-V transfer die is bonded to the precursor photonic device. As the waveguide 714 and alignment mark(s) 715 are patterned and etched at the same time, there is no alignment error between the waveguide and alignment marks on the III-V transfer die.

After the etching step shown in FIG. 7(*v*), upper cladding layer 716 is provided over the exposed upper surfaces of the device. The portion(s) of the upper cladding layer overlapping with the alignment marks are then removed e.g. through a wet etch. This is shown in FIG. 7(*vi*).

Next, further silicon dioxide (providing further upper cladding layer) is deposited as well as any stress compensation layers required (not shown, for clarity). Notably, in this example, the cladding layer 716 does not extend further towards the substrate than the N-InP. This can improve the bonding cohesion. After this, vias are opened for the p and n contacts. The results of these steps are shown in FIG. 7(*vii*). In this example, a via 718 is opened for the p contact the P-InGaAs layer on an upper surface of the waveguide 714. A separate via 717 is opened for the n contact which extends into the N-InP layer. Of course, if the layers were swapped with respect to their dopants, the n and p contacts would be swapped as well.

After the vias are opened, a metallization process is performed to provide electrodes 719 and 720 which contact the p and n doped regions of the stack respectively. The result of this is shown in FIG. 7(*viii*).

Next, a hard mask is deposited over the upper surface, and patterned to allow the etching of facets of the device. This provides relatively clean interfaces or facets at the extremities of the stack, which reduces optical losses when bonded to the precursor photonic device. The results of these steps are shown in FIG. 7(*ix*).

To prepare the device for micro-transfer printing, the hard mask (formed in this example of SiO$_2$) which remains outside of the chip (left and right hand edges) are removed. This is shown in FIG. 7(*x*). This exposes the upper surface of the InGaAs sacrificial layer 706 around a perimeter of the stack. A lifting or micro-transfer print photoresist 721 is then applied to the upper surface of the stack, to prepare the stack to be lifted off of the substrate.

The stamp, used in the micro-transfer printing process, may be formed of Polydimethylsiloxane (PDMS) A final step in the preparation of the III-V transfer die is to etch away the sacrificial layer, leaving the transfer die connected to the InP substrate by tethers 722. The die is then ready for micro-transfer printing.

Figure 8:
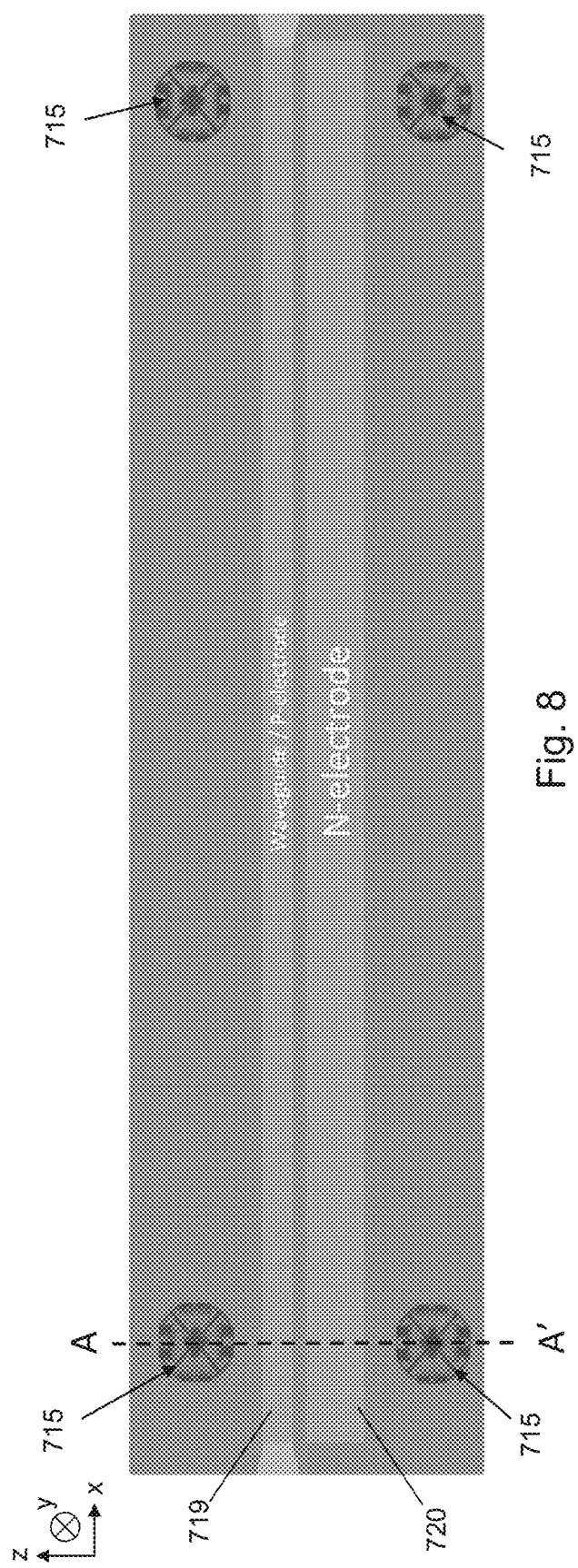
FIG. 8 shows a top-down view of a transfer die including a III-V based laser fabricated according to the method of FIGS. 7(i)-7(xii)

FIG. 8 shows a top-down view of a transfer die including a III-V based laser fabricated according to the method of FIGS. 7(*i*)-7(*xii*). Notably, the alignment features 715 formed previously are visible when looking down through the device. The area surrounding the alignment features is transparent to allow optical alignment with corresponding features on the precursor photonic device. FIG. 8 also shows the A-A' line which all of FIGS. 7(*i*)-7(*xiii*) are cross-sections along.

Figure 9I:
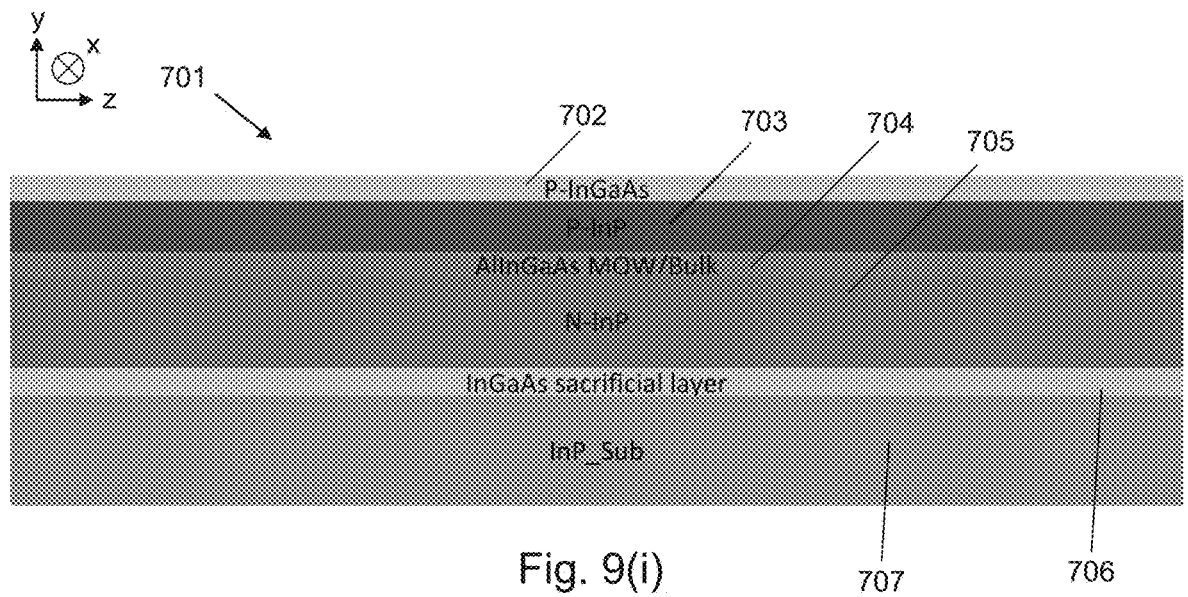
FIGS. 9(i)-9(xiii) show various manufacturing steps of a variant method to produce a transfer die including a III-V based laser.
Figure 9:
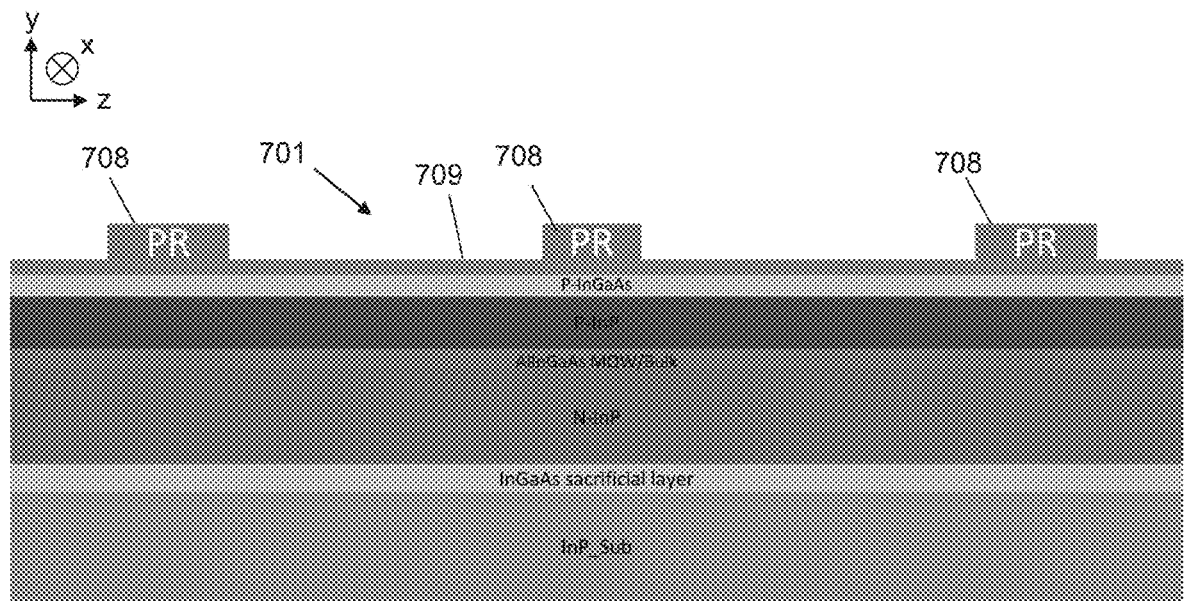
Figure 9:
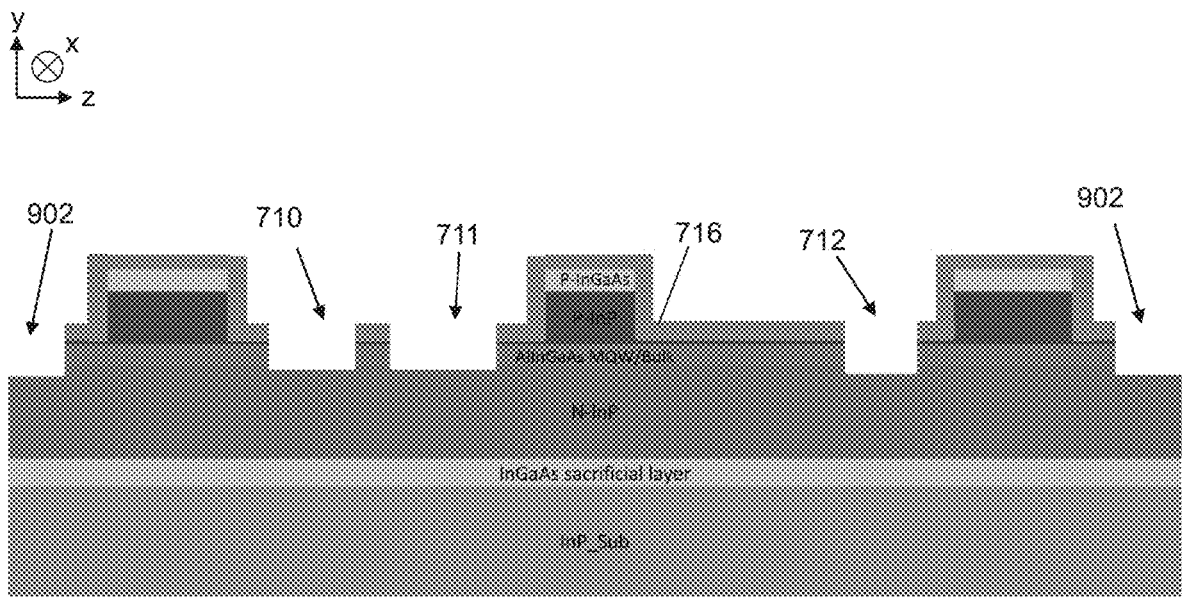
Figure 9V:
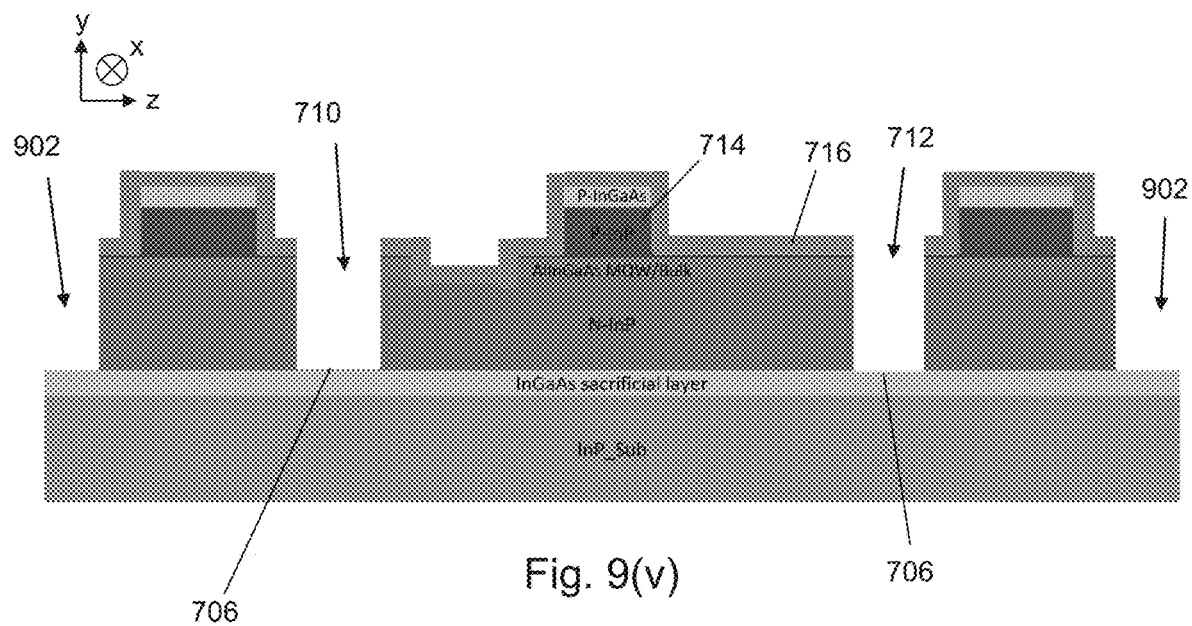
Figure 9:
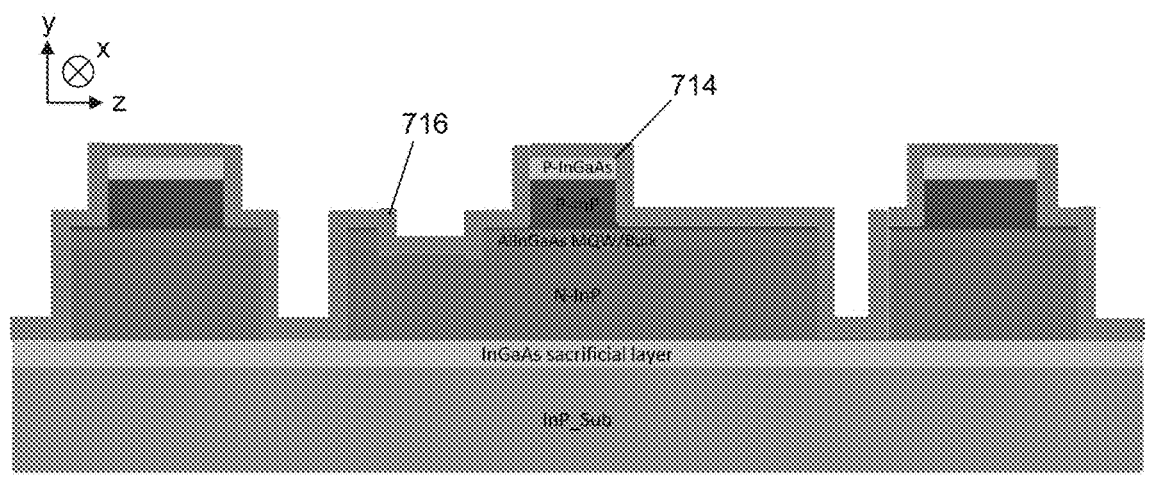
Figure 9:
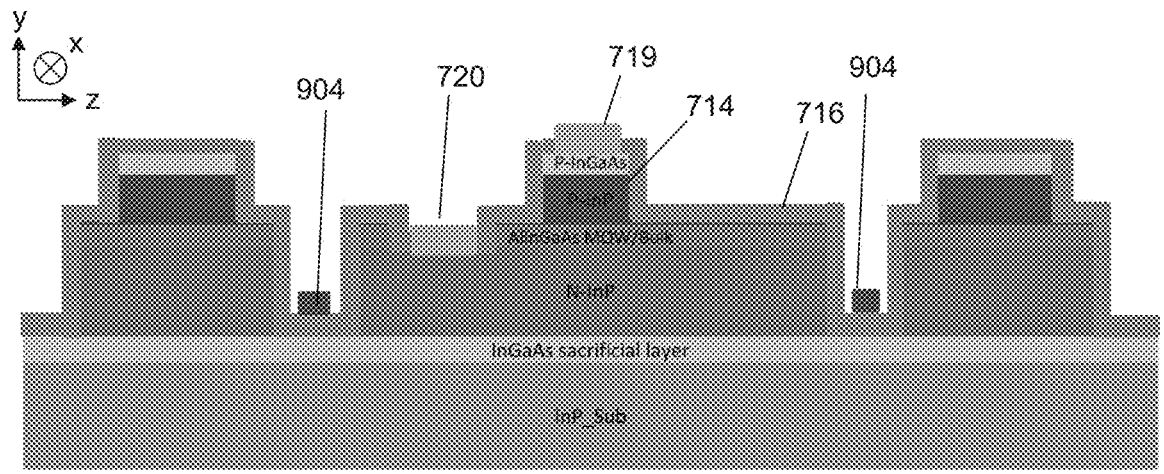
Figure 9X:
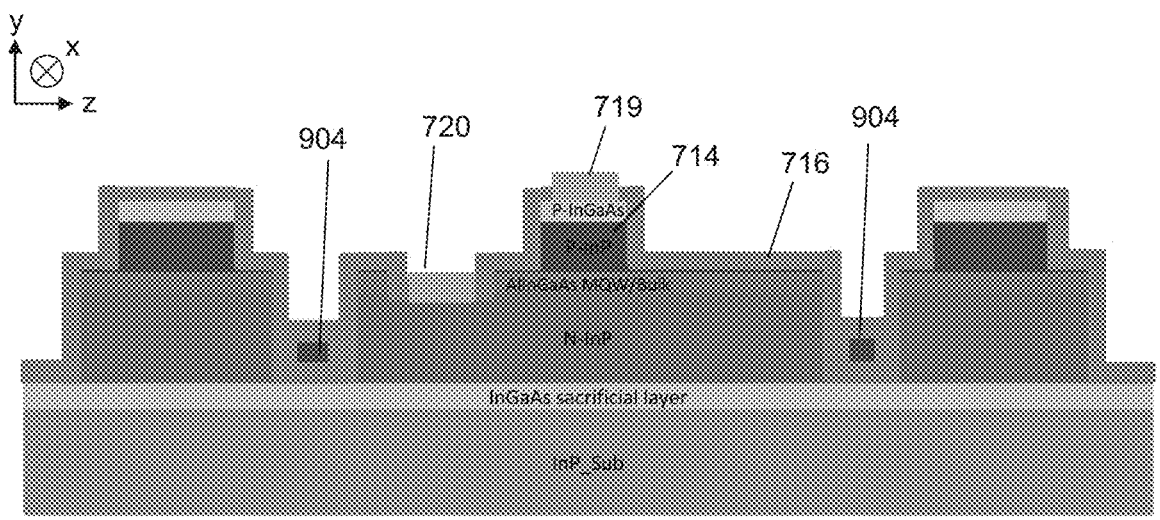
Figure 9:
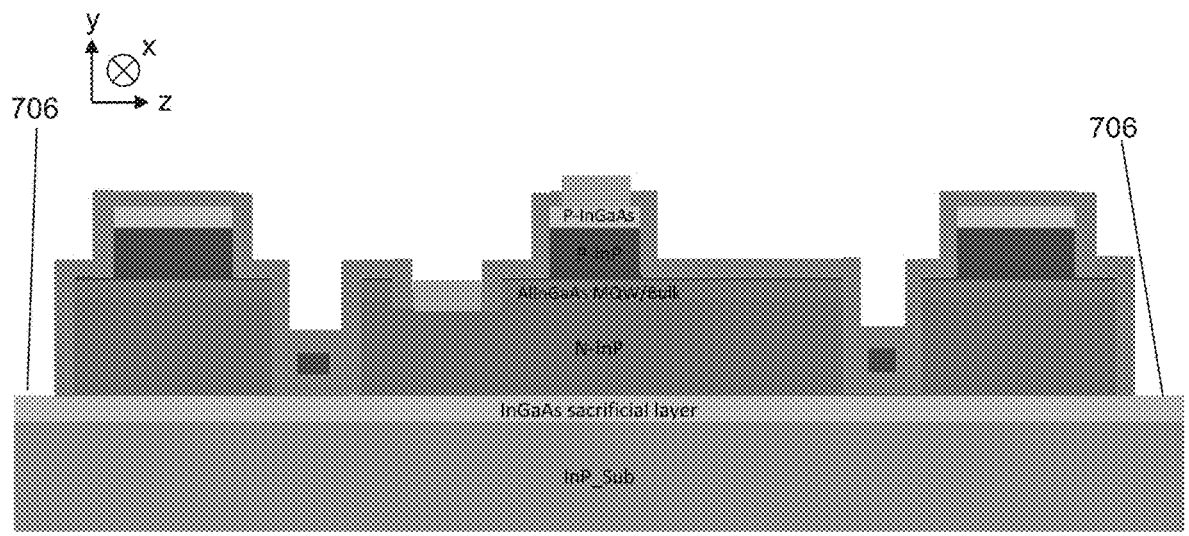

FIGS. 9(*i*)-9(*xiii*) show various manufacturing steps of a variant method to produce a transfer die including a III-V based laser.

As before, a III-V semiconductor based stack 701 is provided in a step shown in FIG. 9(*i*). A hard mask 708 is provided over the uppermost surface. Subsequently, photoresist 708 is then provided, to define the chip or die width (left and right hand side portions of photoresist 708) as well as to define the waveguide. This is shown in FIG. 9(*ii*).

After the photoresist and hard mask are provided, the portions of the stack not covered by the photoresist are etched down to at least the P-InP layer. In the example shown in FIG. 9(*iii*), the etch is performed so that only a relatively thin layer of P-InP remains. After this etch, upper cladding layer 716 (formed of silicon dioxide) is deposited, patterned, and etched so as to provide n contact area 711 and alignment areas 710 and 712. Chip boundary areas 902 are defined around the stack. The result of this is shown in FIG. 9(*iv*).

Next, further upper cladding layer is deposited, patterned, and etched so as to expose the sacrificial layer in the alignment area(s) 710 and chip boundary 902. A wet etch is used here, in some embodiments. The results of these steps are shown in FIG. 9(*v*). The etch may extend down to an upper surface of the sacrificial layer. In some examples, a thin portion of the N-InP layer may be retained. After the etch is performed, further upper cladding 716 is provided over all exposed surfaces. The upper cladding layer has a thickness of around 500 nm. Stress compensation layers may also be provided at this stage if required. The device with upper cladding layer provided is shown in FIG. 9(*vi*).

As before, after the upper cladding layer is provided vias 717 and 718 are opened in it for the electrodes. A first via 717 is provided which exposes an upper surface of the N-InP layer, and a second via 718 is provided which exposes an upper surface of the P-InGaAs layer. This is shown in FIG. 9(*vii*). After the vias are provided, a metallization process is performed which provides electrodes 719 and 720 as discussed previously.

After the electrodes are formed, alignment mark(s) 904 are deposited within the alignment regions formed previously. In this example, instead of alignment marks being formed by etching the N-InP layer, they are formed by deposition of a metal such as titanium nitride which is then dry etched to provide the features of the alignment marks (e.g. coarse and fine alignment marks). The result of this is shown in FIG. 9(*ix*).

Next, a hard mark is deposited, patterned, and facets are etched. The facets are then coated with silicon dioxide, as are the alignment marks 904 formed previously. The results of these steps are shown in FIG. 9(*x*). After this, the silicon dioxide located outside of the chip boundaries (i.e. around a periphery of the III-V transfer die) is removed to expose an upper surface of the InGaAs sacrificial layer 706. As before, a lifting or print photoresist 906 is then provided over the exposed surfaces of the III-V transfer die. FIG. 9(*xii*) shows the transfer die with the photoresist applied.

In a final step, the sacrificial InGaAs layer is etched away, leaving the III-V transfer die suspended by tethers 722 and ready for micro-transfer printing.

Figure 10:
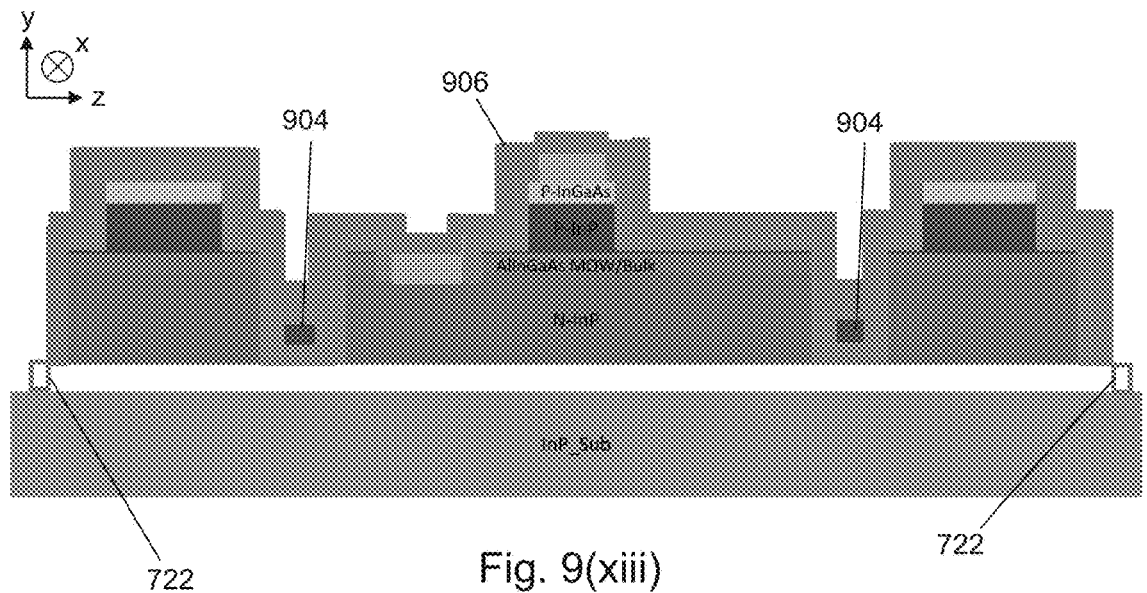
FIG. 10 shows a top-down view of a transfer die including a laser produced using the method of FIGS. 9(i)-9(xiii)
Figure 10:
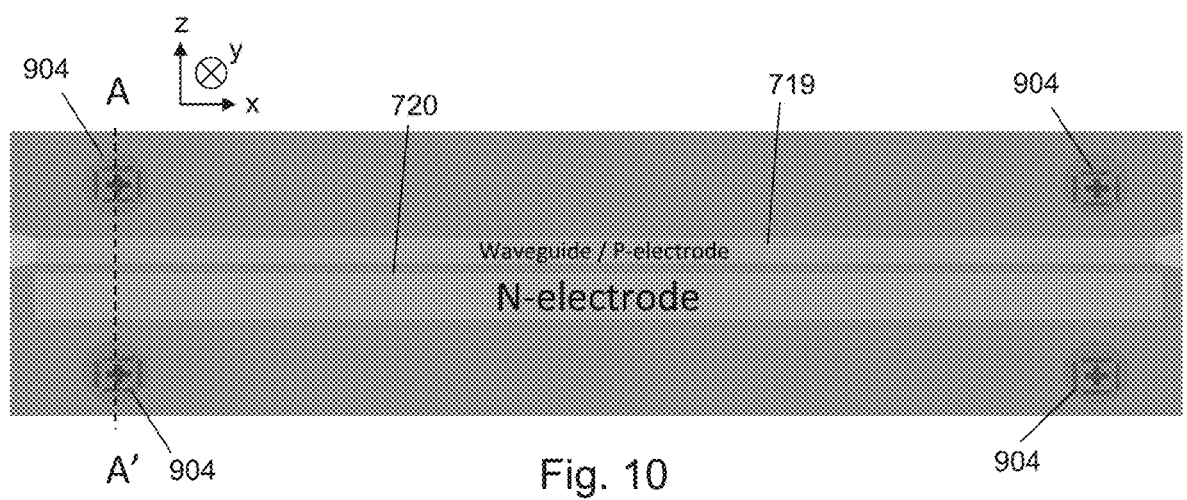

FIG. 10 shows a top-down view of a transfer die including a laser produced using the method of FIGS. 9(*i*)-9(*xiii*). Of note are alignment mark(s) 904 in the four corners of the III-V transfer die. FIG. 10 also shows the A-A' line which all of FIGS. 9(*i*)-9(*xiii*) are cross-sections along.

Figure 11I:
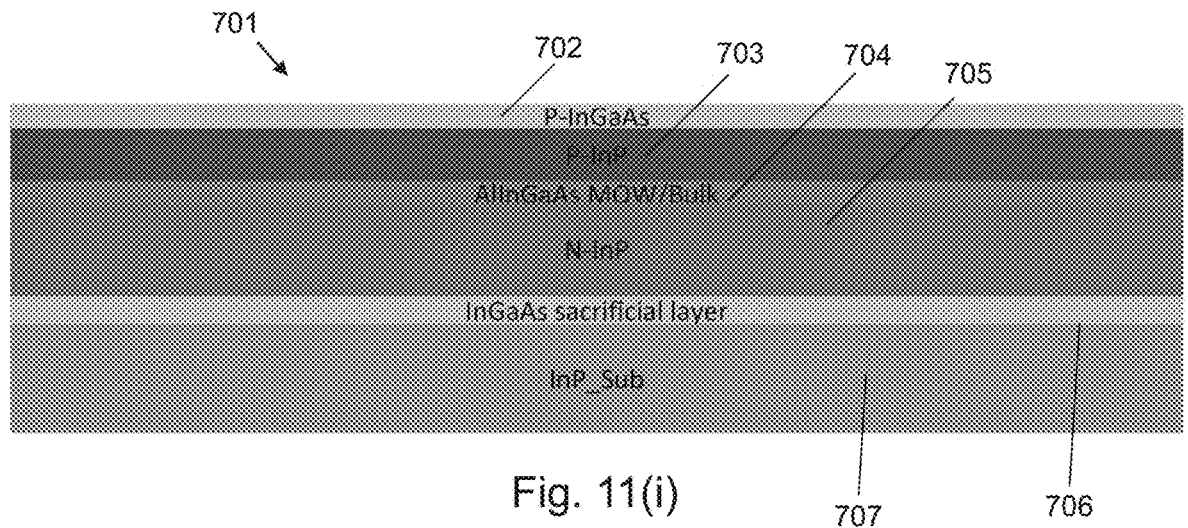
FIGS. 11(i)-11(xiv) show various manufacturing steps of a method to produce a transfer die including a III-V based electro-absorption modulator, EAM.
Figure 11:
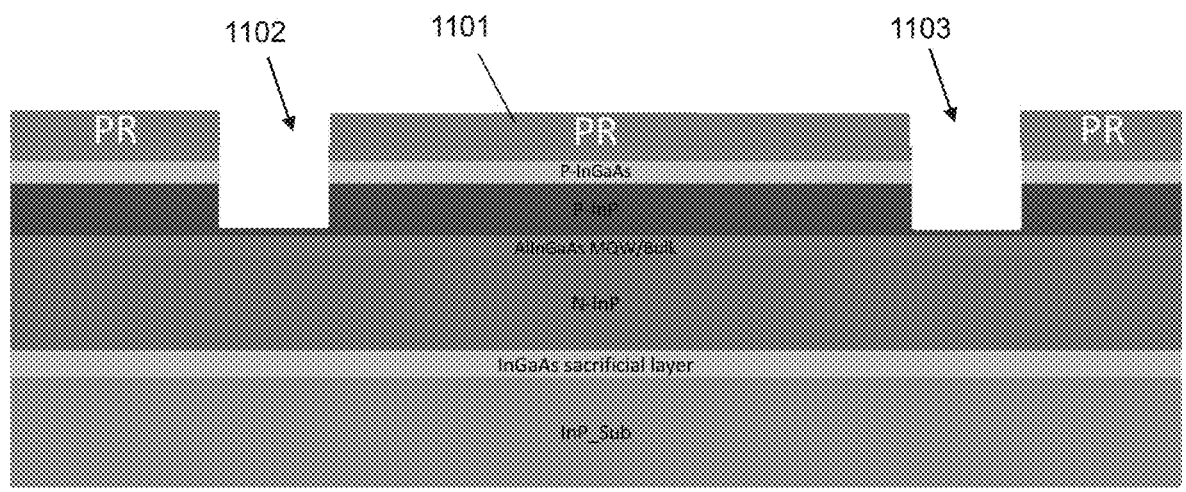
Figure 11:
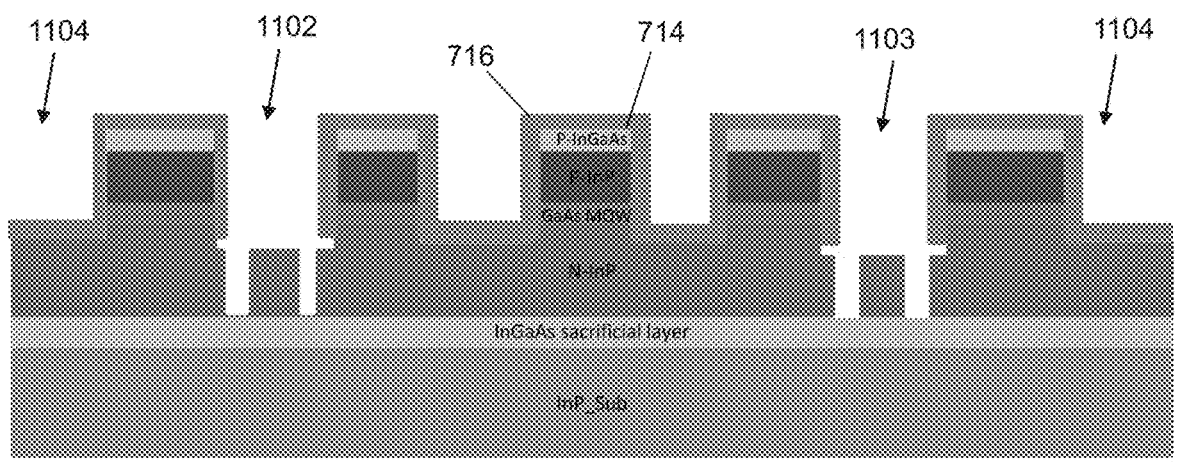
Figure 11V:
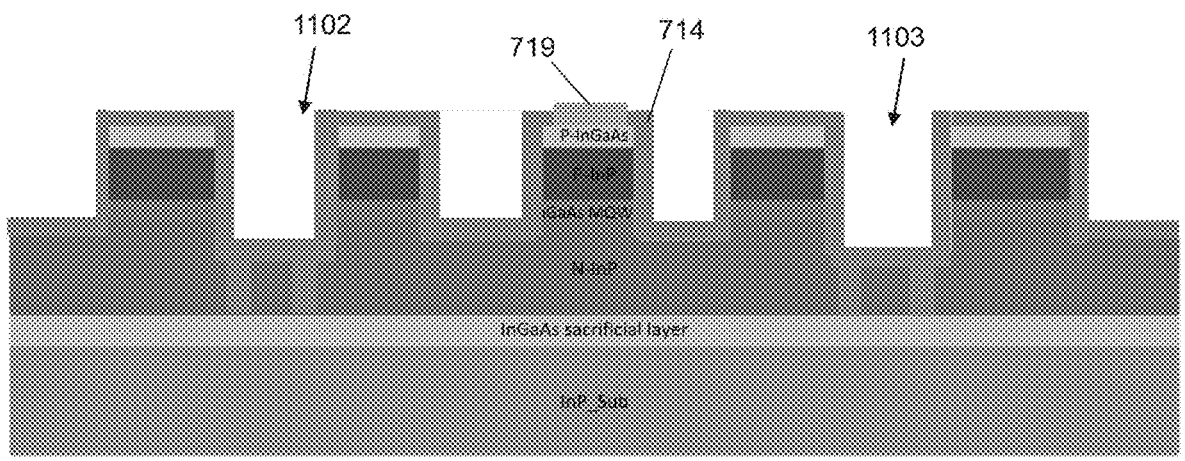
Figure 11:
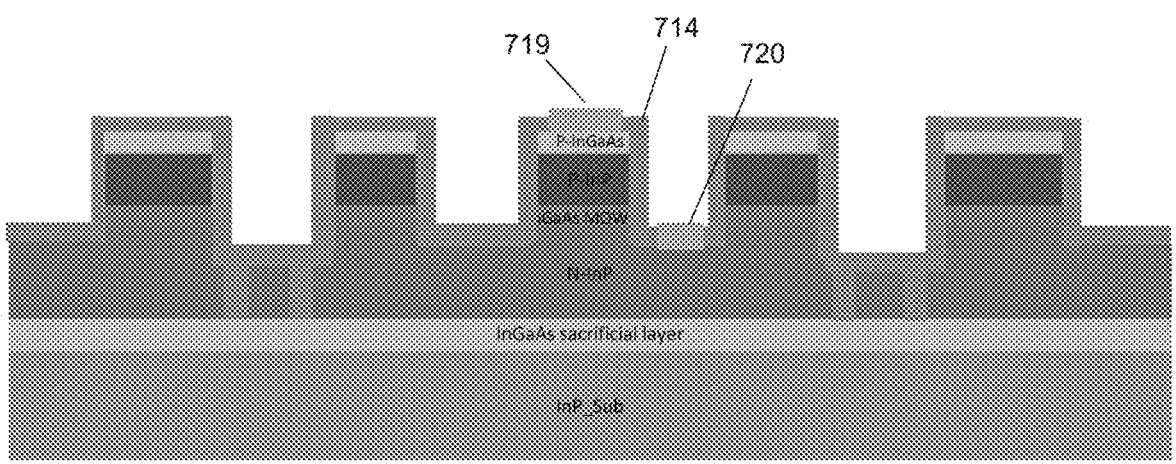
Figure 11:
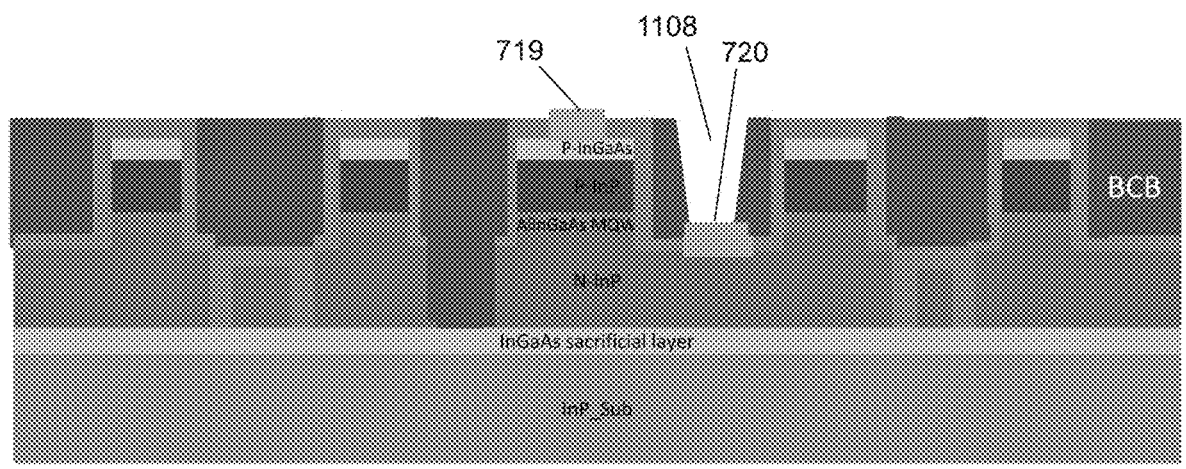

FIGS. 11(*i*)-11(*xiv*) show various manufacturing steps of a method to produce a transfer die including a III-V based electro-absorption modulator, EAM. In a first step, shown in FIG. 11(*i*) a III-V semiconductor based stack 701 is provided, as before. Next, a photoresist 1101 is provided and the exposed regions etched to provide alignment area 1102 and 1103, as shown in FIG. 11(*ii*)

FIG. 11(*iii*) shows the results of the next steps, where a hard mask is provided, patterned and etched to define the waveguide 714 as well as chip boundary areas 1104 and to provide trenches within the alignment areas 1102 and 1103. Again, as the waveguide and alignment features are patterned and etched at the same time, there are no alignment errors therebetween.

Next, upper cladding layer 716, which may be formed of silica or silicon dioxide, is provided and then patterned and etched in the alignment areas 1102 1103 down through the N-InP layer as shown in FIG. 11(*iv*). This is performed via a wet etch. The etch may extend through to an upper surface of the InGaAs sacrificial layer, but, in some embodiments, retains a few nanometers of the N-InP layer to enhance bonding adhesion.

FIG. 11(*v*) shows the device after further silicon dioxide has been provided, and the p-contact 719 is formed to contact the top of the waveguide 714. Again, stress compensations layers can be provided at this time if required. After the p-contact 719 is provided, n-contact 720 is also provided electrically connecting to the N-InP layer adjacent to the waveguide 714, as shown in FIG. 11(*vi*).

Isolation area 1105 is then etched in a portion of the device adjacent to the waveguide 714. This is performed through a dry etch, and then a wet etch of the InP layer using the InGaAs sacrificial layer as a wet etch stop. This is shown in FIG. 11(*vii*).

Silicon nitride 1106 is then deposited over all exposed surfaces, and a Benzocyclobutene (BCB) fill 1107 deposited as shown in FIG. 11(*viii*). The BCB fill is then etched so that upper portions of the silicon nitride 1106 layer are exposed. Next, as shown in FIG. 11(*ix*), the upper surface (asides from the p electrode 719) is planarized. A via 1108 is opened to allow electrical connection to the n electrode 720.

Figure 11X:
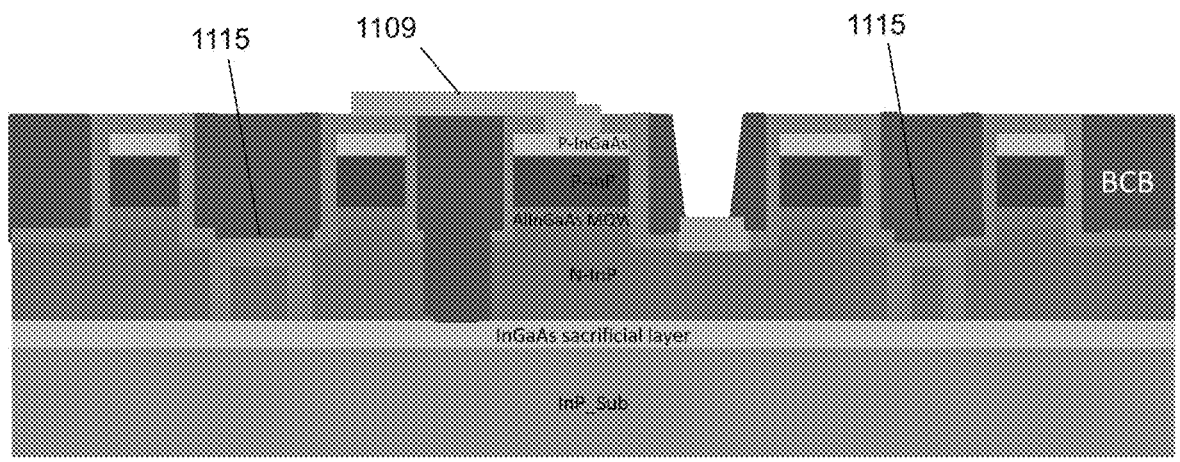
Figure 11:
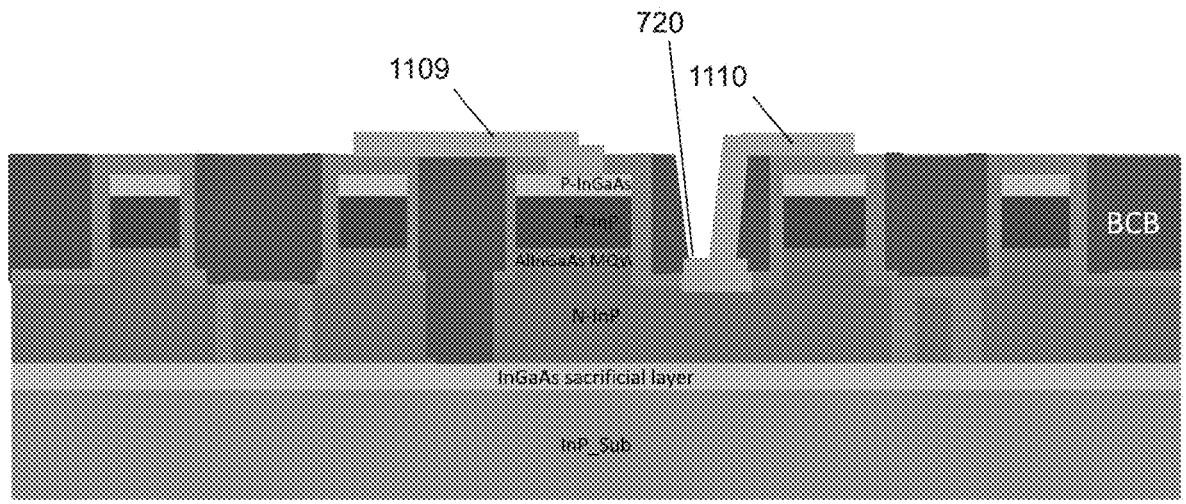

Next, in a step shown in FIG. 11(x), the p-electrode trace 1109 is provided over the upper surface of the device. At the same time, alignment marks 1115 are etched. After this, the n-electrode trace 1110 is provided, electrically contacting the n electrode 720 and extending through via 1108.

A hard mask 1111 is then deposited, patterned, and facets etched. The traces 1109 and 1110 are left exposed. The chip boundary is also etched, as shown in FIG. 11(xii). After this, lifting or print photoresist 1112 is provided over the exposed surfaces of the III-V transfer die, as shown in FIG. 11(xiii). Finally, the sacrificial layer is etched away, such that the transfer die is suspended by tethers 722 as shown in FIG. 11(xiv). The transfer die is then ready for micro-transfer printing.

Figure 12:
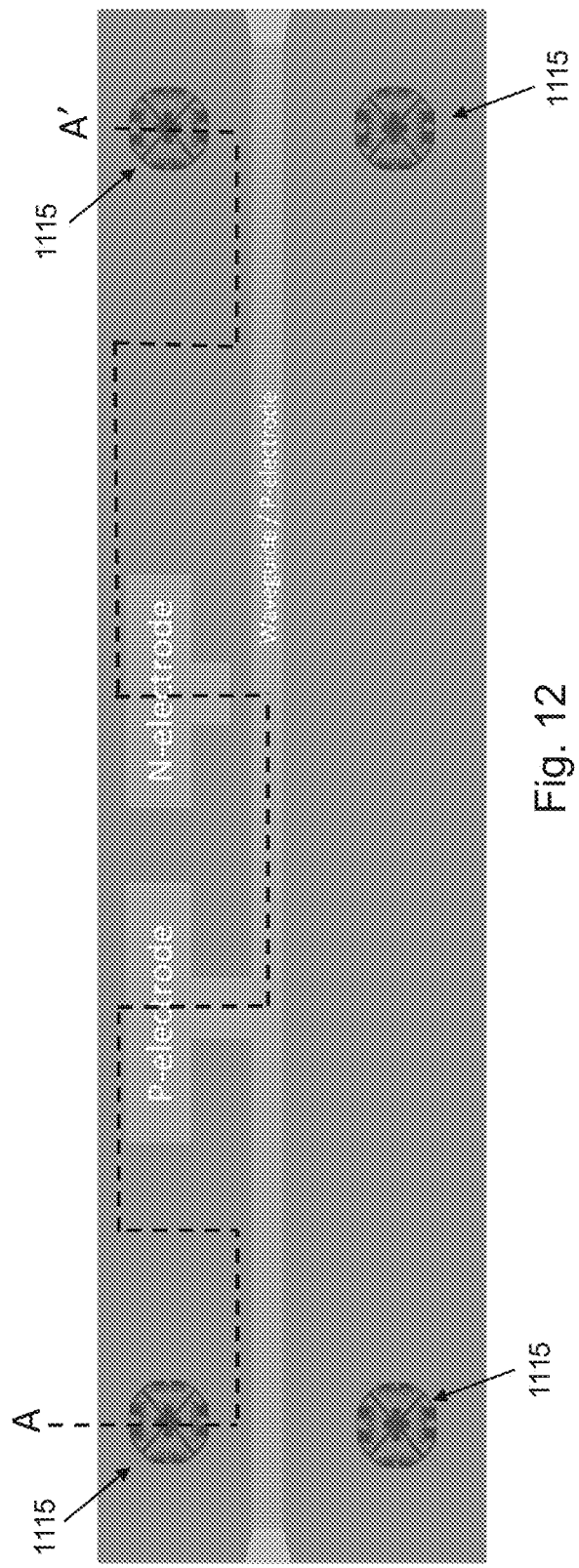
FIG. 12 shows a top-down view of a transfer die including an EAM produced using the method of FIGS. 11(i)-11(xiv)

FIG. 12 shows a top-down view of a transfer die including an EAM produced using the method of FIGS. 11(i)-11(xiv). All of FIGS. 11(i)-11(xiv) are sections along the cut A-A'. As before, it should be noted that the views are not to scale, and certain regions have been compressed relative to the dimensions shown in FIG. 12 in order to fit to the pages.

Figure 13I:
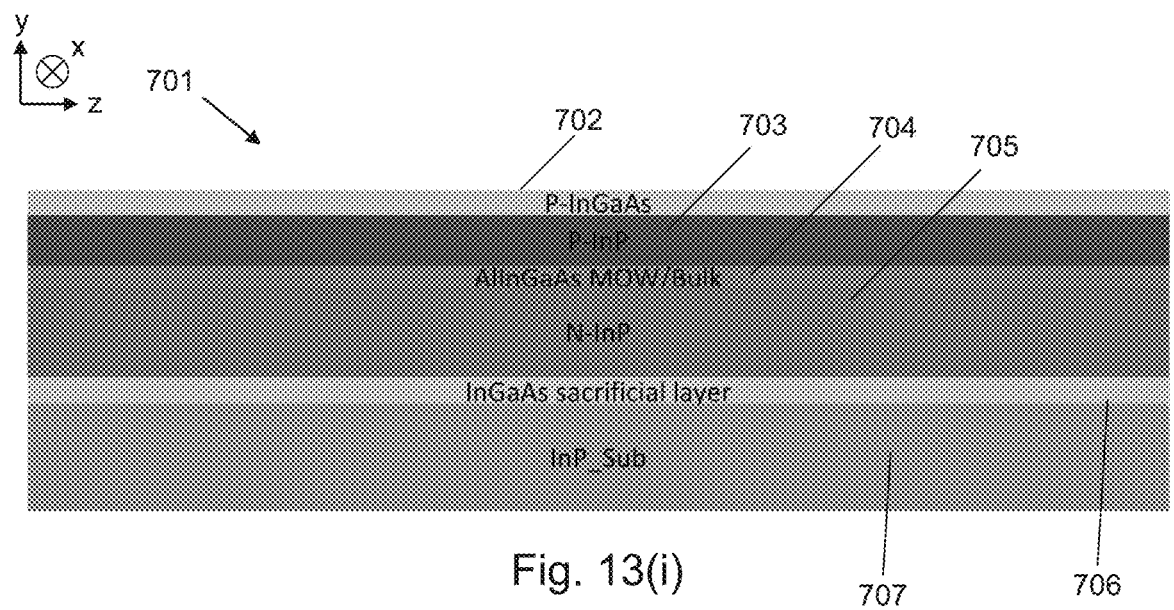
FIGS. 13(i)-13(xiv) show various manufacturing steps of a variant method to produce a transfer die including a III-V based EAM.
Figure 13:
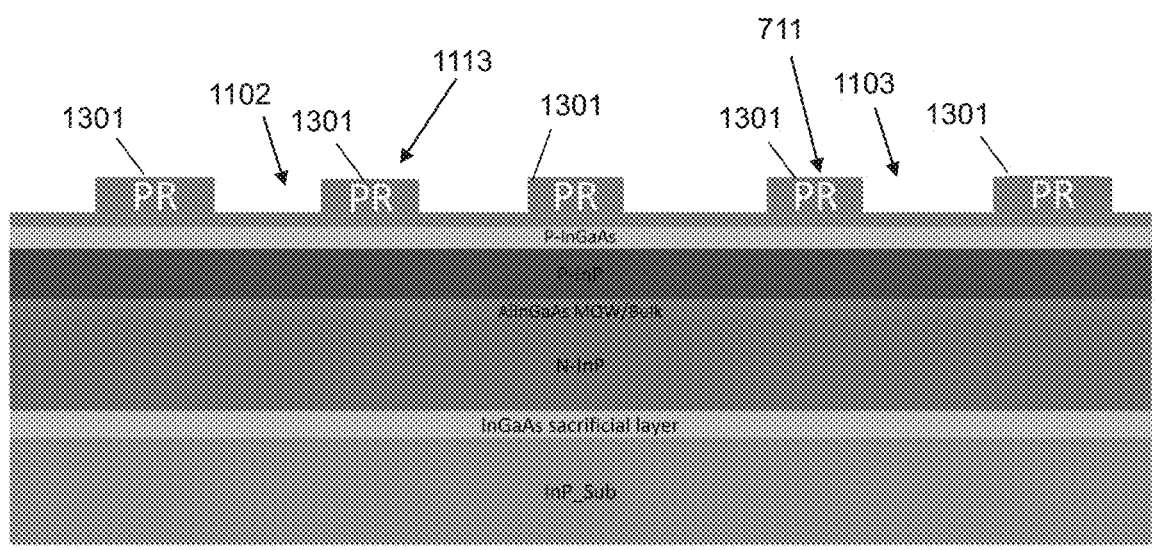
Figure 13:
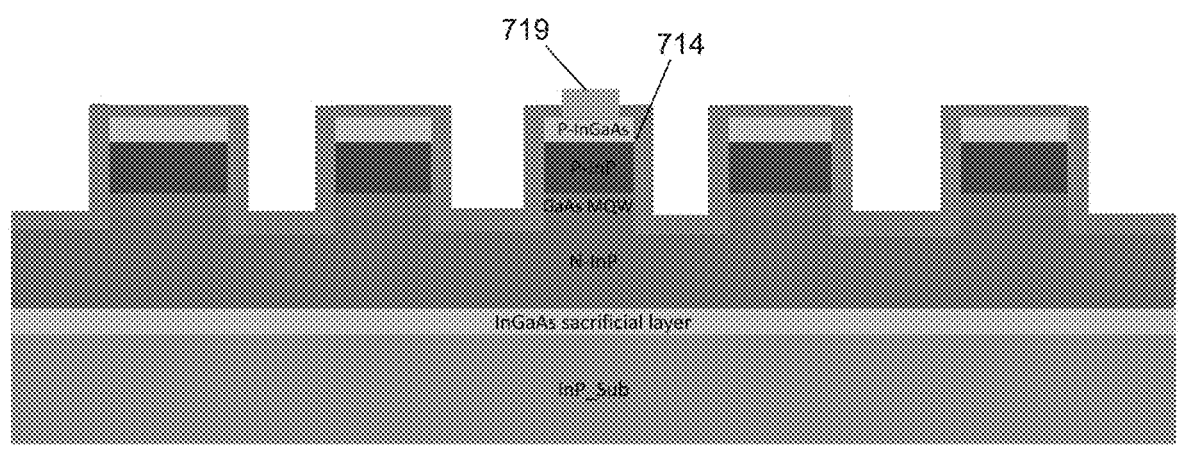

FIGS. 13(i)-13(xiv) show various manufacturing steps of a variant method to produce a transfer die including a III-V based EAM. In a first step, as shown in FIG. 13(i), a III-V semiconductor stack 701 is provided. A photoresist 1301 is then applied, to define waveguide 714, as well as alignment areas 1102 and 1103 and p and n contact areas 1113 and 711. The edges of photoresist 1301 defines the chip boundary.

Figure 13V:
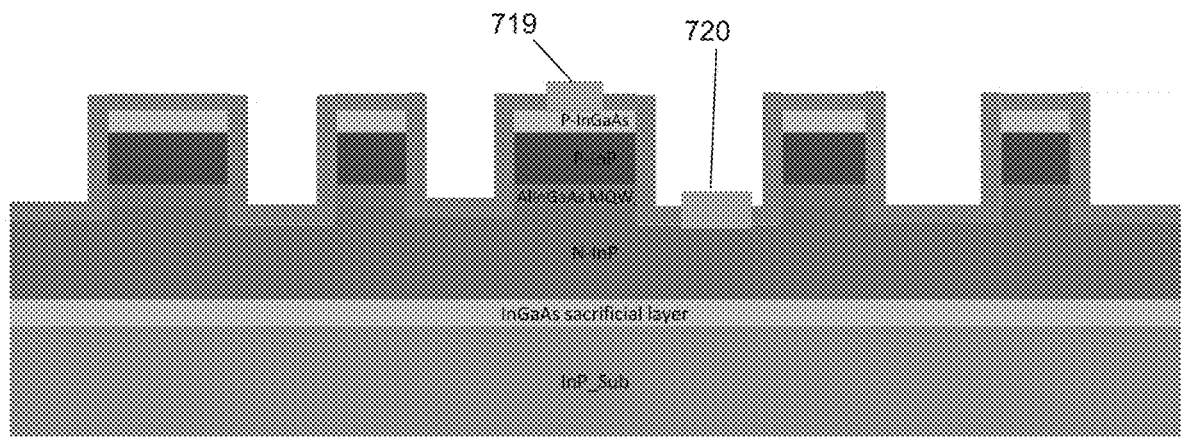
Figure 13:
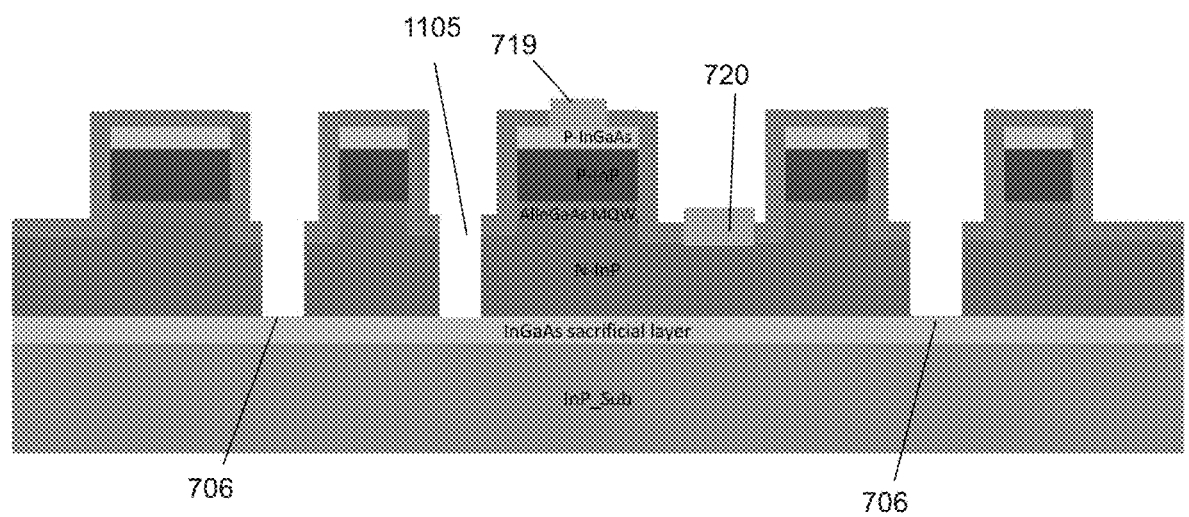
Figure 13:
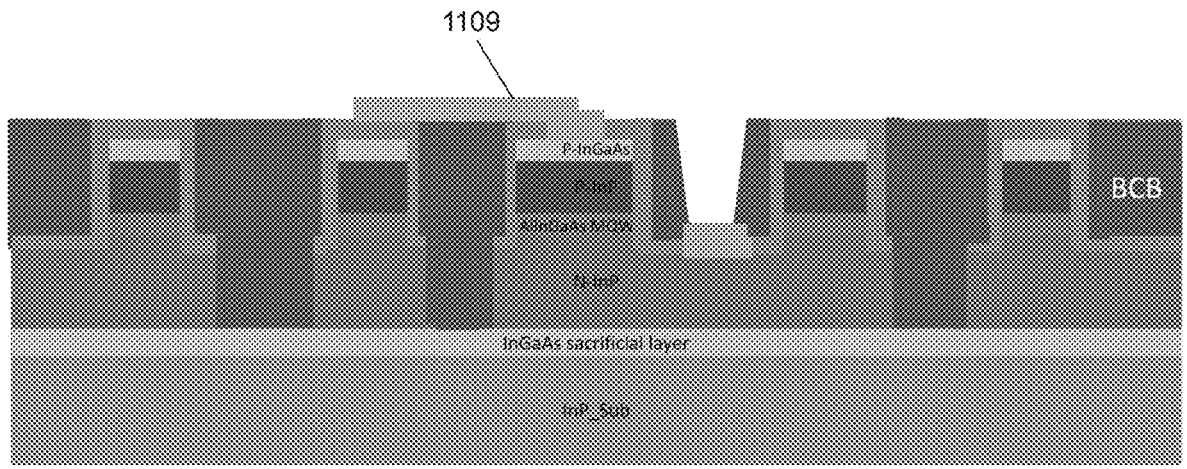

The device is then etched, as shown in FIG. 13(iii), thereby providing waveguide 714 and alignment areas 1102 and 1103. Next, an upper cladding layer (e.g. formed of silicon dioxide) is provided as well as any stress compensation layers that may be required. The P-contact 719 is also disposed in contact with the P-InGaAs layer of the stack. This is shown in FIG. 13(iv). Next, N-contact 720 is provided which is electrically connected to the N-InP layer of the stack, as illustrated in FIG. 13(v).

After the electrical contacts have been provided, an isolation area 1105 is etched. At the same time, the alignment areas are etched down to the InGaAs sacrificial layer as illustrated in FIG. 13(vi). As before, this etch is performed through a combination of a dry etch and wet etch to remove the InP, using the InGaAs layer as a wet etch stop.

As with the previous method, a silicon nitride layer 1106 is then deposited followed by a BCB fill. This is shown in FIG. 13(vii). Again, the device (with the exception of the p-contact 719) is planarized and a via 1108 for electrode connection is opened through the BCB fill. The result of these steps is shown in FIG. 13(viii).

Figure 13X:
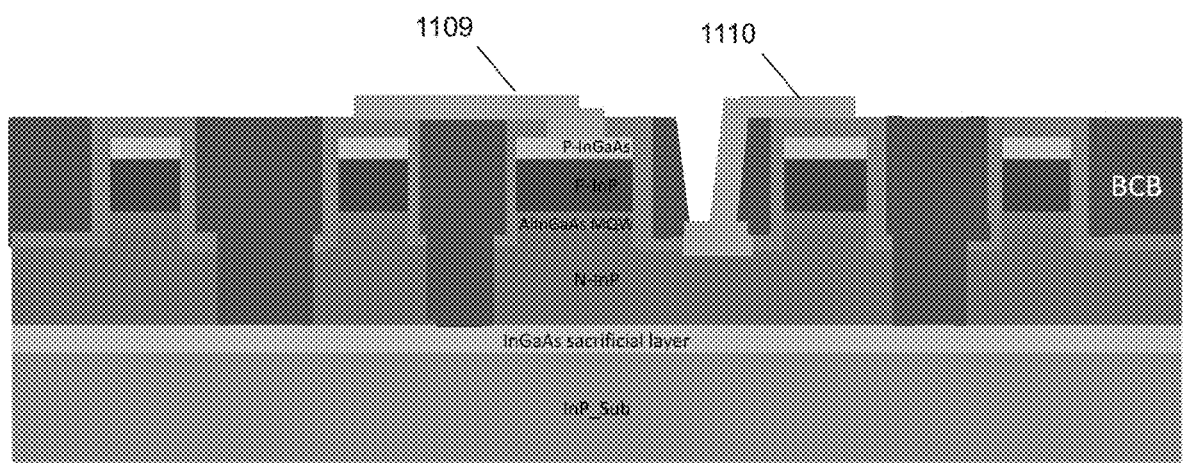

Electrical trace 1109 for the p-contact 719 is then made, as shown in FIG. 13(ix), and electrical trace 1110 for the n-contact is made as shown in FIG. 13(x). The alignment marks 1302 are then made, in this instance through the deposition of a relatively thin metal layer (e.g. TiN) which is patterned and etched to produce the fine and coarse features discussed above. This is shown in FIG. 13(xi). In an optional step, trenches 1303 may be etched in the BCB fill first for the alignment markers to be disposed in. Alternatively, the alignment markers may be etched into the BCB fill itself. FIG. 13(xi') shows the optional variant in which trenches 1303 are etched.

After the alignment marks have been made, a hard mask 1111 is disposed over the III-V transfer die (although electrode traces 1109 and 1110 are left exposed). Subsequently, the hard mask is patterned and facets are etched, the facets are coated and the chip boundaries are etched. This is shown in FIG. 13(xii).

As before, a transfer photoresist 1112 is then provided over the upper exposed surfaces of the III-V transfer die, as shown in FIG. 13(xiii). The sacrificial InGaAs layer can then be etched away, leaving the III-V transfer die suspended from tethers 722 as shown in FIG. 13(xiv).

Figure 14:
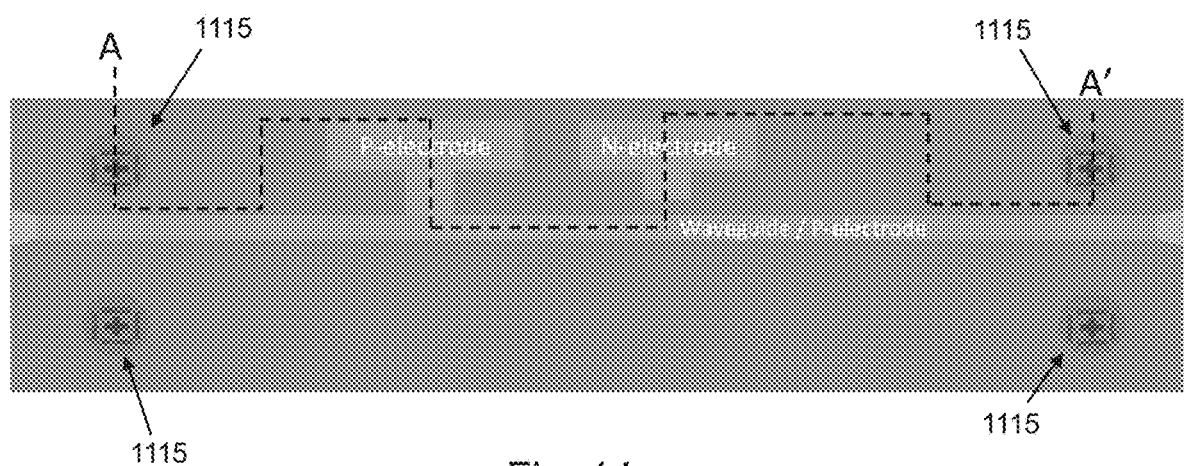
FIG. 14 shows a top-down view of a transfer die including an EAM produced using the method of FIGS. 13(i)-13(xiv)

FIG. 14 shows a top-down view of a transfer die including an EAM produced using the method of FIGS. 13(i)-13(xiv). All of FIGS. 13(i)-13(xiv) are sections along the cut A-A'. As before, it should be noted that the views are not to scale, and certain regions have been compressed relative to the dimensions shown in FIG. 14 in order to fit to the pages.

After the precursor photonic device (e.g. shown in FIG. 2A) has been produced, and the transfer die containing a photonic device (including, in some embodiments, a III-V semiconductor based optically active region) has been completed, the two can be integrated. In one example, the integration process comprises the following steps:

For the precursor photonic device, e.g. the SOI waveguide platform:
Plasma treatment of the SOI waveguide wafer for approximately 30 seconds;
Dipping of the SOI waveguide into purified or deionised water; and
Spin drying of the SOI waveguide wafer (or spin rinse drying without drying gas).
For the III-V transfer die/chip/wafer:
Plasma treatment of the III-V die for approximately 30 seconds.

After the device and transfer die have been pre-treated, a micro-transfer print technique is used to align the III-V transfer die in the cavity of the precursor photonic device. This alignment utilises the alignment marks on each of the transfer die and precursor photonic device to enhance the alignment accuracy.

After the devices have been aligned, and the III-V transfer die 'printed' onto the precursor photonic device, an annealing process is used to facilitate bonding therebetween. In some embodiments, the annealing process includes annealing the assembled III-V/Si wafer at 300° C. for around 30 minutes in $N_2$ gas. This has been found to reliability bond the III-V layer(s) in the photonic device to the cavity of the precursor photonic device.

Figure 15A:
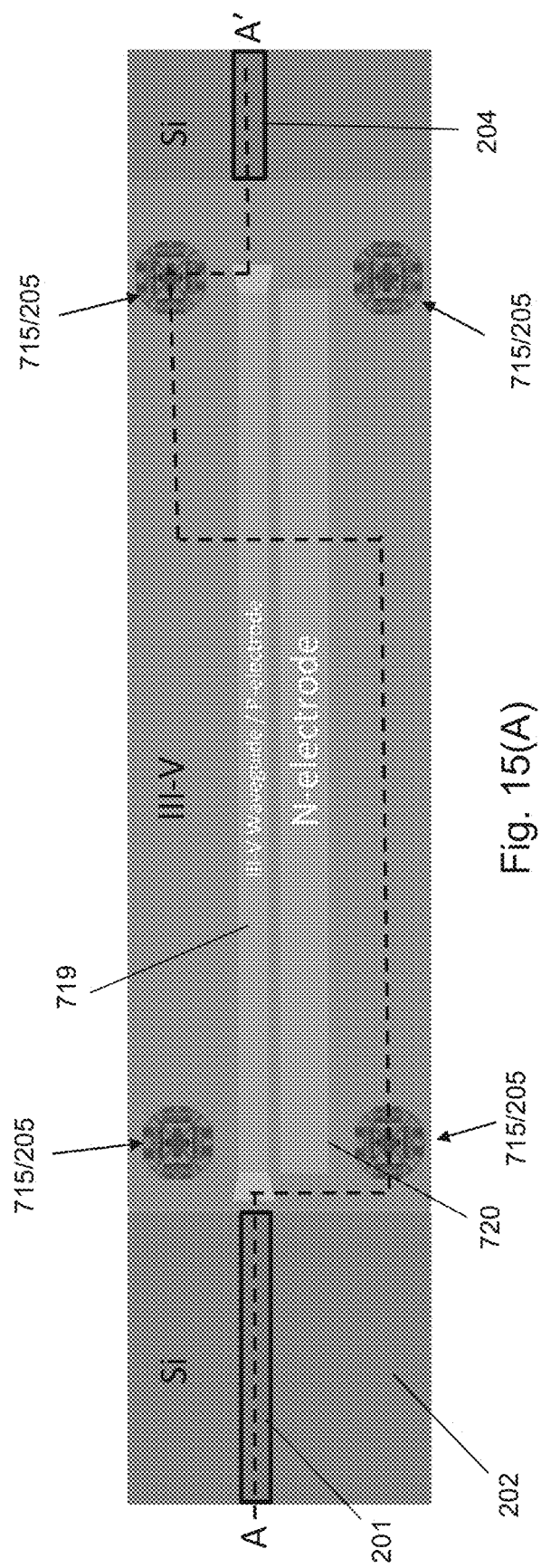
FIGS. 15(A) and 15(B) show respective views of a III-V/Si based laser after micro-transfer printing.
Figure 15B:
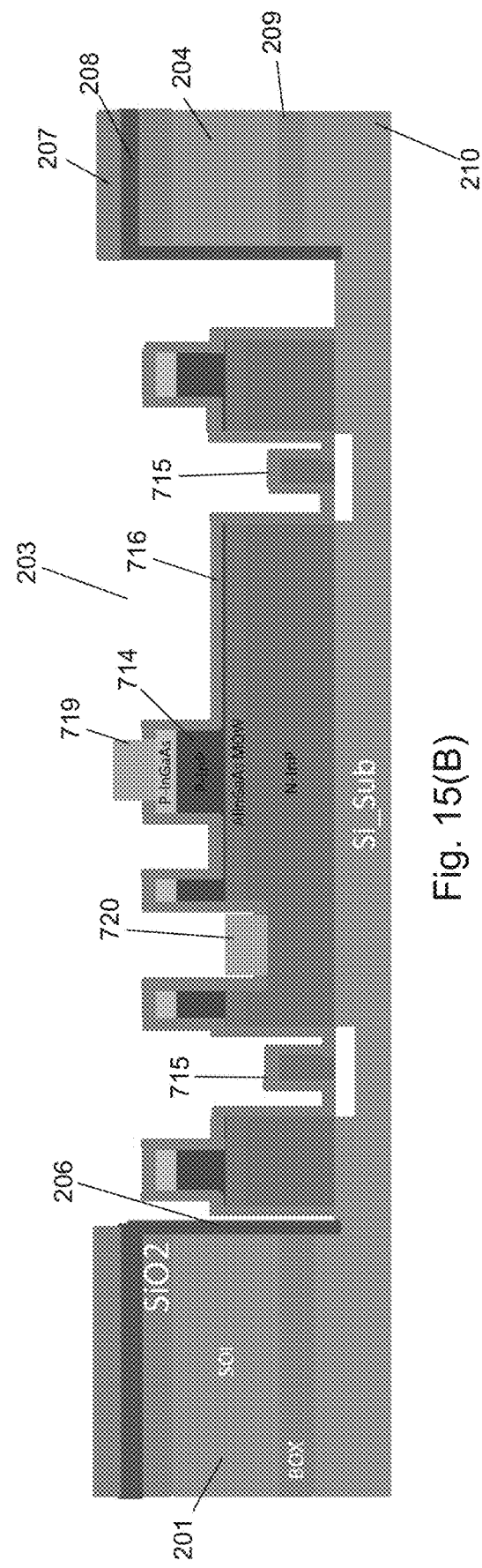

FIGS. 15(A) and 15(B) show respective views of a III-V/Si based laser after micro-transfer printing and bonding process. The III-V based laser is that manufactured according to FIGS. 7(i)-7(xii) and shown in FIG. 8. As can be seen, the alignment features 715 of the transfer die and the alignment features 205 of the precursor device overlap such that they can be used in the accurate alignment of one component relative to the other. In this example, as the III-V device is a laser, the waveguide 204 is not intended for use and so a sizable gap can be left between the III-V device and the output waveguide. Indeed, in this example, the precursor photonic device may have only one waveguide, waveguide 201 which functions as an output waveguide for the laser. FIG. 15(B) is a section view taken along the A-A' line of FIG. 15(A). As before, it should be noted that the views are not to scale, and certain regions have been compressed relative to the dimensions shown in FIG. 15(A) in order to fit to the page.

Figure 16A:
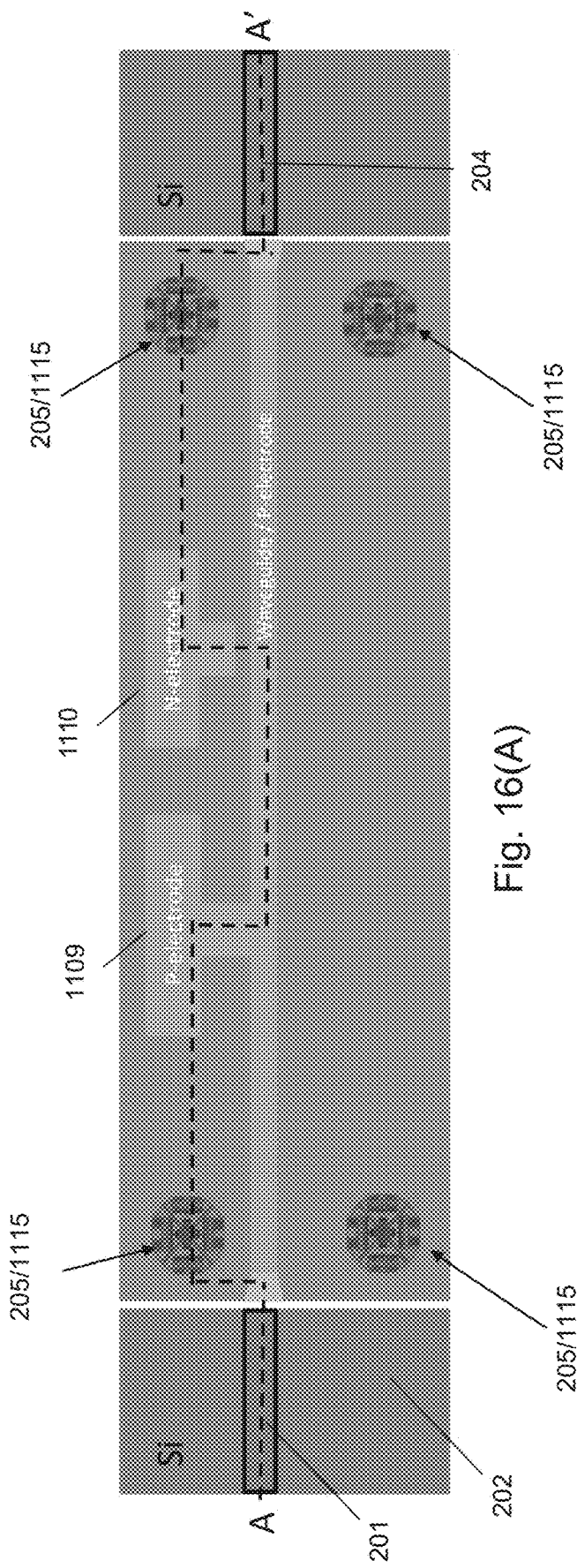
FIGS. 16(A) and 16(B) show respective views of a III-V/Si based EAM after micro-transfer printing.
Figure 16B:
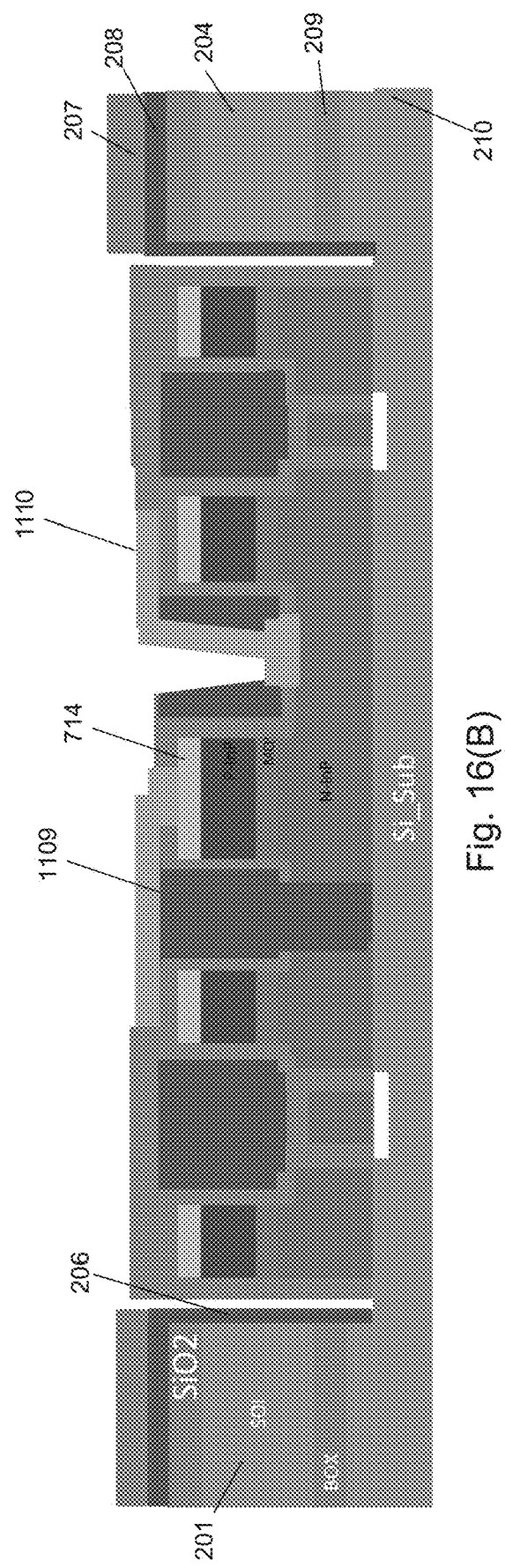

FIGS. 16(A) and 16(B) show respective views of a III-V/Si based EAM after micro-transfer printing. The III-V based EAM is that manufactured according to FIGS. 11(i)-11(xiv) and shown in FIG. 12. As can be seen, the alignment features 1115 of the transfer die and the alignment features 205 of the precursor device overlap such that they can be used in the accurate alignment of one component relative to the other. In this example, as the III-V device is an EAM, both waveguides 201 and 204 are intended for use and so the gap between the III-V device and the waveguides should be kept relatively small.

FIG. 16(B) is a section view taken along the A-A' line of FIG. 16(A). As before, it should be noted that the views are not to scale, and certain regions have been compressed relative to the dimensions shown in FIG. 16(A) in order to fit to the page.

Figure 17A:
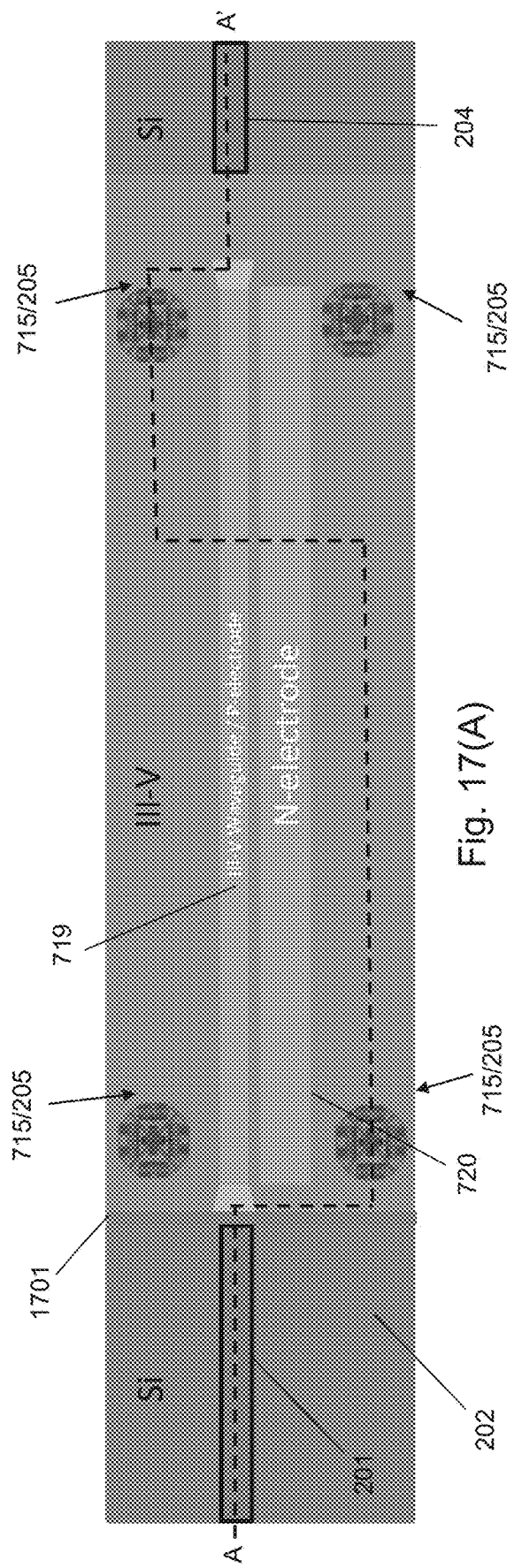
FIGS. 17(A) and 17(B) show respective views of a variant III-V/Si based laser after micro-transfer printing.
Figure 17B:
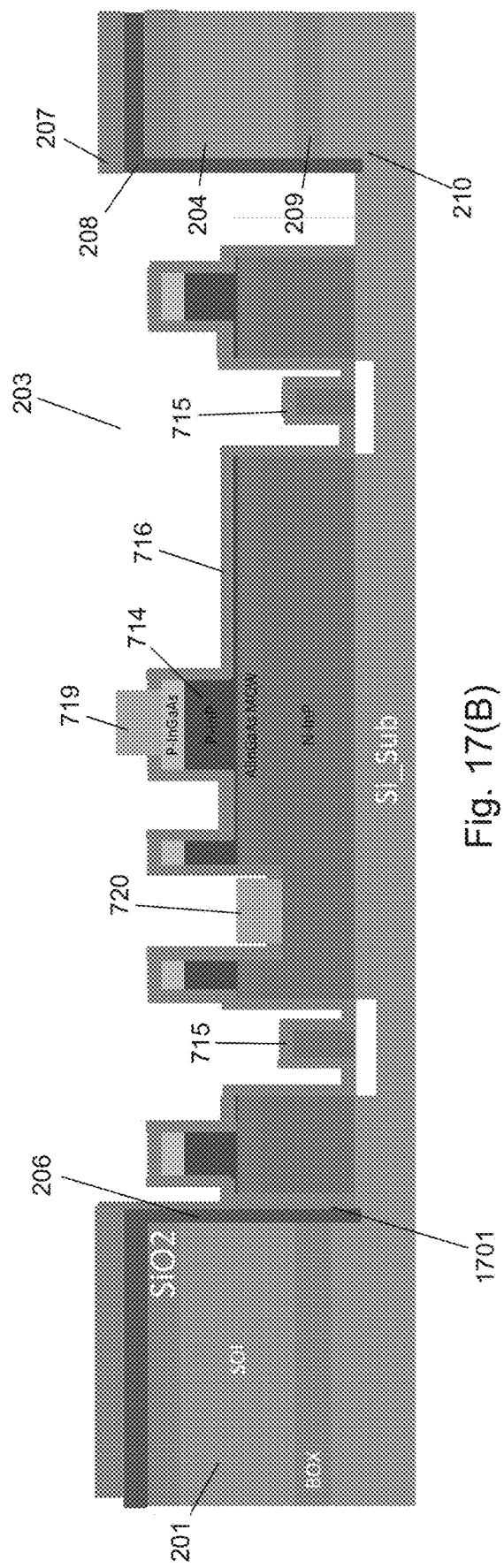

FIGS. 17(A) and 17(B) show respective views of a variant III-V/Si based laser after micro-transfer printing. As can be seen, the alignment features 715 of the transfer die and the alignment features 205 of the precursor device overlap such that they can be used in the accurate alignment of one component relative to the other. In this example, as the III-V device is a laser, the waveguide 204 is not intended for use and so a sizable gap can be left between the III-V device and the output waveguide. Indeed, in this example, the precursor photonic device may have only one waveguide, waveguide 201 which functions as an output waveguide for the laser. The device in FIGS. 17(A) and 17(B) differs from that in 15(A) and 15(B) in that the gap between waveguide 201 and the III-V device is filled with a bridge waveguide 1701 (formed, in this example, from either $Si_3N_4$ or amorphous silicon, α-Si). This bridge waveguide can provide an index match between the waveguide 201 and III-V device, and so further reduce any optical losses as light moves from the III-V based laser to the waveguide 201.

FIG. 17(B) is a section view taken along the A-A' line of FIG. 17(A). As before, it should be noted that the views are not to scale, and certain regions have been compressed relative to the dimensions shown in FIG. 17(A) in order to fit to the page.

Figure 18A:
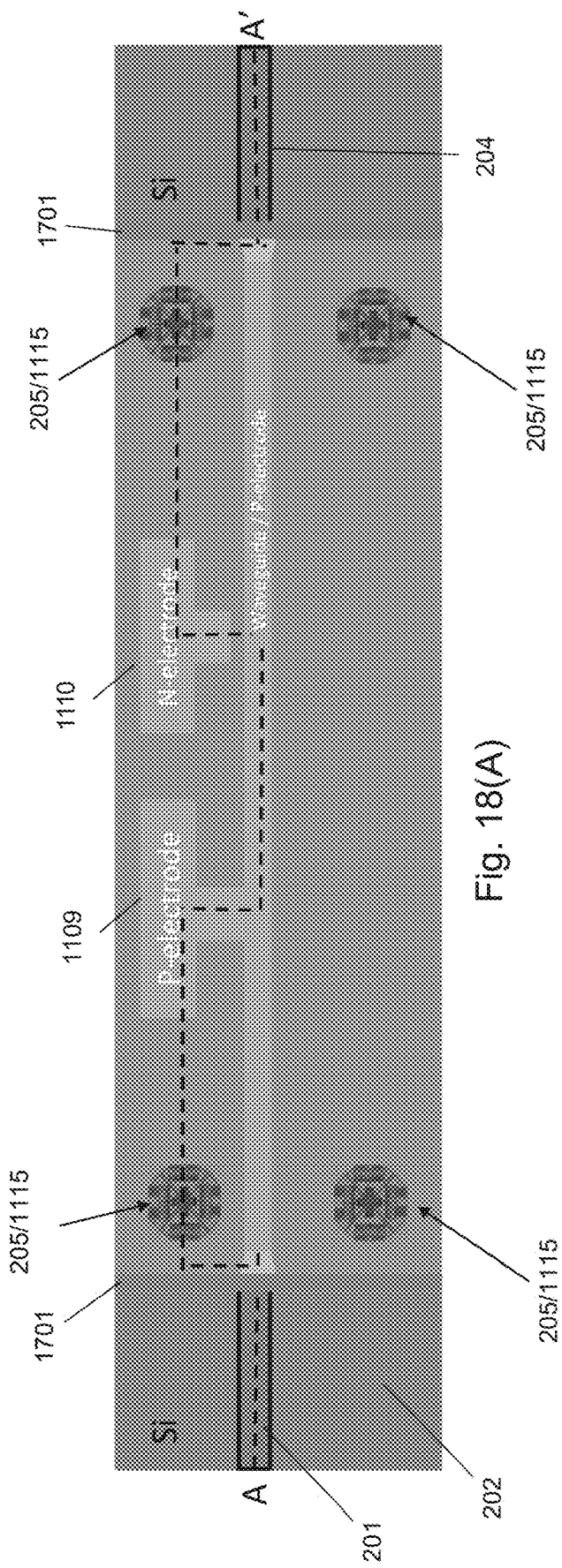
FIGS. 18(A) and 18(B) show respective views of a variant III-V/Si based EAM after micro-transfer printing.
Figure 18B:
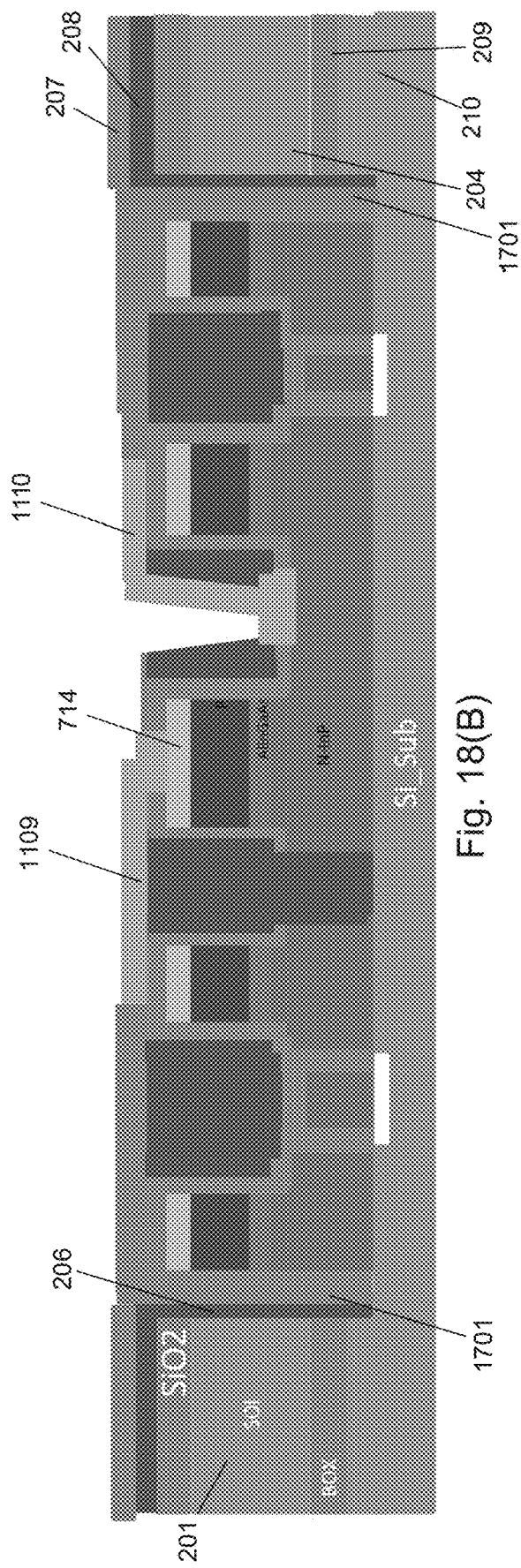

FIGS. 18(A) and 18(B) show respective views of a variant III-V/Si based EAM after micro-transfer printing. As can be seen, the alignment features 1115 of the transfer die and the alignment features 205 of the precursor device overlap such that they can be used in the accurate alignment of one component relative to the other. The device in FIGS. 18(A) and 18(B) differs from that in 16(A) and 16(B) in that the gaps between waveguides 201 and 204 and the III-V device are both filled with bridge waveguides 1701 (formed, in this example, from either $Si_3N_4$ or amorphous silicon, α-Si). These bridge waveguides can provide an index match between the waveguides 201 and 204 and the III-V device, and so further reduce any optical losses as light moves from the input waveguide 201 into the III-V based EAM and on to the output waveguide 204.

FIG. 18(B) is a section view taken along the A-A' line of FIG. 18(A). As before, it should be noted that the views are not to scale, and certain regions have been compressed relative to the dimensions shown in FIG. 18(A) in order to fit to the page.

Figure 19A:
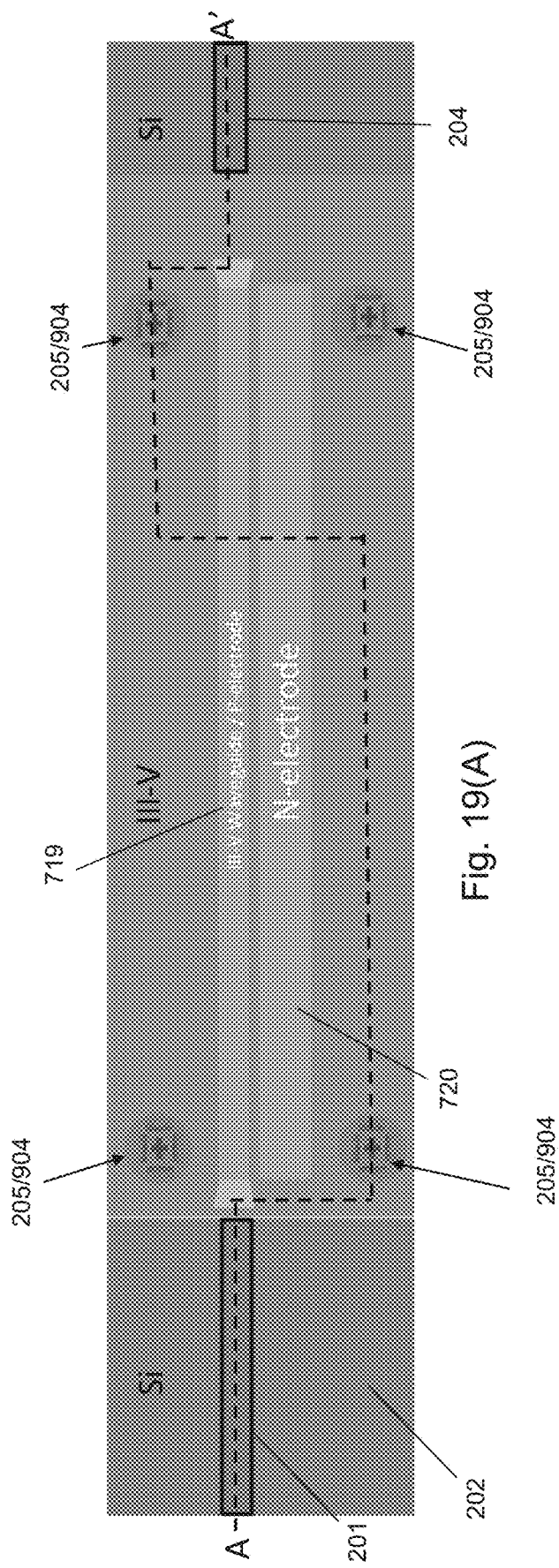
FIGS. 19(A) and 19(B) show respective views of a variant III-V/Si based laser after micro-transfer printing.
Figure 19B:
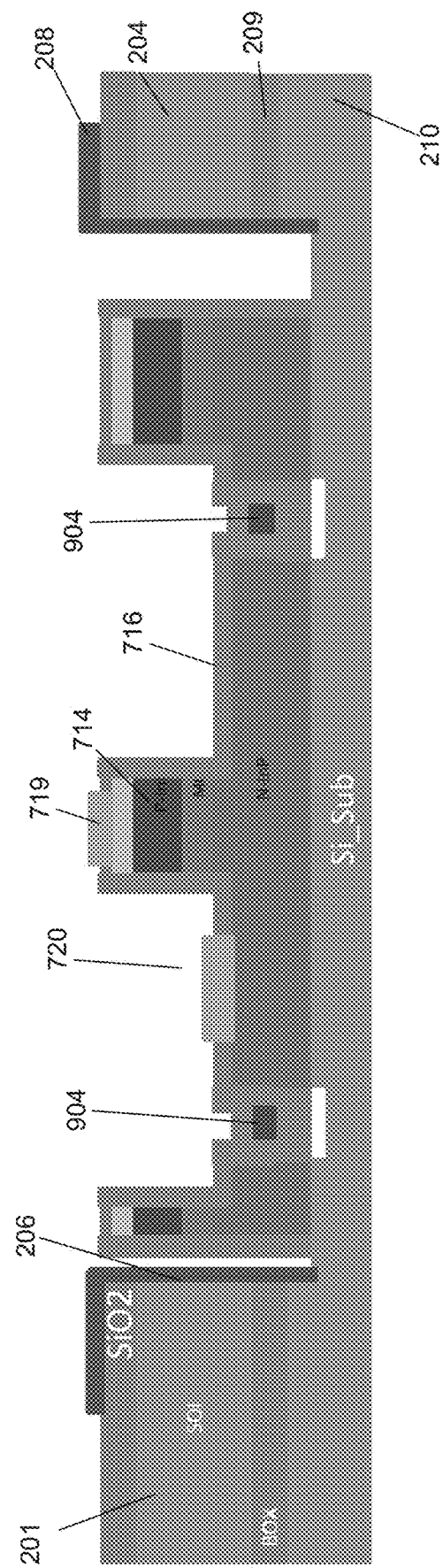

FIGS. 19(A) and 19(B) show respective views of a variant III-V/Si based laser after micro-transfer printing. The III-V based laser is that manufactured according to FIGS. 9(*i*)-9(*xiii*) and shown in FIG. 10. As can be seen, the alignment features 904 of the transfer die and the alignment features 205 of the precursor device overlap such that they can be used in the accurate alignment of one component relative to the other. In this example, as the III-V device is a laser, the waveguide 204 is not intended for use and so a sizable gap can be left between the III-V device and the output waveguide. Indeed, in this example, the precursor photonic device may have only one waveguide, waveguide 201 which functions as an output waveguide for the laser.

FIG. 19(B) is a section view taken along the A-A' line of FIG. 19(A). As before, it should be noted that the views are not to scale, and certain regions have been compressed relative to the dimensions shown in FIG. 19(A) in order to fit to the page.

Figure 20A:
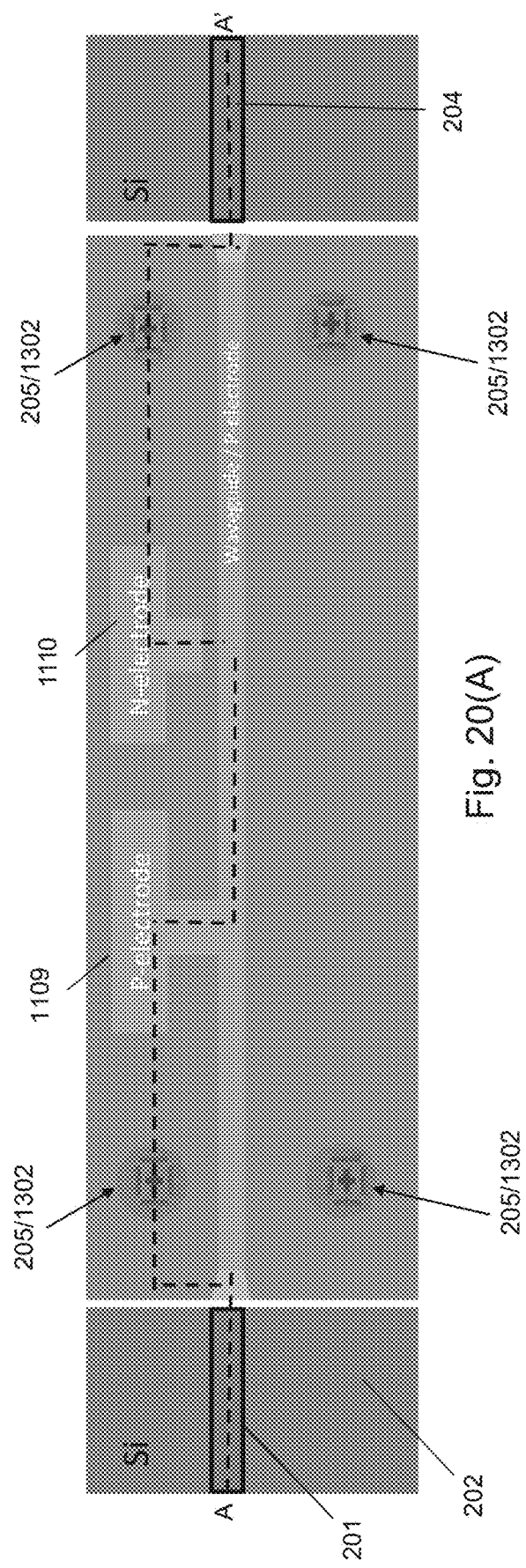
FIGS. 20(A) and 20(B) show respective views of a variant III-V/Si based EAM after micro-transfer printing.
Figure 20B:
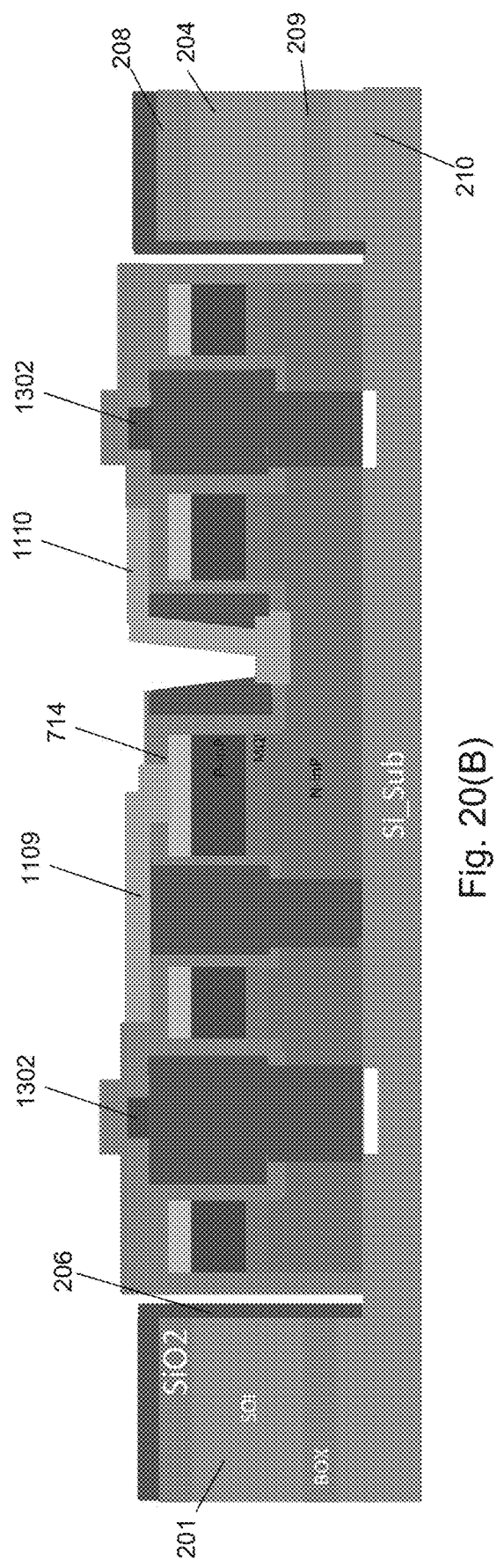

FIGS. 20(A) and 20(B) show respective views of a variant III-V/Si based EAM after micro-transfer printing. The III-V based EAM is that manufactured according to FIGS. 13(*i*)-13(*xiv*) and shown in FIG. 14. As can be seen, the alignment features 1302 of the transfer die and the alignment features 205 of the precursor device overlap such that they can be used in the accurate alignment of one component relative to the other. In this example, as the III-V device is an EAM, both waveguides 201 and 204 are intended for use and so the gap between the III-V device and the waveguides should be kept relatively small.

FIG. 20(B) is a section view taken along the A-A' line of FIG. 20(A). As before, it should be noted that the views are not to scale, and certain regions have been compressed relative to the dimensions shown in FIG. 20(A) in order to fit to the page.

Figure 21A:
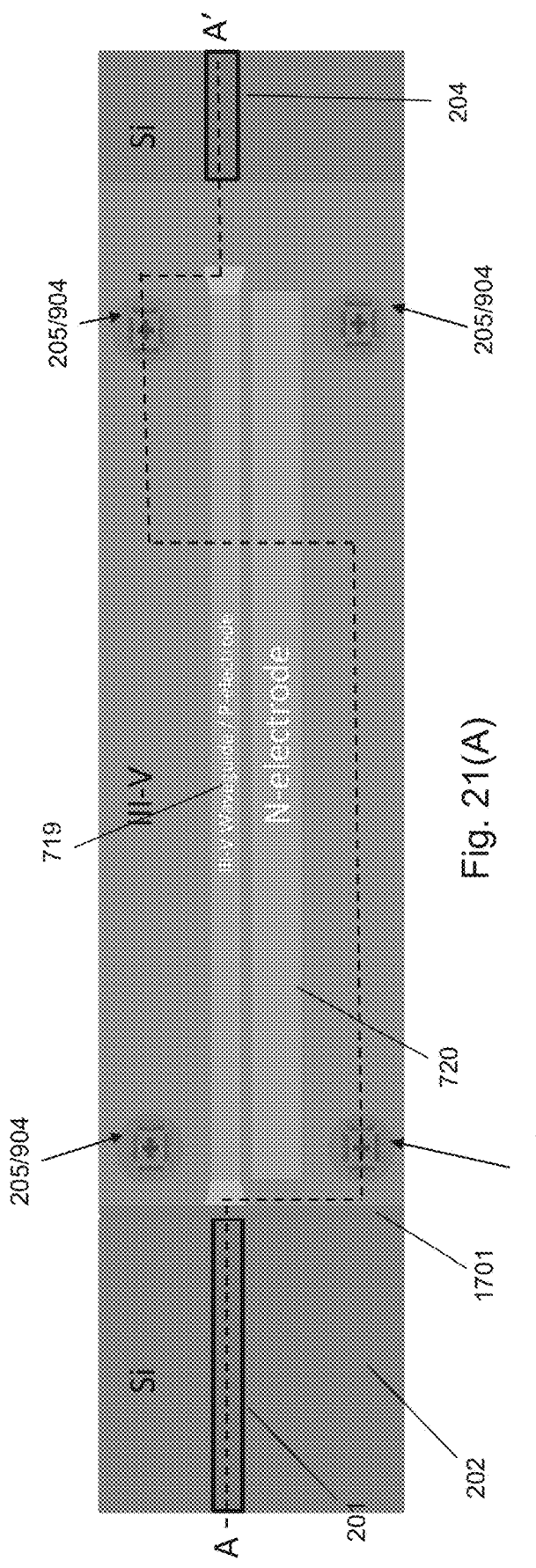
FIGS. 21(A) and 21(B) show respective views of a variant III-V/Si based laser after micro-transfer printing.
Figure 21B:
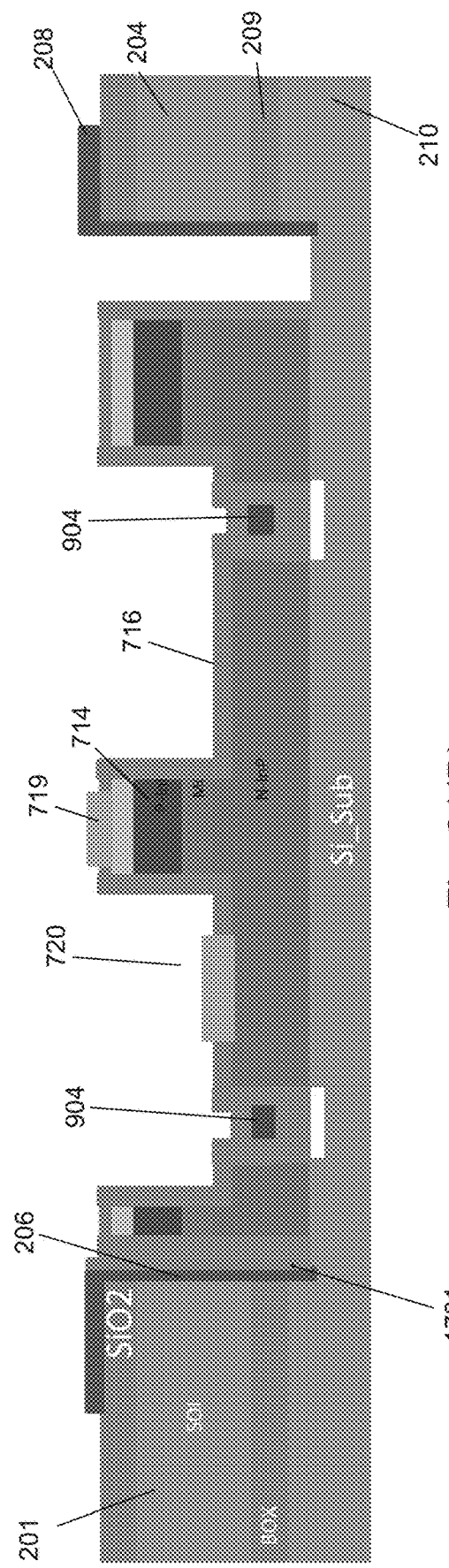

FIGS. 21(A) and 21(B) show respective views of a variant III-V/Si based laser after micro-transfer printing. As can be seen, the alignment features 904 of the transfer die and the alignment features 205 of the precursor device overlap such that they can be used in the accurate alignment of one component relative to the other. In this example, as the III-V device is a laser, the waveguide 204 is not intended for use and so a sizable gap can be left between the III-V device and the output waveguide. Indeed, in this example, the precursor photonic device may have only one waveguide, waveguide 201 which functions as an output waveguide for the laser. The device in FIGS. 21(A) and 21(B) differs from that in 19(A) and 19(B) in that the gap between waveguide 201 and the III-V device is filled with a bridge waveguide 1701 (formed, in this example, from either $Si_3N_4$ or amorphous silicon, α-Si). This bridge waveguide can provide an index match between the waveguide 201 and III-V device, and so further reduce any optical losses as light moves from the III-V based laser to the waveguide 201.

FIG. 21(B) is a section view taken along the A-A' line of FIG. 21(A). As before, it should be noted that the views are not to scale, and certain regions have been compressed relative to the dimensions shown in FIG. 21(A) in order to fit to the page.

Figure 22A:
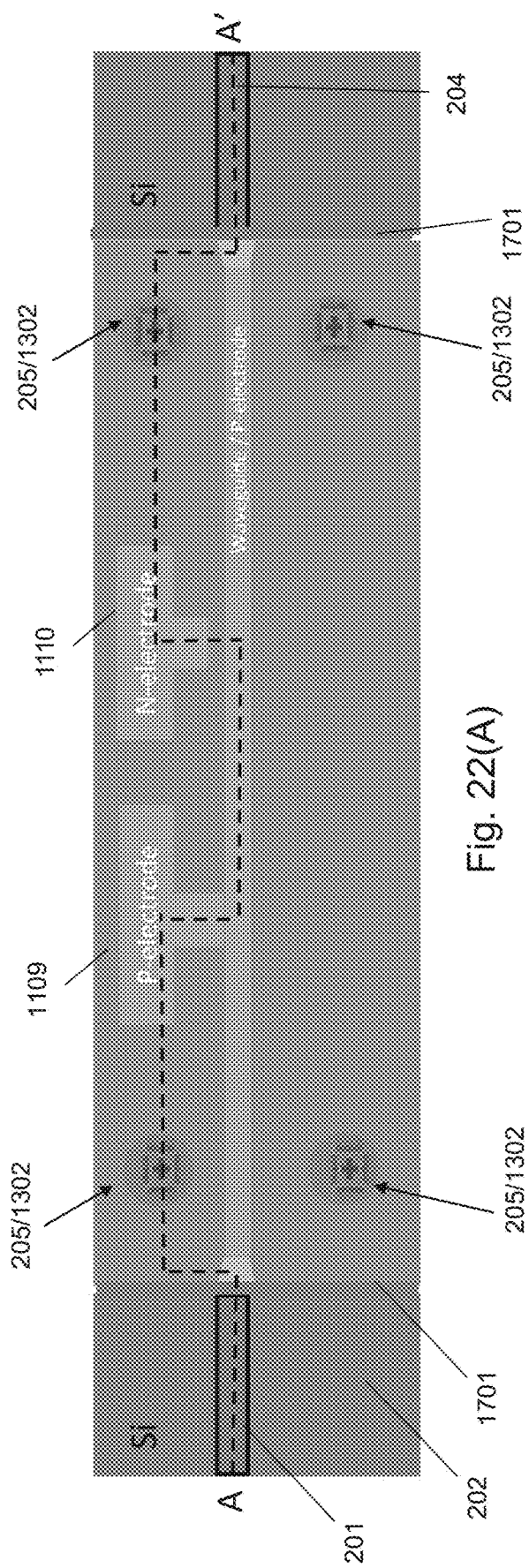
FIGS. 22(A) and 22(B) show respective views of a variant III-V/Si based EAM after micro-transfer printing.
Figure 22B:
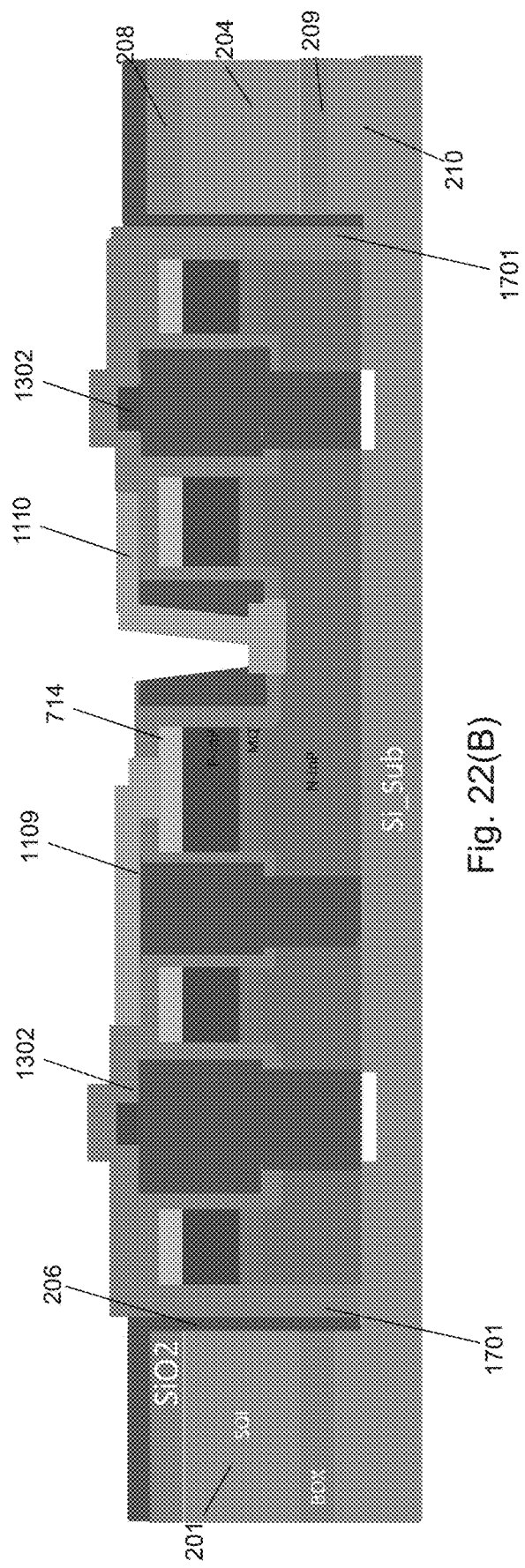

FIGS. 22(A) and 22(B) show respective views of a variant III-V/Si based EAM after micro-transfer printing. The III-V based EAM is that manufactured according to FIGS. 13(*i*)-13(*xiv*) and shown in FIG. 14. As can be seen, the alignment features 1302 of the transfer die and the alignment features 205 of the precursor device overlap such that they can be used in the accurate alignment of one component relative to the other. In this example, as the III-V device is an EAM, both waveguides 201 and 204 are intended for use and so the gap between the III-V device and the waveguides should be kept relatively small. The device in FIGS. 22(A) and 22(B) differs from that in 20(A) and 20(B) in that the gap between waveguides 201 and 204 and the III-V device is filled with a bridge waveguide (formed, in this example, from either $Si_3N_4$ or amorphous silicon, α-Si). These bridge waveguides can provide an index match between the waveguides 201 and 204 and the III-V device, and so further reduce any optical losses as light moves from the input waveguide 201 into the III-V based EAM and on to the output waveguide 204.

FIG. 22(B) is a section view taken along the A-A' line of FIG. 22(A). As before, it should be noted that the views are not to scale, and certain regions have been compressed relative to the dimensions shown in FIG. 22(A) in order to fit to the page.

Figure 23:
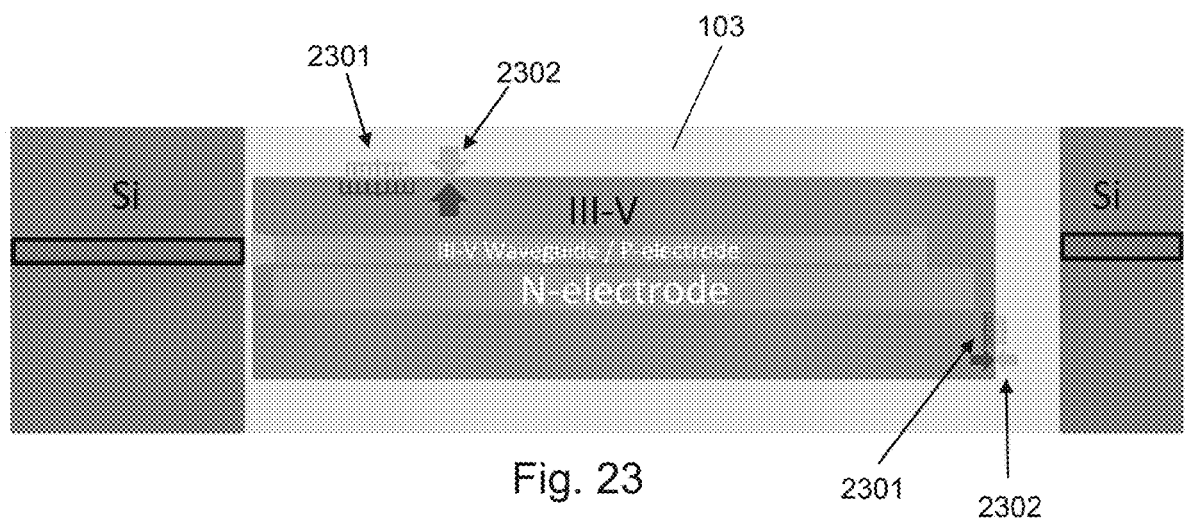
FIG. 23 shows a variation in the placement of alignment marks.

FIG. 23 shows a variation in the placement of alignment marks. In the example shown, the alignment marks (formed of fine 2301 and coarse 2302 alignment marks) in the precursor photonic device are made within the cavity 103 but outside of the perimeter of the III-V transfer die i.e. outside of the area of the cavity which will form the bonding area. Advantageously, this means that there are no alignment marks etched in the bonding area, which could improve the bond adhesion between the III-V transfer die and the cavity. Further, the alignment marks on the III-V transfer die would not need to be transparent, as they merely abut the alignment marks of the precursor photonic device. As a further advantage, the alignment marks in the precursor device may have a very similar or equal height, which makes imaging simpler. The fine alignment marks 2301 can be placed on two, three, or four sides of the III-V transfer die and corresponding locates in the SI cavity.

Figure 24:
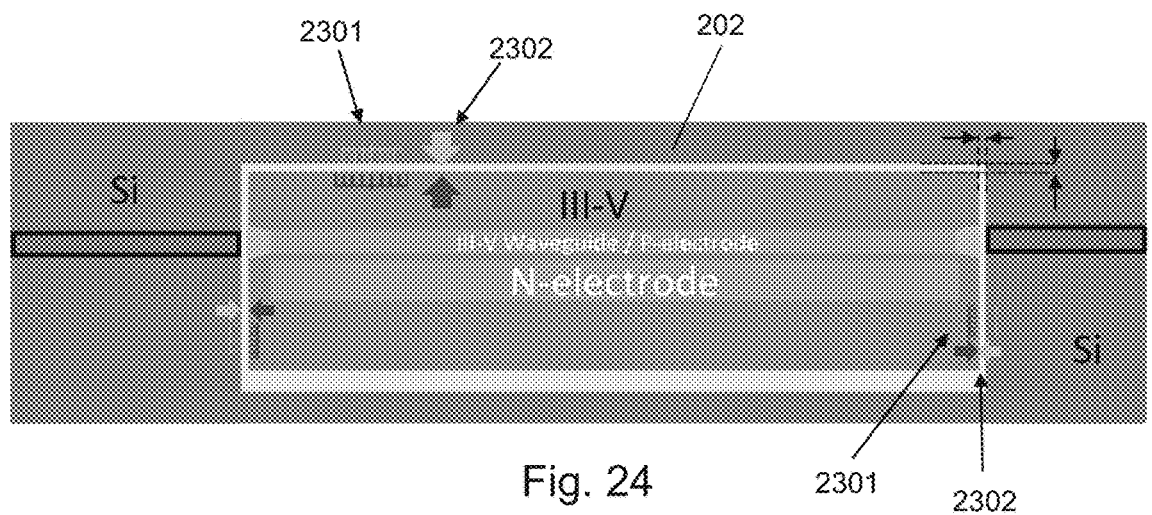
FIG. 24 shows a further variation in the placement of alignment marks.

FIG. 24 shows a further variation in the placement of alignment mark. In the example shown, the alignment marks (formed of fine 2301 and coarse 2302 alignment marks) in the precursor photonic device are made within the top silicon layer 202 of the device adjacent to the cavity instead of in the cavity itself. This allows the alignment marks to be easily self-aligned with the waveguide, because they can be etched in the same step as the waveguide. Again, the alignment marks in precursor photonic device can have a very similar or equal height to those in the III-V transfer die which facilitates imaging. The arrows indicated in the image demonstrate the edge alignment clearance, which is a factor in this example.

Figure 25:
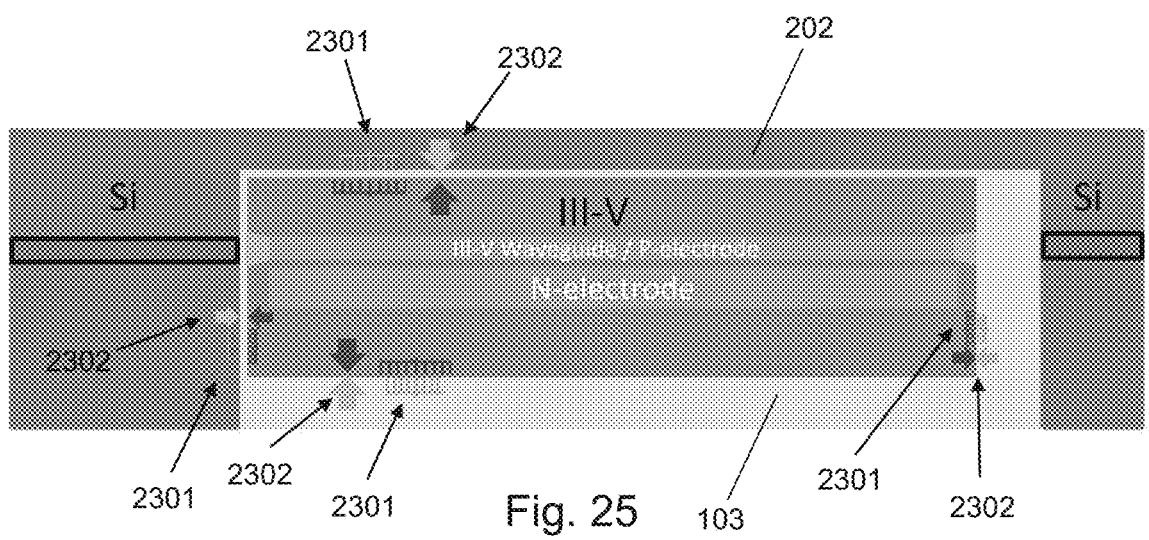
FIG. 25 shows a further variation in the placement of alignment marks.

FIG. 25 shows a further variation in the placement of alignment marks. The example shown is a combination of the examples in FIGS. 23 and 24, in that alignment marks are present both in the top silicon layer 202 of the precursor photonic device and in the cavity 103. This combinations the advantages discussed in relation to FIGS. 23 and 24, allowing for two edges of the cavity to be far away from the III-V transfer die whilst allowing for alignment using either or both of the marks on the edge of the cavity or on the bottom of the cavity.

Figure 26:
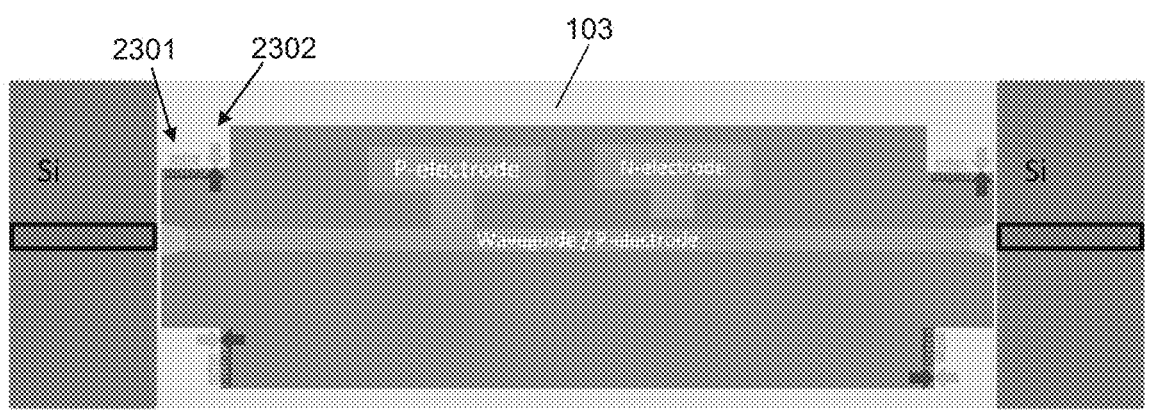
FIG. 26 shows a further variation in the placement of alignment marks.

FIG. 26 shows a further variation in the placement of alignment marks. Here the III-V transfer die is not rectangular, and so alignment marks can be placed on additional sides within the cavity 103. Whilst not shown, a U-bend version of the EAM could also be used, in which case the waveguide enters and exits the chip on the same side of the III-V transfer die and only one edge of the III-V transfer die would need to be in close proximity (i.e. an effective optical coupling distance) from the cavity edge in the precursor photonic device.

Figure 27:
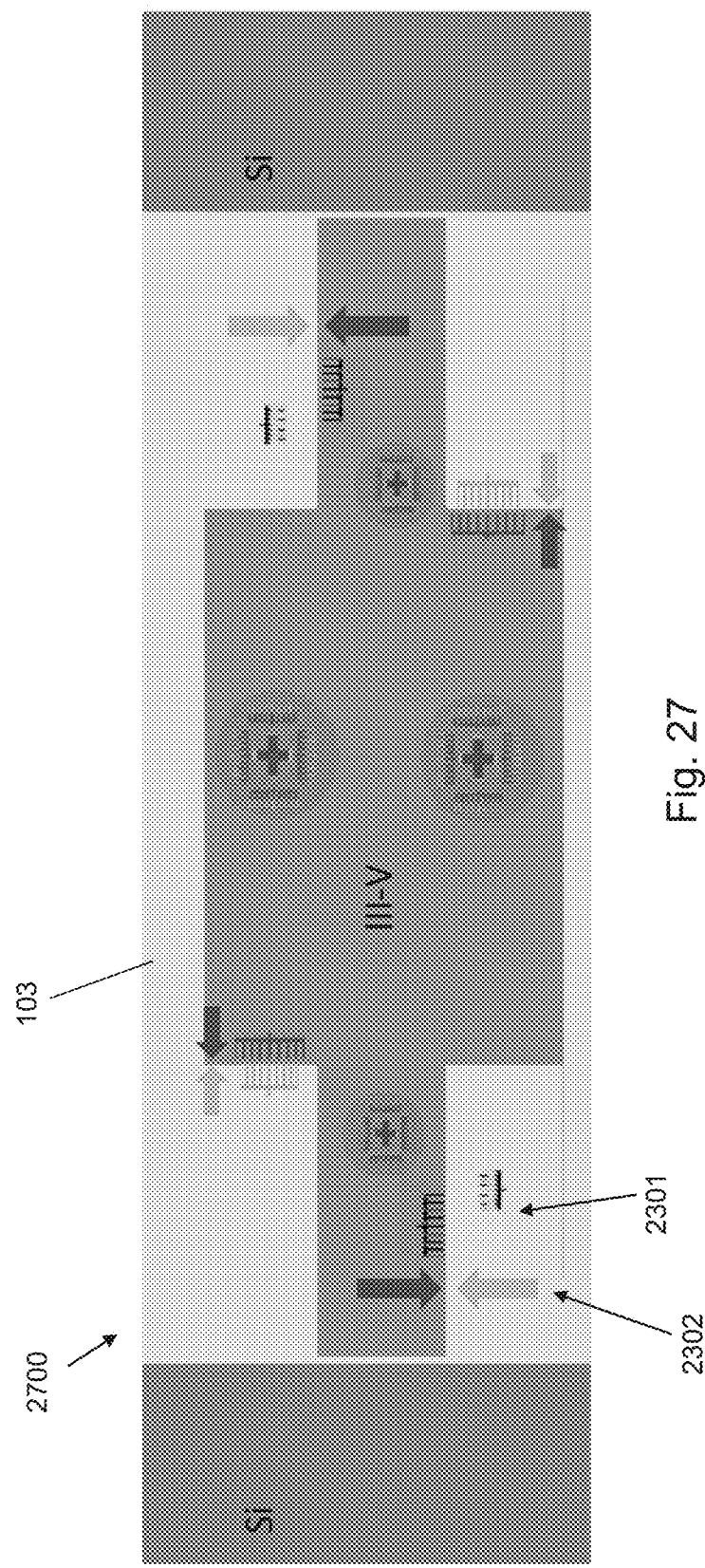
FIG. 27 shows an alignment token die.

FIG. 27 shows an alignment token die or chip 2700. The alignment token die does not include a III-V based device, and instead only includes alignment features and some form of substrate in or on which they are located. In the context of wafer based operations (discussed below), these alignment die can be used to substitute some of the III-V transfer die containing photonic devices so that none of the III-V transfer die include alignment features. This allows the token die's shape and size, as well as the design and location of the alignment marks, to be purely optimised to maximise alignment without having to also provide a working photonic device on the die. For example, the fine Vernier patterns can be made larger, allowing for improved alignment accuracy and precision.

Figure 28:
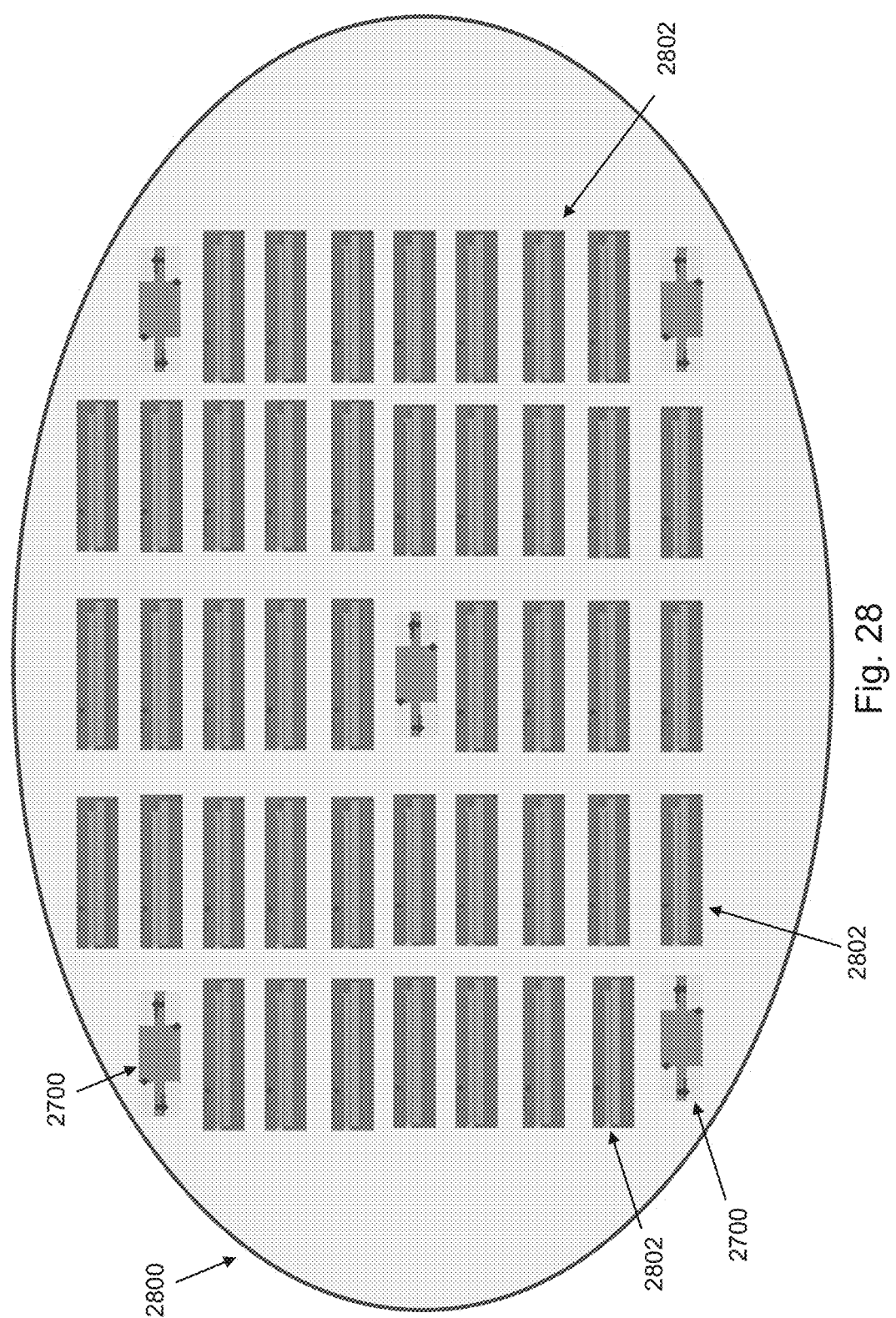
FIG. 28 shows a transfer wafer including III-V devices.

FIG. 28 shows a III-V transfer wafer 2800 including a plurality of the alignment token die 2700 as shown in FIG. 27. In this example, the alignment token die 2700 are located in four corners of the wafer and in a central portion. The remaining spaces are populated by III-V transfer die 2802 including photonic devices. These III-V transfer die may not have alignment features themselves, as alignment of the III-V transfer wafer with the platform wafer can be achieved through use of the alignment token die 2700. However, the III-V transfer die 2802 may also have alignment marks. For example, the alignment token die 2700 may have only coarse alignment marks. In one example, the alignment marks in the alignment token die 2700 may be sufficient for 'by eye' (i.e. unmagnified) alignment and the alignment marks present in the III-V transfer die 2802 may be used for fine alignment (requiring a degree of magnification).

Figure 29:
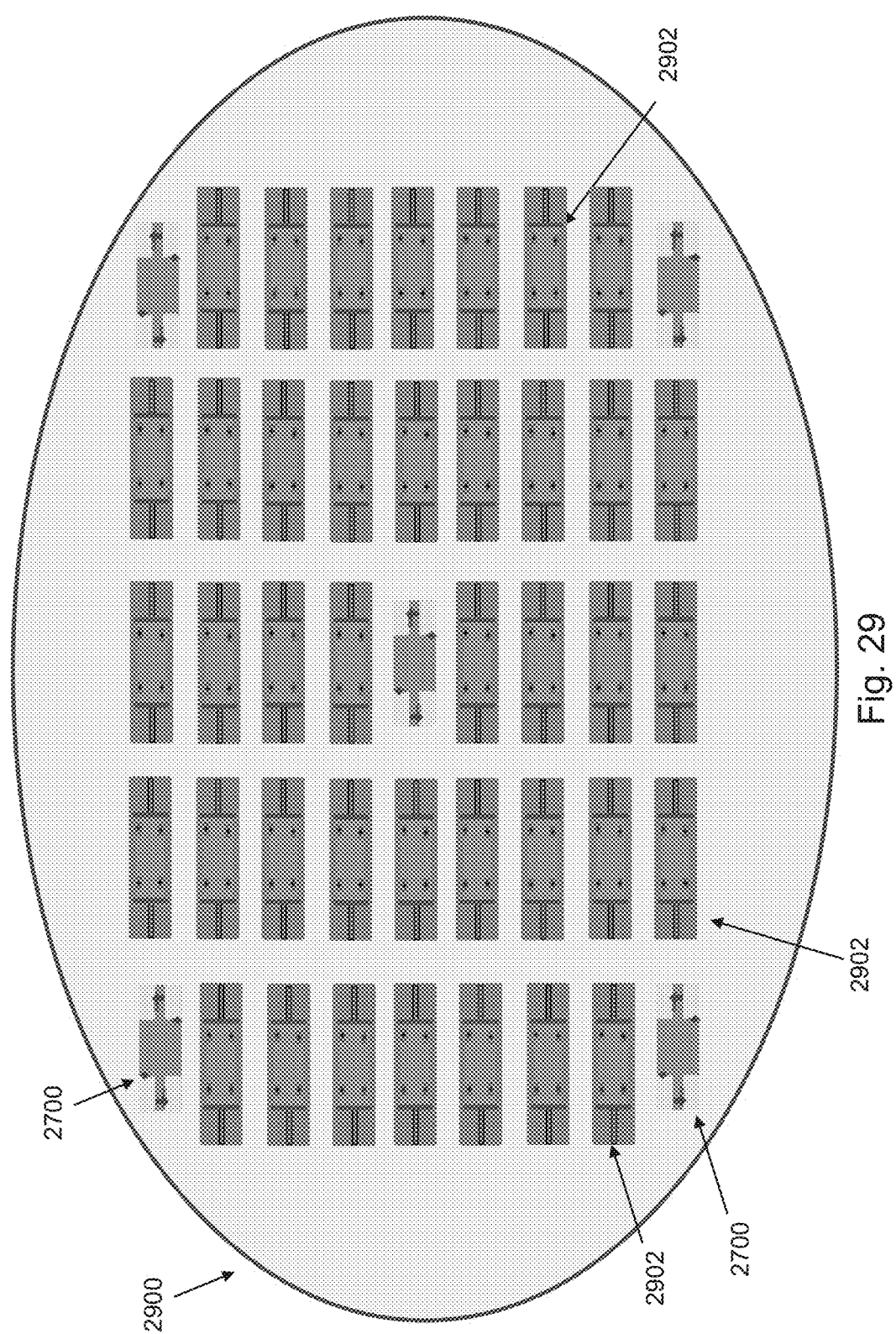
FIG. 29 shows a platform wafer including precursor photonic devices.

FIG. 29 shows a platform wafer 2900 including a plurality of alignment token die 2700 as shown in FIG. 27. In this example, the alignment token die 2700 are located in four corners of the wafer and in a central portion. The remaining spaces are populated by precursor photonic devices 2902 such as those shown in FIG. 2A. These precursor photonic devices may not have alignment features themselves, as alignment of the platform wafer with the III-V transfer wafer can be achieved through use of the alignment token die 2700. However, the precursor photonic devices 2902 may also have alignment marks. For example, the alignment token die 2700 may have only coarse alignment marks. In one example, the alignment marks in the alignment token die 2700 may be sufficient for 'by eye' (i.e. unmagnified) alignment and the alignment marks present in the precursor photonic devices 2902 may be used for fine alignment (requiring a degree of magnification).

In use, a stamp such as that discussed previously, may be used to lift the III-V transfer die 2802 as well as alignment token die 2700 from the III-V transfer wafer. The stamp is then aligned with alignment token die 2700 on the platform wafer 2900, such that the photonic devices in the III-V transfer die can be printed onto the platform wafer 2900.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

LIST OF FEATURES

101 Fine alignment mark(s) on transfer die
102 Fine alignment mark(s) on precursor device
103 Coarse alignment mark(s) on transfer die
104 Coarse alignment mark(s) on precursor device
200 Precursor photonic device
201 Input ridge or rib waveguide
202 Upper surface of device
203 Cavity
204 Output ridge or rib waveguide
205 Alignment marks
206 Anti-reflective coating
207 Passivation layer
208, 716 Upper cladding layer
209 Lower cladding layer
210 Substrate
301 Device layer
302 Buried oxide layer 303 Substrate
304 Cavity patterning layer
305, 501, 708, Photoresist
908, 1101, 1301
306 Upper surface of device layer
307 Alignment marks in photoresist
601 Region outside of III-V device
602 Transparent region
604 Si alignment marks
701 III-V semiconductor stack
702 P doped InGaAs layer
703 P doped InP layer
704 AlInGaAs multiple quantum well region
705 N doped InP layer
706 InGaAs sacrificial layer
707 InP substrate
709 Mask
710, 712, 1102, 1103 Alignment area
711 N contact area
713 Alignment marks in photoresist
714 Waveguide
715, 1115 Alignment marks
717, 718 Via for electrode connection
719, 720 Electrodes
721, 906, 1112 Lifting photoresist
722 Tether
902, 1104 Chip boundary area
904 Alignment marks
1105 Isolation area
1106 Silicon nitride layer
1107 BCB (Benzocyclobutene) fill
1108 Via for electrode connection
1109, 1110 Traces for electrodes
1111 Hard mask
1113 P contact area
1302 Alignment marks
1303 Alignment mark trench
1701 Facet filling
2301 Fine alignment mark
2302 Coarse alignment mark
2700 Alignment token die
2800 III-V transfer wafer
2802 Device die
2900 Platform wafer
2902 Precursor photonic device

The invention claimed is:

1. A method of transfer printing, comprising:
providing a precursor photonic device, comprising a substrate having a cavity and a bonding region, wherein the precursor photonic device includes one or more alignment marks located in or adjacent to the bonding region in a bed of the cavity;
providing a transfer die, said transfer die including one or more alignment marks in an optically transparent region of the transfer die;
aligning the one or more alignment marks of the precursor photonic device with the one or more alignment marks of the transfer die; and
bonding at least a part of the transfer die to the bonding region.

2. The method of claim 1, further comprising a step of filling a facet between the precursor photonic device and the transfer die.

3. The method of claim 2, wherein a filling material used to fill the facet is either of silicon nitride or amorphous silicon.

4. The method of claim 1, further comprising one or more steps of:
plasma treating the precursor photonic device and/or the transfer die;
dipping the precursor photonic device in water;
drying the precursor photonic device; and
annealing the transfer die and precursor photonic device.

5. The method of claim 4, wherein the annealing is performed at a temperature of at least 250° C. and no more than 350° C. for a time of at least 20 minutes and no more than 40 minutes.

6. The method of claim 5, wherein the annealing is performed in an inert gas atmosphere including nitrogen or argon.

7. An optoelectronic device, comprising:
a silicon-on-insulator wafer, having a cavity and one or more alignment marks in a bed of the cavity; and
a III-V semiconductor based photonic device, located within and bonded to the cavity,
wherein the III-V semiconductor based photonic device includes one or more corresponding alignment marks in an optically transparent region of the III-V semiconductor based photonic device, which overlap with the one or more alignment mark(s) in the bed of the cavity.

8. The optoelectronic device of claim 7, wherein the one or more corresponding alignment marks of the III-V semiconductor based photonic device are voids in the III-V semiconductor based photonic device that extend entirely through the III-V semiconductor based photonic device.

9. The optoelectronic device of claim 7, further comprising an input and/or output waveguide, the waveguide(s) being provided in the silicon-on-insulator wafer and optically coupled to the III-V semiconductor based photonic device.

10. A precursor photonic device, comprising:
a substrate having a cavity;
a bonding region, for receiving and bonding to a transfer die; and
one or more optical alignment marks, for use in transfer printing, said optical alignment marks being located in or adjacent to the bonding region in a bed of the cavity.

11. The precursor photonic device of claim 10, wherein the one or more optical alignment marks are provided as one or more etched regions and/or as one or more patterned metal surfaces.

12. A method of preparing the precursor photonic device of claim 10, comprising the steps of:
providing a wafer, comprising a substrate and a device layer; and
etching one or more optical alignment marks into the wafer.

13. The method of claim 12, the method further comprising:
etching a cavity into the wafer; and
a step of etching at least one of an input waveguide and an output waveguide, said input waveguide and/or output waveguide having a surface adjacent to the cavity.

14. The method of claim 13, wherein the step of etching the one or more optical alignment marks is performed at the same time as etching the input waveguide and/or output waveguide.

15. The method of claim 12, further comprising:
etching a cavity into the wafer; and
a step of depositing an antireflective coating, along either or both of: one or more sidewalls; and/or a bed of the cavity.

16. The method of claim 15, wherein the antireflective coating is formed of silicon nitride.

17. The method of claim 15, further comprising a step of removing at least the antireflective coating present adjacent to the optical alignment marks.

18. The precursor photonic device of claim 10, wherein an alignment mark of the one or more optical alignment marks extends further into the substrate than the bed of the cavity.

19. The precursor photonic device of claim 10, wherein an alignment mark of the one or more optical alignment marks projects in at least two non-parallel directions.

20. The precursor photonic device of claim 10, wherein an alignment mark of the one or more optical alignment marks includes a coarse alignment mark and a fine alignment mark.

* * * * *